United States Patent
Guo et al.

(10) Patent No.: US 9,653,457 B2
(45) Date of Patent: May 16, 2017

(54) STACKED DEVICE AND ASSOCIATED LAYOUT STRUCTURE

(71) Applicant: Taiwan Semiconductor Manufacturing Company, Ltd., Hsin-Chu (TW)

(72) Inventors: Ta-Pen Guo, Taipei (TW); Carlos H. Diaz, Mountain View, CA (US); Chih-Hao Wang, Baoshan Township (TW); Jean-Pierre Colinge, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 76 days.

(21) Appl. No.: 14/827,093

(22) Filed: Aug. 14, 2015

(65) Prior Publication Data
US 2016/0211259 A1   Jul. 21, 2016

Related U.S. Application Data

(60) Provisional application No. 62/104,373, filed on Jan. 16, 2015.

(51) Int. Cl.
*H01L 29/78* (2006.01)
*H01L 27/06* (2006.01)
(Continued)

(52) U.S. Cl.
CPC .. *H01L 27/0688* (2013.01); *H01L 21/823885* (2013.01); *H01L 27/092* (2013.01);
(Continued)

(58) Field of Classification Search
CPC ............. H01L 27/0688; H01L 29/7827; H01L 29/4238; H01L 27/092; H01L 29/1037
(Continued)

(56) References Cited

U.S. PATENT DOCUMENTS 7,781,827 B2   8/2010   Rao
8,394,683 B2   3/2013   Ramaswamy et al.
(Continued)

FOREIGN PATENT DOCUMENTS

TW   200837950 A   9/2006
TW   200939405 A   9/2009

*Primary Examiner* — Asok K Sarkar
*Assistant Examiner* — Dmitriy Yemelyanov
(74) *Attorney, Agent, or Firm* — Slater Matsil, LLP

(57) ABSTRACT

Stacked devices and circuits formed by stacked devices are described. In accordance with some embodiments, a semiconductor post extends vertically from a substrate. A first source/drain region is in the semiconductor post. A first gate electrode layer laterally surrounds the semiconductor post and is vertically above the first source/drain region. A first gate dielectric layer is interposed between the first gate electrode layer and the semiconductor post. A second source/drain region is in the semiconductor post and is vertically above the first gate electrode layer. The second source/drain region is connected to a power supply node. A second gate electrode layer laterally surrounds the semiconductor post and is vertically above the second source/drain region. A second gate dielectric layer is interposed between the second gate electrode layer and the semiconductor post. A third source/drain region is in the semiconductor post and is vertically above the second gate electrode layer.

20 Claims, 52 Drawing Sheets

(51) Int. Cl.
    *H01L 29/423*     (2006.01)
    *H01L 27/092*     (2006.01)
    *H01L 29/10*     (2006.01)
    *H01L 29/08*     (2006.01)
    *H01L 21/8238*     (2006.01)
    *H01L 21/822*     (2006.01)

(52) U.S. Cl.
    CPC ...... *H01L 29/0847* (2013.01); *H01L 29/1037* (2013.01); *H01L 29/4238* (2013.01); *H01L 29/7827* (2013.01); *H01L 21/8221* (2013.01)

(58) Field of Classification Search
    USPC ......................................................... 257/329
    See application file for complete search history.

(56) References Cited

U.S. PATENT DOCUMENTS

2014/0008606 A1*   1/2014   Hussain .............. H01L 29/0676
                                                                   257/9
2015/0236092 A1*   8/2015   Yu ....................... H01L 29/0676
                                                                     257/29

* cited by examiner

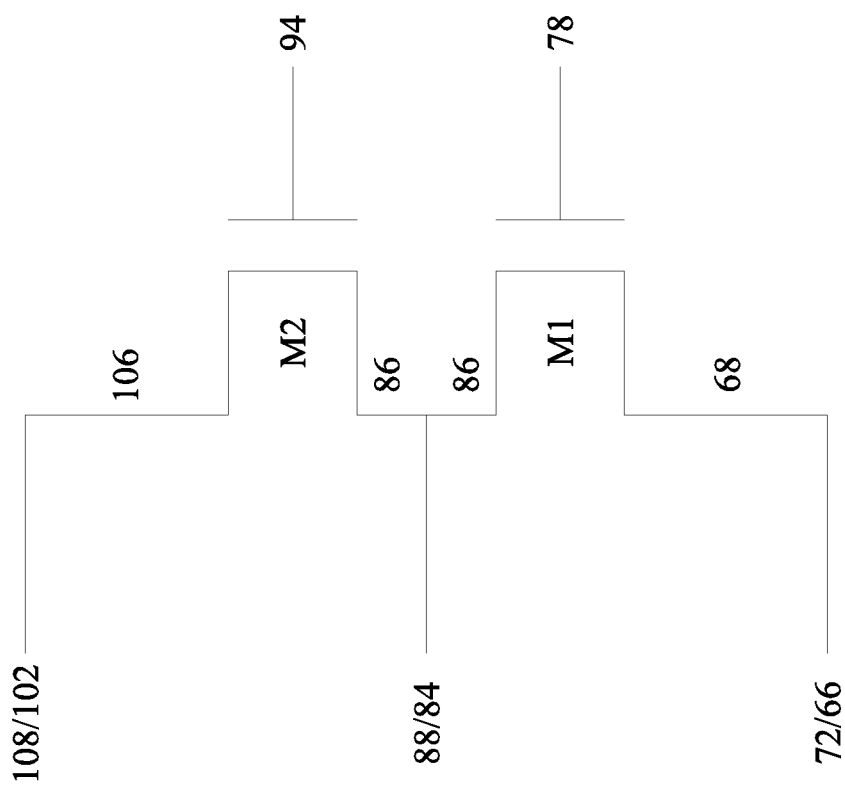

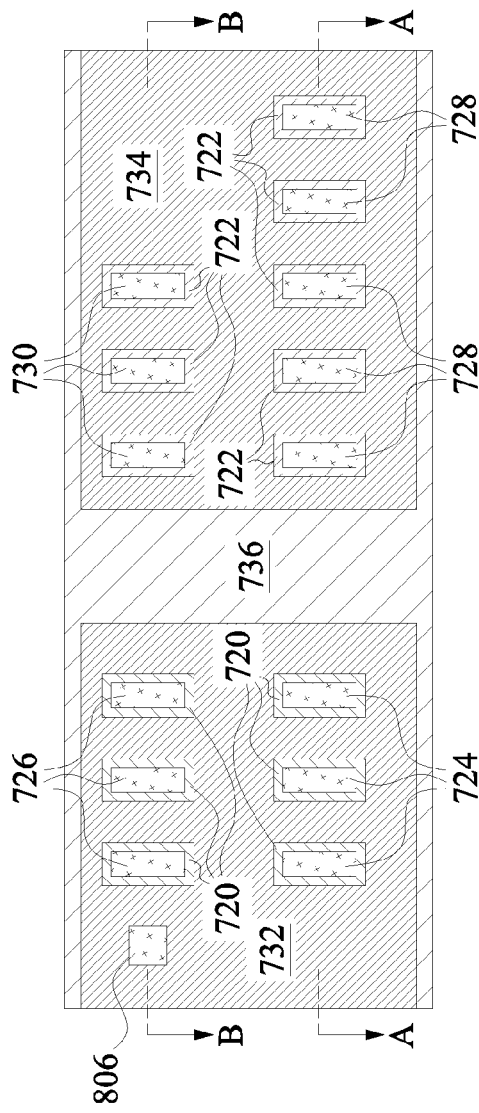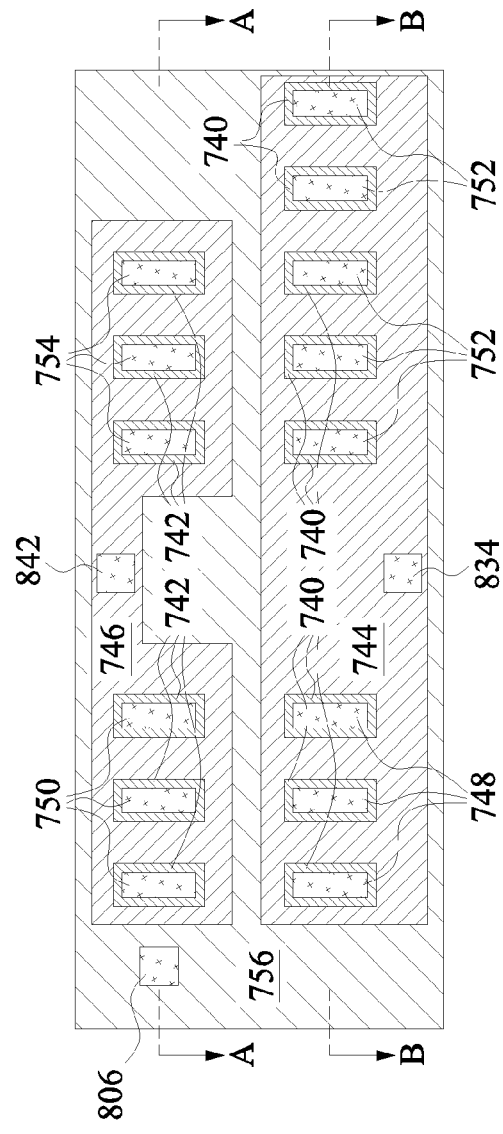
Fig. 44A
Fig. 44B

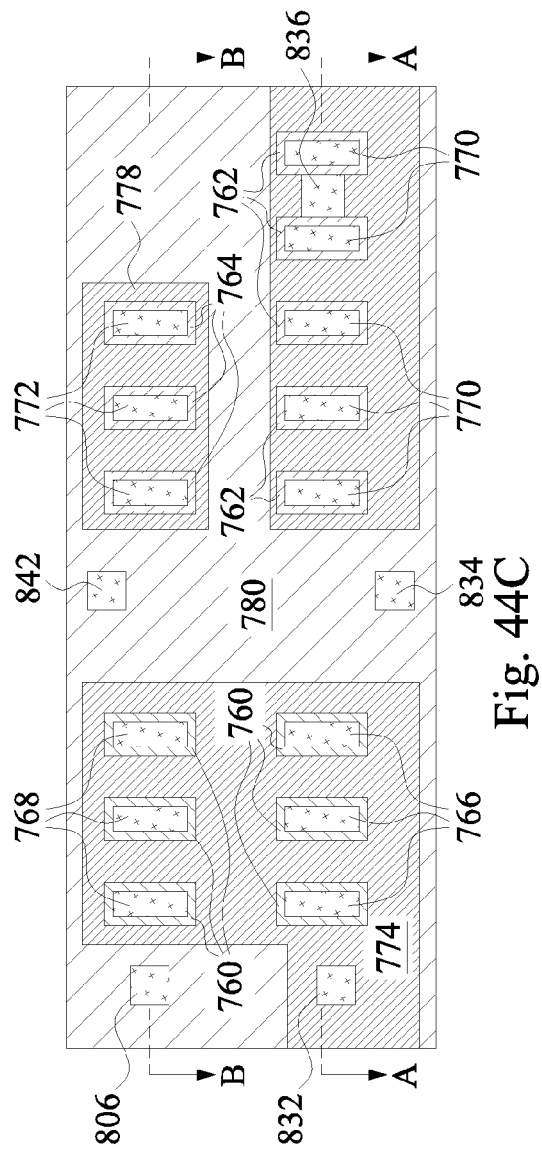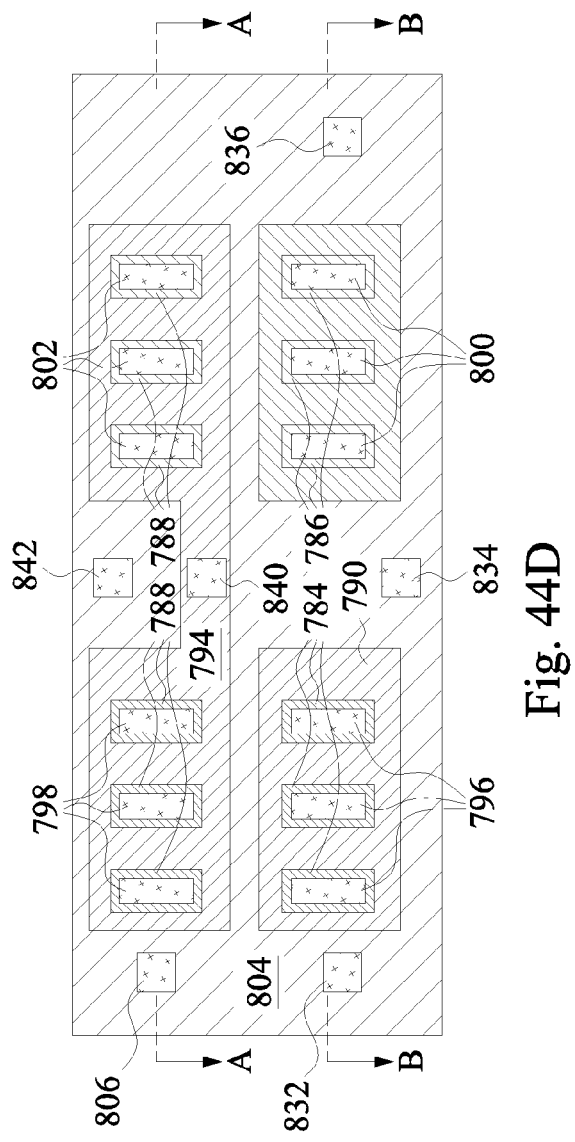
Fig. 44C
Fig. 44D

US 9,653,457 B2

STACKED DEVICE AND ASSOCIATED LAYOUT STRUCTURE

PRIORITY CLAIM AND CROSS-REFERENCE

This application claims priority to and the benefit of U.S. Provisional Application Ser. No. 62/104,373, filed on Jan. 16, 2015, entitled "Stacked Device and Associated Layout Structure," which application is hereby incorporated herein by reference in its entirety.

BACKGROUND

The goal of putting more and more devices into integrated circuits has been important in semiconductor manufacturing from the very invention of the integrated circuit. Higher density traditional circuits allow for the manufacture of ever more powerful devices while greatly reducing costs on a per transistor basis. The traditional configuration of circuit elements is to form them laterally on the surface of a semiconductor substrate. This provides ease of manufacturing and reduced complexity. However, currently, semiconductor design engineers are struggling with many limitations of lateral devices.

One great challenge is the limits of lithography. The layers of integrated circuits are typically fabricated by patterning various components using photolithography. In photolithography, a layer of photo-sensitive material called photoresist is coated onto the device. Then, the photoresist is exposed to a light pattern corresponding to the desired patterns in a particular layer. However, components in integrated circuits have become so small that their size is on the order of the wavelength of light used to expose the photoresist. While various techniques have been employed to push this limitation beyond all reasonable expectation, at some point, this physical limitation will become insurmountable. Engineers continue to devise structures to overcome this and other physical limitations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 12 is a circuit diagram of the circuit formed by the structure of FIG. 10 in accordance with some embodiments.

FIGS. 44A through 44E are overlaid layouts of various levels of the structure illustrated in FIGS. 43A and 43B in accordance with some embodiments.

DETAILED DESCRIPTION

Figure 1:
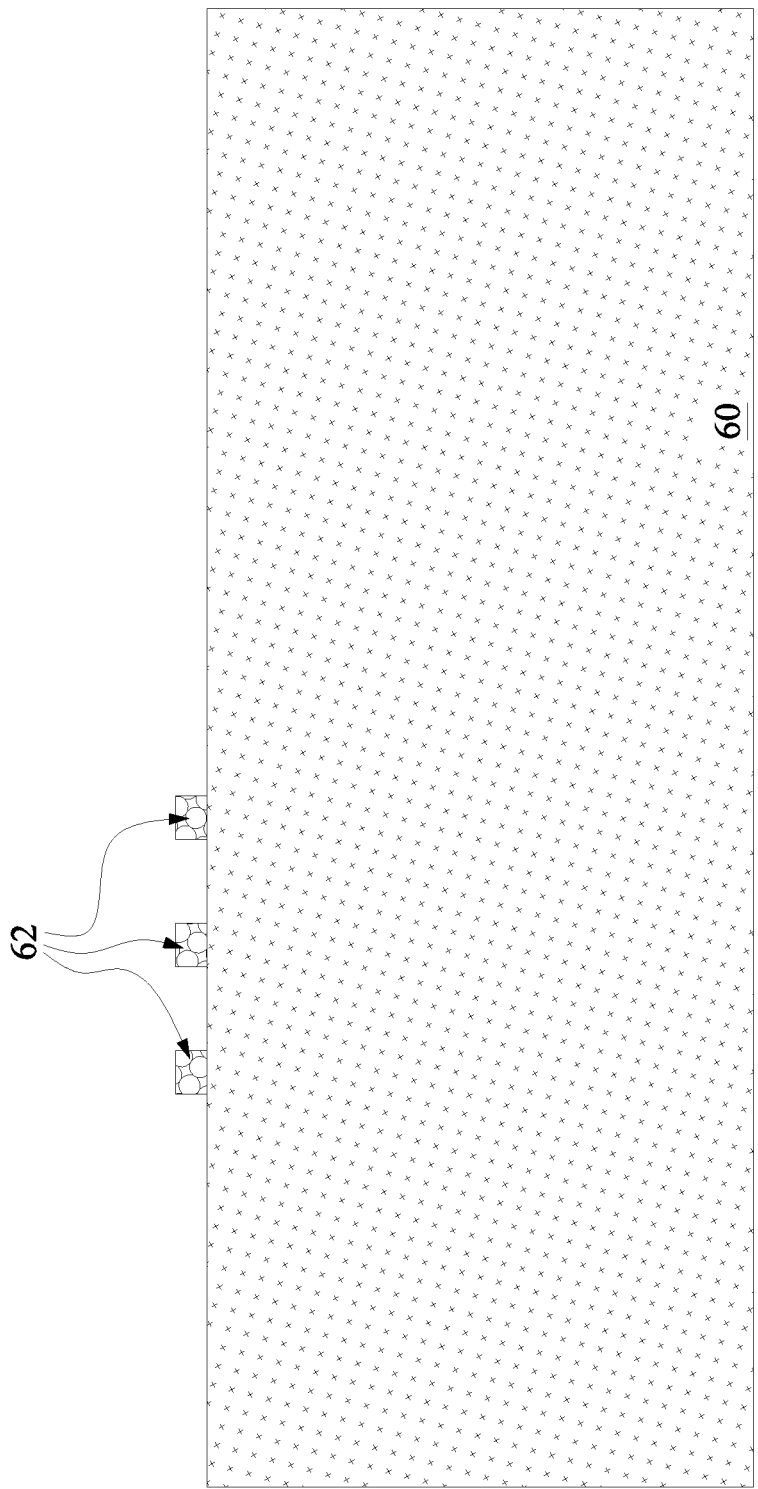
FIGS. 1 through 10 are cross sectional views of intermediate steps during a process for forming stacked vertical gate-all-around (VGAA) device structures in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Like reference numbers are used to designate like elements.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure will be described with respect to embodiments in a specific context, namely structures using, for example, stacked vertical gate-all-around (VGAA) transistors. Some variations of the embodiments are discussed.

Concepts disclosed herein are not limited to the formation of specific structures. Indeed, other structures may also be formed using the concepts disclosed herein. Further, method embodiments discussed herein may be discussed as being performed in a particular order; however, other method embodiments may be performed in any logical order.

Figure 8:
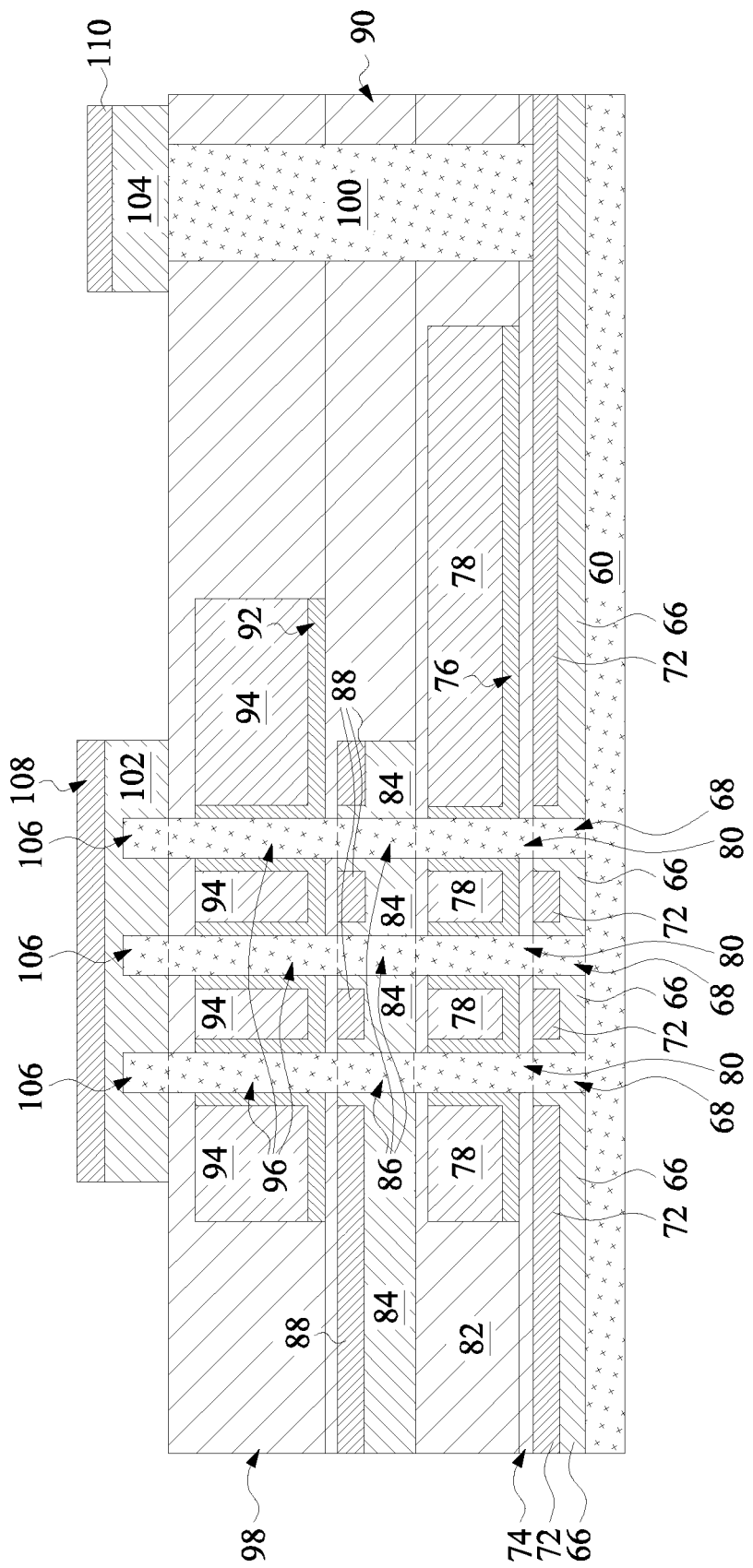
Figure 9:
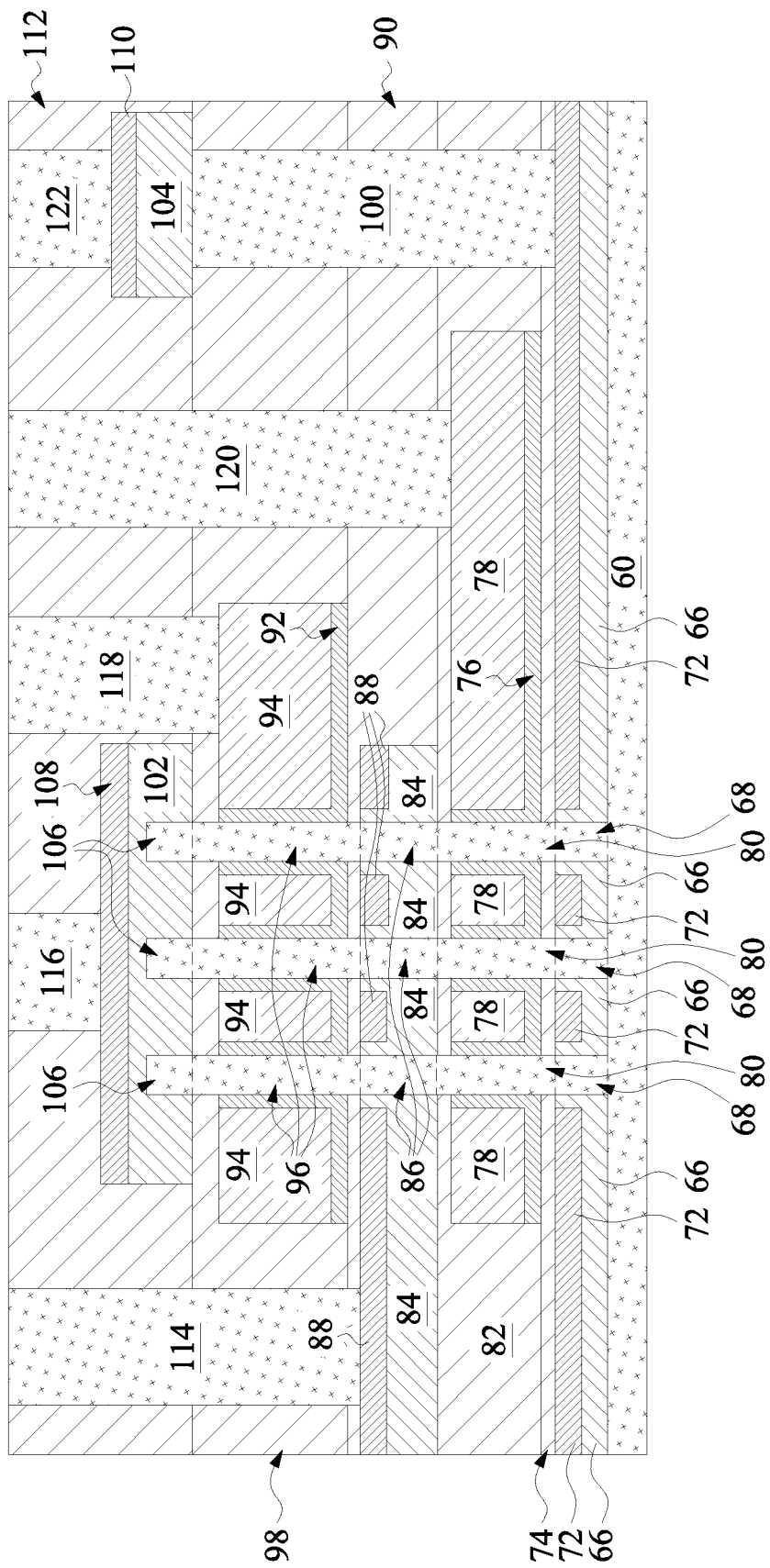
Figure 10:
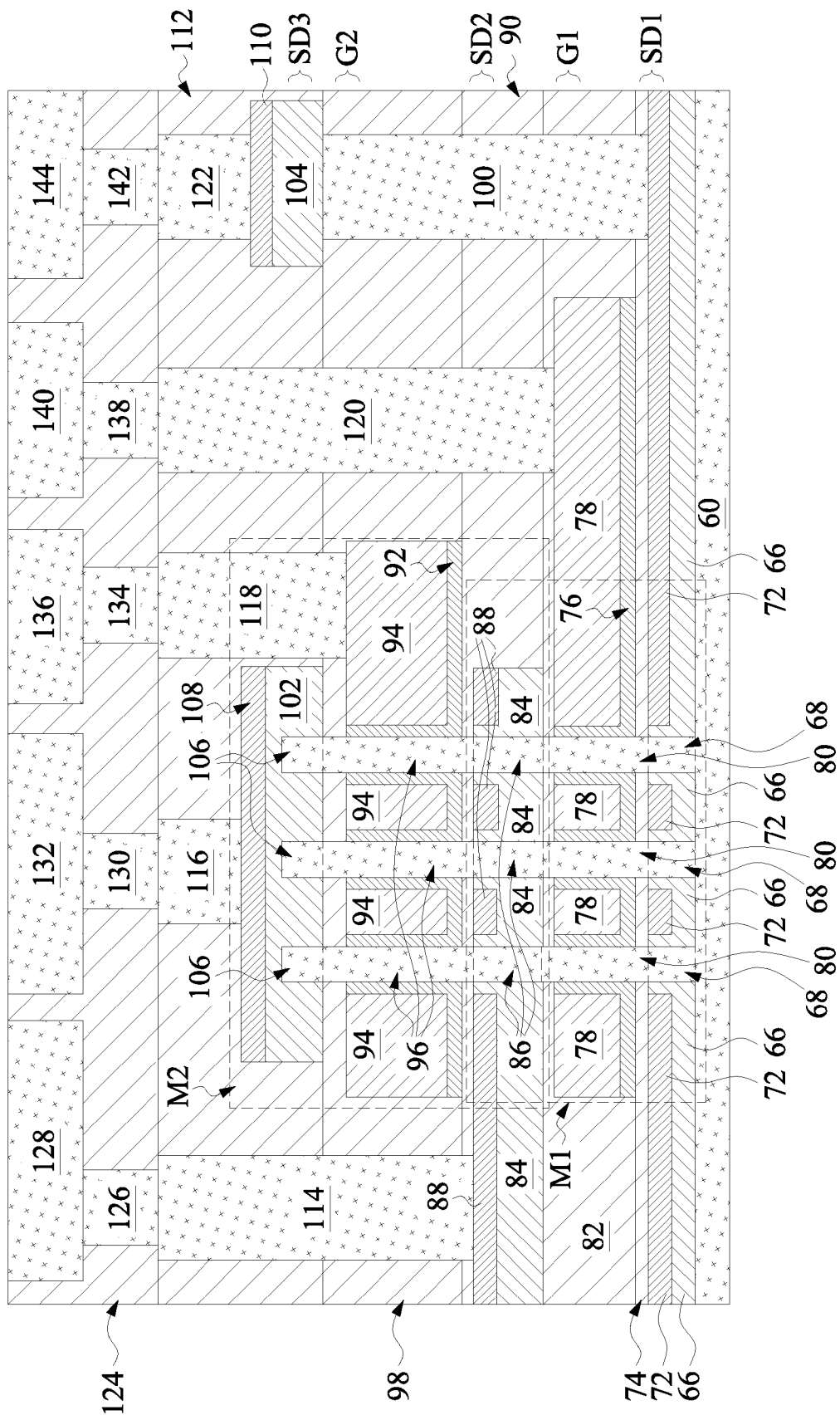
Figure 11A:
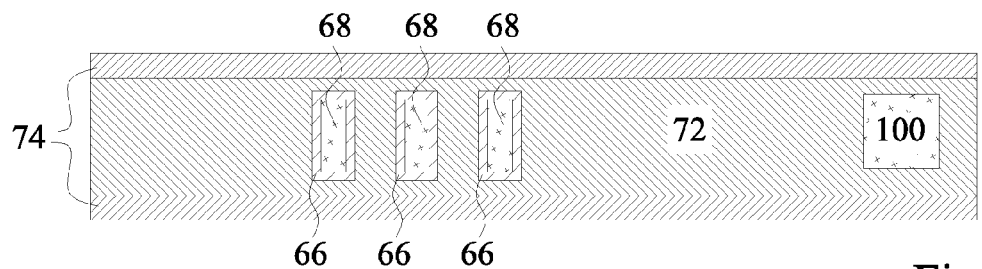
FIGS. 11A through 11E are overlaid layouts of various levels of the structure illustrated in FIG. 10 in accordance with some embodiments.
Figure 11B:
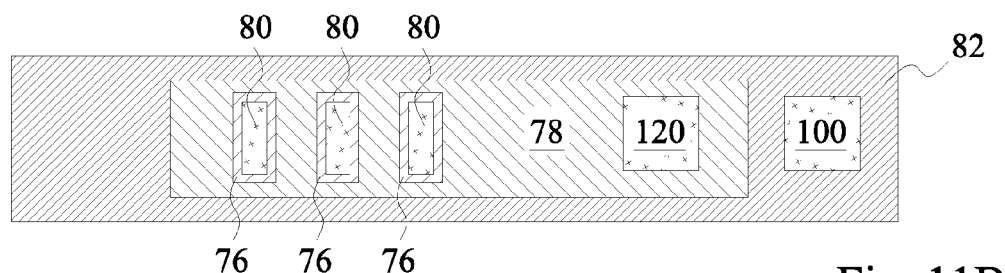
Figure 11C:
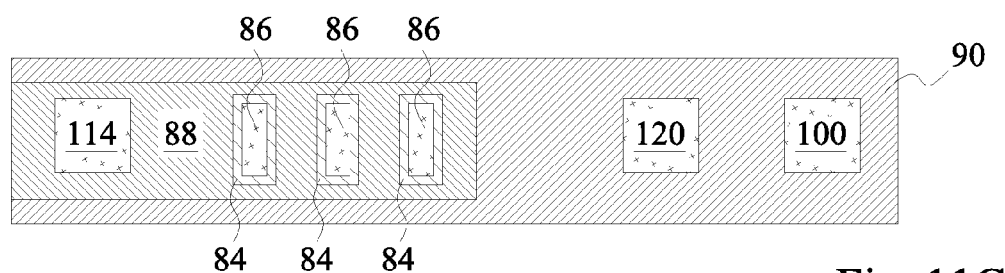
Figure 11D:
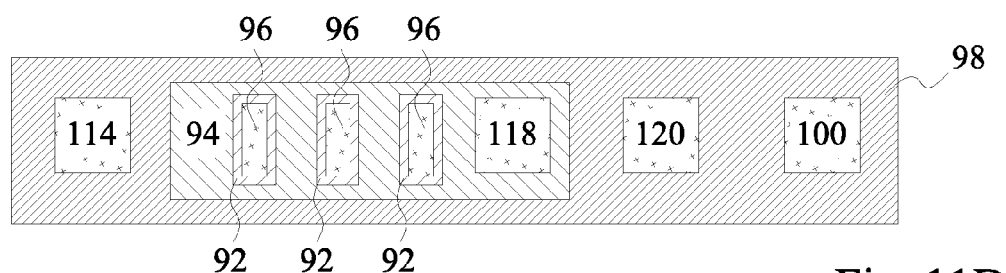
Figure 11E:
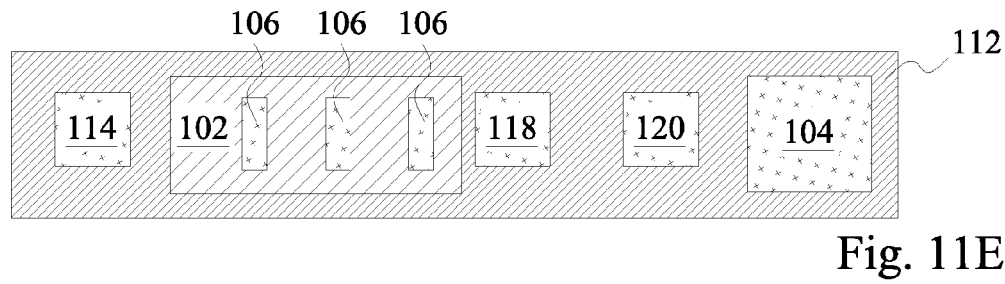

FIGS. 1 through 10 illustrate cross sectional views of intermediate steps during a process for forming stacked VGAA device structures in accordance with some embodiments. FIGS. 11A through 11E are overlaid layouts of various levels of the structure illustrated in FIG. 10, and FIG. 12 is a circuit diagram of the circuit formed by the structure of FIG. 10. The discussion of these figures outlines general concepts for forming a stacked device structure and a circuit formed thereby.

FIG. 1 illustrates a substrate 60 with mask caps 62 thereover. The substrate 60 can be a bulk semiconductor substrate, a semiconductor-on-insulator (SOI) substrate, a multi-layered or gradient substrate, or the like. The semiconductor of the substrate 60 may include any semiconductor material, such as elemental semiconductor like silicon, germanium, or the like; a compound or alloy semiconductor including SiC, SiP, SiPC, GaAs, GaP, InP, InAs, indium antimonide, SiGe, GaAsP, AlInAs, AlGaAs, GaInAs, GaInP, and/or GaInAsP; the like; or a combination thereof. The substrate 60 may further be a wafer, for example, which may further be a bulk silicon wafer.

Figure 2:
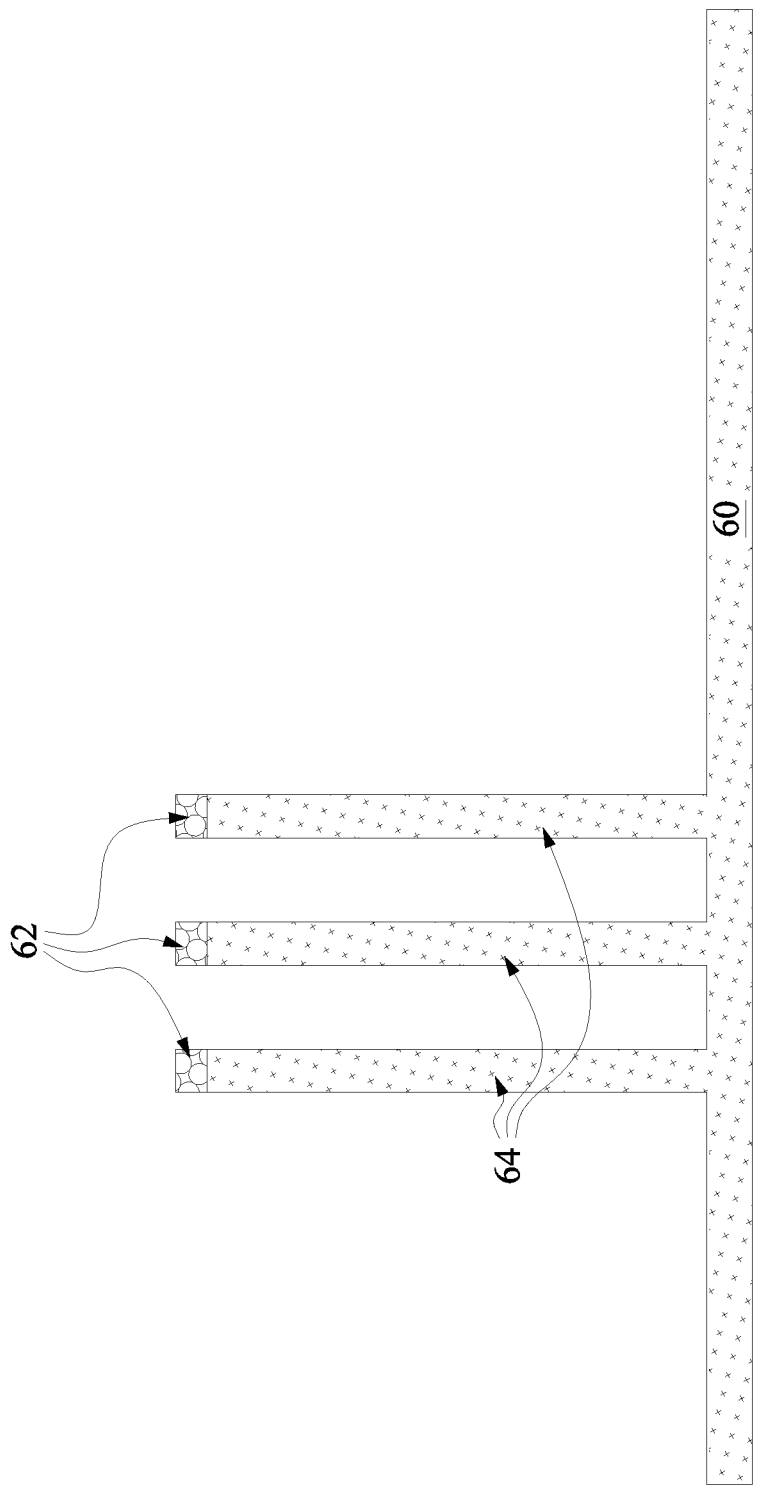

Although not specifically illustrated, the substrate 60 can include a doped well where semiconductor posts 64 in FIG. 2 are to be formed, as will be discussed subsequently. A p-type well can be formed for an n-type device, such as an n-type VGAA Field Effect Transistor (FET). An n-type well can be formed for a p-type device, such as a p-type VGAA FET. The doped wells may be formed by an implantation process. Example p-type dopants include boron (B), $BF_2$, the like, or a combination thereof. Example n-type dopants include arsenic (As), phosphorus (P), the like, or a combination thereof. A concentration of the dopant in a p or n doped well can be in a range from about $1 \times 10^{14}$ $cm^{-3}$ to about $5 \times 10^{18}$ $cm^{-3}$.

A mask layer, such as a hardmask, is deposited on the substrate 60. The mask layer may be formed of, for example, silicon nitride, silicon carbide, silicon oxynitride, silicon carbon nitride, or the like, and may be formed using Chemical Vapor Deposition (CVD), Plasma-Enhanced CVD (PECVD), Atomic Layer Deposition (ALD), or the like. The mask layer is patterned with openings corresponding to semiconductor posts that are to be formed, and a mask cap 62 is formed in each opening in the mask layer. The mask layer may be patterned using an acceptable photolithography and etching process, such as Reactive Ion Etching (RIE) or the like. The mask caps 62 can be formed by depositing a material with a different etch selectivity than the mask layer in the openings and on the mask layer. The material of the mask caps 62 may be, for example, silicon nitride, silicon carbide, silicon oxynitride, silicon carbon nitride, or the like, and may be formed using CVD, PECVD, ALD, or the like. The material of the mask caps 62 may then be planarized, such as by a Chemical Mechanical Polishing (CMP), to form the mask caps 62 with top surfaces co-planar with the top surface of the mask layer. Then, the mask layer is removed, such as by an appropriate etch selective to the mask layer.

In FIG. 2, semiconductor posts 64 are formed from the substrate 60. Using the mask caps 62 as a mask, the substrate 60 is recessed, such as by using an appropriate anisotropic etch such as RIE or the like, to form the semiconductor posts 64. The semiconductor posts 64 can be nano-tubes, nano-wires, or any similar structure and can have cross sections in a plane parallel to a top surface of the substrate 60 that are circles, squares, rectangles, ovals, ellipses, or the like, such as discussed below with respect to FIG. 46. In the illustrated embodiment, three semiconductor posts 64 are depicted for each device that is formed in the process discussed herein, and in other embodiments, each transistor or device can comprise more or fewer semiconductor posts, which can have any appropriate shape or combination of shapes. In other embodiments, the semiconductor posts 64 can include epitaxially growing the semiconductor posts 64. The epitaxial growth can use Si, Ge, SiGe, SiC, SiP, SiPC, a III-V material, the like, or a combination thereof. Example III-V materials include InP, InAs, GaAs, AlInAs, InGaP, InGaAs, GaAsSb, GaPN, and AlPN.

Figure 3:
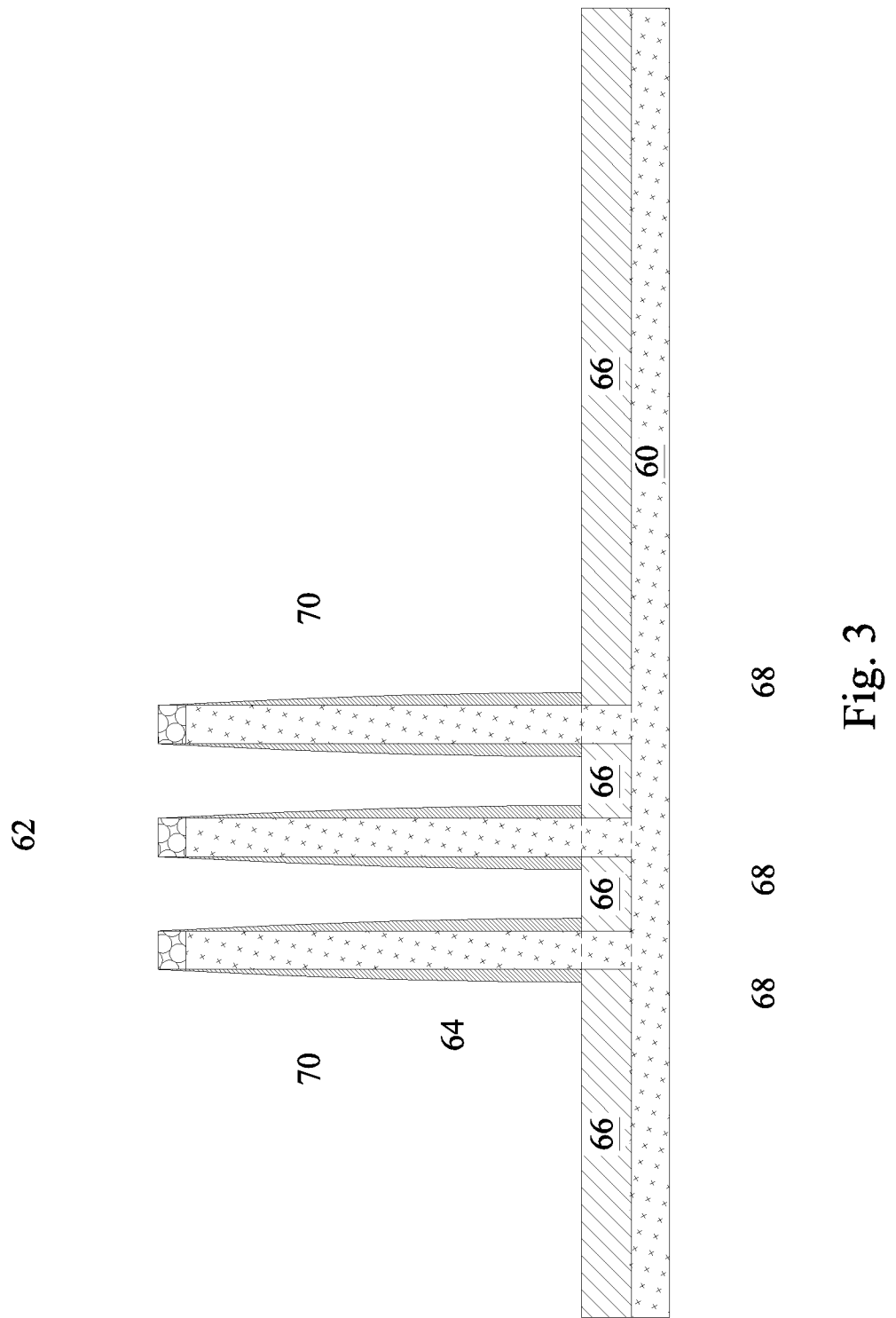

In FIG. 3, a first level pad semiconductor material 66 is epitaxially grown on the substrate 60. The first level pad semiconductor material 66 can be a crystalline material that is epitaxially grown. The first level pad semiconductor material 66 can be elemental semiconductor like silicon, germanium, or the like; a compound or alloy semiconductor including SiC, SiP, SiPC, GaAs, GaP, InP, InAs, InSb, SiGe, GaAsP, AlInAs, AlGaAs, GaInAs, GaInP, and/or GaInAsP; the like; or a combination thereof. The epitaxial growth can be by Metal-Organic Chemical Vapor Deposition (MOCVD), Molecular Beam Epitaxy (MBE), Liquid Phase Epitaxy (LPE), Vapor Phase Epitaxy (VPE), Ultra-High-Vacuum Chemical Vapor Deposition (UHVCVD), the like, or a combination thereof. The epitaxial growth can be anisotropic such that the growth is substantially only in a vertical direction and does not substantially nucleate on crystalline sidewalls, such as sidewalls of the semiconductor posts 64. In other embodiments, the first level pad semiconductor material 66 can be deposited as an amorphous or polycrystalline material, such as by CVD, Low Pressure CVD (LPCVD), MOCVD, ALD, evaporation, or the like, and etched back, such as by RIE or the like.

In some embodiments, the first level pad semiconductor material 66 is in situ doped during the growth and/or deposition of the first level pad semiconductor material 66. In other embodiments, the first level pad semiconductor material 66 can be doped by an implantation process after the growth and/or deposition. The dopant concentration of the first level pad semiconductor material 66 can be in a range from about $1 \times 10^{20}$ $cm^{-3}$ to about $1 \times 10^{21}$ $cm^{-3}$. The dopant can be a p-type dopant, such as boron (B), $BF_2$, or the like, for a p-type device, such as a p-type FET. The dopant can be an n-type dopant, such as arsenic (As), phosphorus (P), or the like, for an n-type device, such as an n-type FET.

The structure can then be annealed to diffuse dopants into first level source/drain regions 68 of the semiconductor posts 64 from the first level pad semiconductor material 66. The anneal can be at a temperature in a range from about 800° C. to about 1100° C. and for a duration in a range from about 3600 seconds to about 1 millisecond, respectively. The dopant concentration of the first level source/drain regions 68 after the anneal can be in a range from about $5 \times 10^{19}$ $cm^{-3}$ to about $5 \times 10^{20}$ $cm^{-3}$. Further, if the first level pad semiconductor material 66 is deposited as an amorphous material, the anneal can crystallize the first level pad semiconductor material 66 using the substrate 60 as a template for the crystalline orientation.

In FIG. 3, spacers 70 are formed around sidewalls of the semiconductor posts 64 and over the first level pad semiconductor material 66. In some embodiments, a spacer layer is conformally deposited over the substrate 60 and along the sidewalls of the semiconductor posts 64 such that the thickness of the spacer layer is substantially a same thickness throughout the layer. In some embodiments, the spacer layer is SiN, SiON, SiC, SiCN, SiOCN, the like, or a combination thereof. The spacer layer may be deposited using an appropriate deposition process, such as ALD, CVD, Physical Vapor Deposition (PVD), the like, or a combination thereof. The spacer layer is then anisotropically etched, such as by using a plasma etching like an RIE or the like, to remove substantially horizontal portions of the conformal spacer layer. The remaining vertical portions of the conformal spacer layer form the spacers 70 around and along the sidewalls of the semiconductor posts 64.

Figure 4:
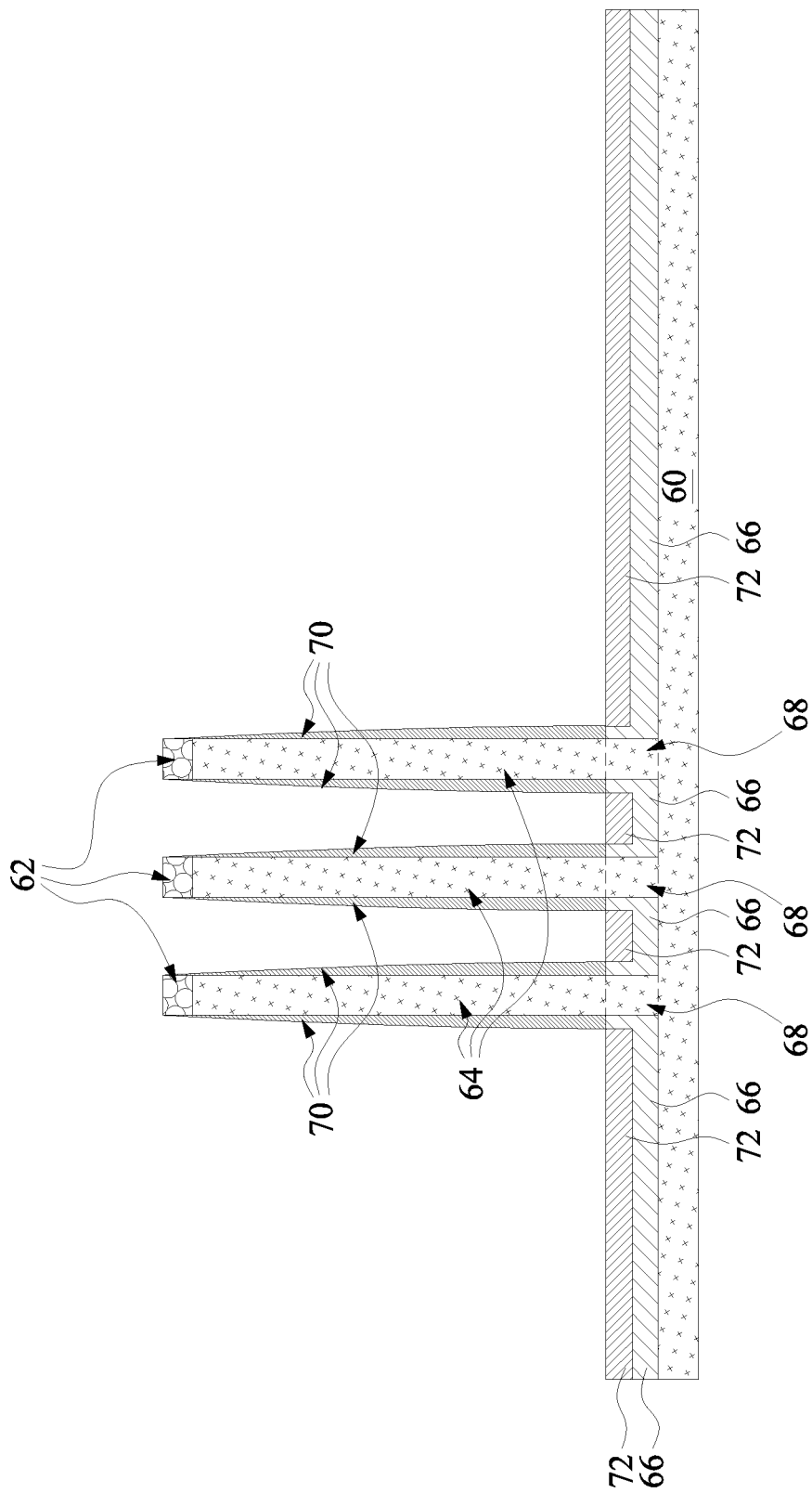

In FIG. 4, a first level metal-semiconductor compound region 72 is formed in and/or on the first level pad semiconductor material 66. The first level metal-semiconductor compound region 72 can be formed by depositing a metal on the first level pad semiconductor material 66 and/or the substrate 60 and reacting the metal with the first level pad semiconductor material 66 and/or the substrate 60. In some embodiments, the metal can include cobalt, titanium, nickel, tungsten, the like, or a combination thereof, and can be deposited by PVD, ALD, CVD, the like, or a combination thereof. The metal can be caused to react with the semiconductor by using an anneal. Any unreacted metal that remains after the anneal can be removed using an etch selective to the unreacted metal. The first level metal-semiconductor compound region 72 can include a silicide, such as CoSi, TiSi, NiSi, WSi, or the like; a germanicide; the like; or a combination thereof. The spacers 70 and mask caps 62 prevent the metal from reacting with the semiconductor posts 64 during the anneal. The first level metal-semiconductor compound region 72 is formed on and/or in the exposed portions of the first level pad semiconductor material 66. As illustrated, the first level metal-semiconductor compound region 72 is formed in, and consumes, less than an entirety of the exposed portions of the first level pad semiconductor material 66 that are not under or protected by the spacers 70. In other embodiments, the first level metal-semiconductor compound region 72 can be formed to a greater or lesser extent in the first level pad semiconductor material 66 and/or substrate 60. The spacers 70 are then removed, such as by an etch selective to a material of the spacers 70.

Figure 5:
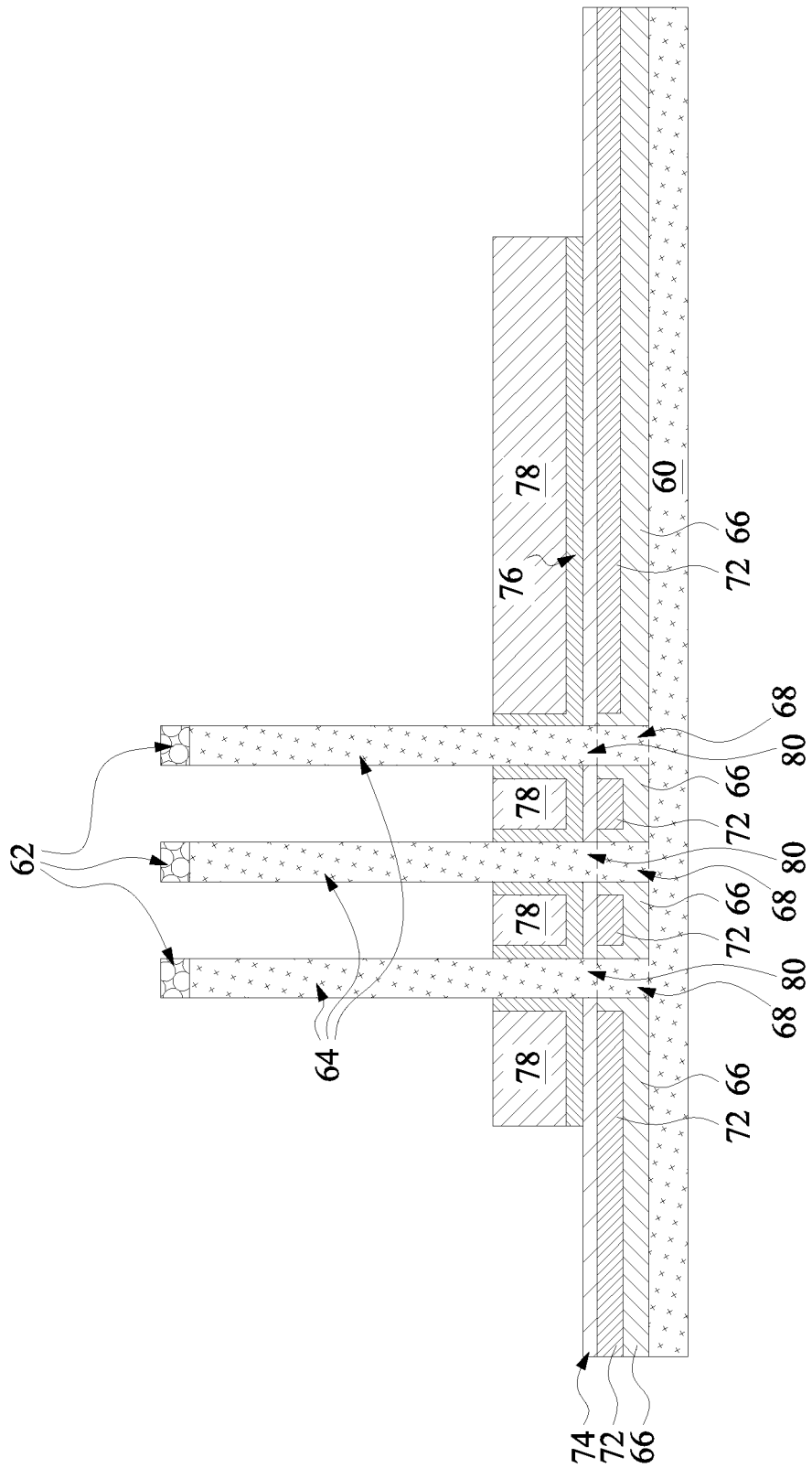

In FIG. 5, a first dielectric layer 74 is formed over the first level metal-semiconductor compound region 72 and around the semiconductor posts 64. The first dielectric layer 74 can comprise silicon nitride, SiCN, or the like deposited by CVD, PECVD, ALD, or the like. In some embodiments, the first dielectric layer 74 is deposited with a thickness that extends above top surfaces of the mask caps 62. A planarization process, such as a CMP, is then performed to form top surfaces of the mask caps 62 to be co-planar with a top surface of the first dielectric layer 74. Subsequently, a controlled etch back, such as an anisotropic etch, etches the first dielectric layer 74 to an appropriate thickness. The first dielectric layer 74 may serve various purposes, such as an etch stop layer for forming contacts to the first level metal-semiconductor compound region 72 and/or as a gate spacer.

A first level gate dielectric layer 76 and first level gate electrode layer 78 are formed over the first dielectric layer 74 and around the semiconductor posts 64. First level gate dielectric layer 76 is deposited conformally on the semiconductor posts 64, such as over the top surfaces of the mask caps 62 and along the sidewalls of the semiconductor posts 64, and over the first dielectric layer 74. In accordance with some embodiments, first level gate dielectric layer 76 comprises silicon oxide, silicon nitride, or multilayers thereof. In other embodiments, first level gate dielectric layer 76 comprises a high-k dielectric material, and in these embodiments, first level gate dielectric layer 76 may have a k value greater than about 7.0, or further, greater than about 10.0. A high-k dielectric material may include SiON, $Si_3N_4$, $Ta_2O_5$, $Al_2O_3$, a Hf oxide, a Ta oxide, an Al oxide, the like, and a combination thereof. The formation methods of first level gate dielectric layer 76 may include Molecular Beam Deposition (MBD), ALD, CVD, the like, or a combination thereof. Next, first level gate electrode layer 78 is deposited over first level gate dielectric layer 76. The first level gate electrode layer 78 may comprise a metal-containing material such as TiN, TaN, TiAl, TaAl, a Ti-containing material, a Ta-containing material, an Al-containing material, a W-containing material, TiSi, NiSi, PtSi, polysilicon with a silicide, a Cu-containing material, a refractory material, the like, a combination thereof, or multi-layers thereof. In some embodiments, the first level gate electrode layer 78 is deposited with a thickness that extends above top surfaces of the mask caps 62. A planarization process, such as a CMP, is then performed to form top surfaces of the first level gate electrode layer 78 to be co-planar with top surfaces of the mask caps 62. Subsequently, a controlled etch back, such as an anisotropic etch, etches the first level gate electrode layer 78 to an appropriate thickness. The first level gate electrode layer 78 and the first level gate dielectric layer 76 are then patterned, such as by using an acceptable photolithography and etching process, such as RIE or the like. The resulting first level gate electrode layer 78 and the first level gate dielectric layer 76 define first level channel regions 80 in the semiconductor posts 64.

Figure 6:
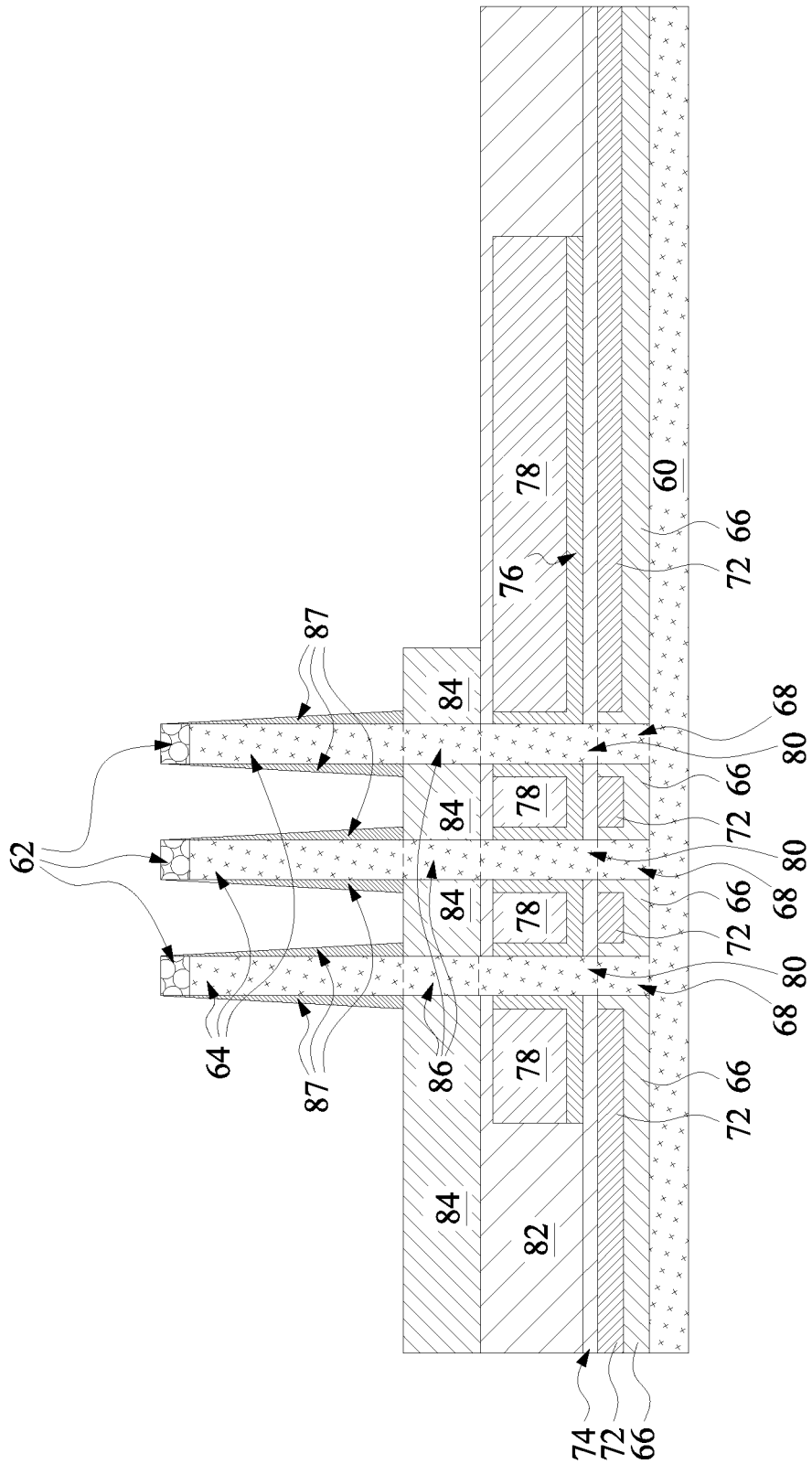

In FIG. 6, a second dielectric layer 82 is formed over the first dielectric layer 74 and the first level gate electrode layer 78 and around the semiconductor posts 64. The second dielectric layer 82 can include a first sub-layer and a second sub-layer over the first sub-layer, for example. The first sub-layer of the second dielectric layer 82 may comprise silicon oxide, tetraethyl orthosilicate (TEOS), phosphosilicate glass (PSG), borosilicate glass (BSG), fluorinated silicate glass (FSG), $SiO_xC_y$, Spin-On-Glass, Spin-On-Polymers, silicon carbon material, a compound thereof, a composite thereof, a combination thereof, or the like, formed by any suitable method, such as CVD, PECVD, spinning, the like, or a combination thereof. In some embodiments, the first sub-layer of the second dielectric layer 82 is deposited with a thickness that extends above top surfaces of the mask caps 62. A planarization process, such as a CMP, is then performed to form a top surface of the first sub-layer of the second dielectric layer 82 to be co-planar with top surfaces of the mask caps 62. Subsequently, a controlled etch back, such as an anisotropic etch, etches the first sub-layer of the second dielectric layer 82 to an appropriate thickness, such as a thickness that allows the first sub-layer of the second dielectric layer 82 to be over the first level gate electrode layer 78, or a thickness substantially equal to a thickness of the stack of the first level gate dielectric layer 76 and the first level gate electrode layer 78. The first sub-layer of the second dielectric layer 82 may serve various purposes, such as an Inter-Layer Dielectric (ILD).

The second sub-layer of the second dielectric layer 82 is then formed over the first sub-layer of the second dielectric layer 82 and the first level gate electrode layer 78. The second sub-layer of the second dielectric layer 82 can comprise silicon nitride, SiCN, or the like deposited by CVD, PECVD, ALD, or the like. In some embodiments, the second sub-layer of the second dielectric layer 82 is deposited with a thickness that extends above top surfaces of the mask caps 62. A planarization process, such as a CMP, is then performed to form top surfaces of the mask caps 62 to be co-planar with a top surface of the second sub-layer of the second dielectric layer 82. Subsequently, a controlled etch back, such as an anisotropic etch, etches the second sub-layer of the second dielectric layer 82 to an appropriate thickness. The second sub-layer of the second dielectric layer 82 may serve various purposes, such as an etch stop layer for forming contacts to the first level gate electrode layer 78 and/or as a gate spacer.

A second level pad semiconductor material 84 is deposited and patterned over the second dielectric layer 82 and around the semiconductor posts 64. The second level pad semiconductor material 84 can be an amorphous or polycrystalline material. The second level pad semiconductor material 84 can be elemental semiconductor like silicon, germanium, or the like; a compound or alloy semiconductor including SiC, SiP, SiPC, GaAs, GaP, InP, InAs, InSb, SiGe, GaAsP, AlInAs, AlGaAs, GaInAs, GaInP, and/or GaInAsP; the like; or a combination thereof. The second level pad semiconductor material 84 can be deposited by CVD, deposition of doped amorphous semiconductor followed by Solid-Phase Epitaxial Regrowth (SPER), epitaxial lateral overgrowth (ELO), epitaxy, or the like. In some embodiments, the second level pad semiconductor material 84 is deposited with a thickness that extends above top surfaces of the mask caps 62. A planarization process, such as a CMP, is then performed to form a top surface of the second level pad semiconductor material 84 to be co-planar with top surfaces of the mask caps 62. Subsequently, a controlled etch back, such as an anisotropic etch, etches the second level pad semiconductor material 84 to an appropriate thickness. The second level pad semiconductor material 84 is then patterned, such as by using an acceptable photolithography and etching process, such as RIE or the like.

In some embodiments, the second level pad semiconductor material 84 is in situ doped during the deposition of the second level pad semiconductor material 84. In other embodiments, the second level pad semiconductor material 84 can be doped by an implantation process after the deposition. The dopant concentration of the second level pad semiconductor material 84 can be in a range from about $1 \times 10^{20}$ cm$^{-3}$ to about $2 \times 10^{21}$ cm$^{-3}$. The dopant can be a p-type dopant, such as boron (B), BF$_2$, or the like, for a p-type device, such as a p-type FET. The dopant can be an n-type dopant, such as arsenic (As), phosphorus (P), or the like, for an n-type device, such as an n-type FET.

The structure can then be annealed to diffuse dopants into second level source/drain regions 86 of the semiconductor posts 64 from the second level pad semiconductor material 84. The anneal can be at a temperature in a range from about 800° C. to about 1100° C. and for a duration in a range from about 3600 seconds to about 1 millisecond, respectively. The dopant concentration of the second level source/drain regions 86 after the anneal can be in a range from about $5 \times 10^{19}$ cm$^{-3}$ to about $1 \times 10^{21}$ cm$^{-3}$.

Spacers 87 are then formed around sidewalls of the semiconductor posts 64 and over the second level pad semiconductor material 84. In some embodiments, a spacer layer is conformally deposited over the substrate 60 and along the sidewalls of the semiconductor posts 64 such that the thickness of the spacer layer is substantially a same thickness throughout the layer. In some embodiments, the spacer layer is SiN, SiON, SiC, SiCN, SiOCN, the like, or a combination thereof. The spacer layer may be deposited using an appropriate deposition process, such as ALD, CVD, PVD, the like, or a combination thereof. The spacer layer is then anisotropically etched, such as by using a plasma etching like an RIE or the like, to remove substantially horizontal portions of the conformal spacer layer. The remaining vertical portions of the conformal spacer layer form the spacers 87 around and along the sidewalls of the semiconductor posts 64.

Figure 7:
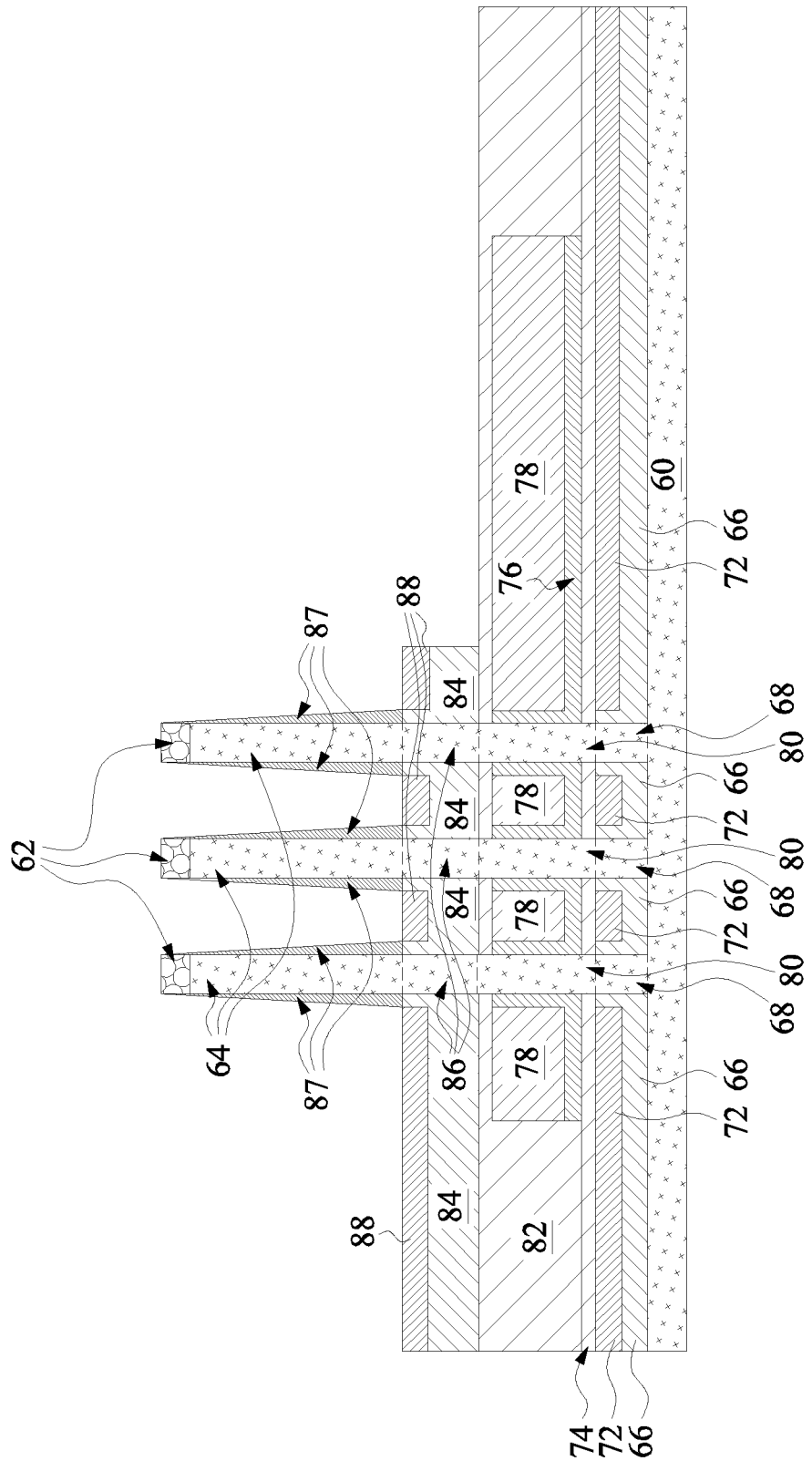

In FIG. 7, a second level metal-semiconductor compound region 88 is formed in and/or on the second level pad semiconductor material 84. The second level metal-semiconductor compound region 88 can be formed by depositing a metal on the second level pad semiconductor material 84 and reacting the metal with the second level pad semiconductor material 84. In some embodiments, the metal can include cobalt, titanium, nickel, tungsten, the like, or a combination thereof, and can be deposited by PVD, ALD, CVD, the like, or a combination thereof. The metal can be caused to react with the semiconductor by using an anneal. Any unreacted metal that remains after the anneal can be removed using an etch selective to the unreacted metal. The second level metal-semiconductor compound region 88 can include a silicide, such as CoSi, TiSi, NiSi, WSi, or the like; a germanicide; the like; or a combination thereof. The spacers 87 and mask caps 62 prevent the metal from reacting with the semiconductor material of the semiconductor posts 64 during the anneal. The second level metal-semiconductor compound region 88 is formed on and/or in the exposed portions of the second level pad semiconductor material 84. As illustrated, the second level metal-semiconductor compound region 88 is formed in, and consumes, less than an entirety of the exposed portions of the second level pad semiconductor material 84 that is not under or protected by the spacers 87. In other embodiments, the second level metal-semiconductor compound region 88 can be formed to a greater or lesser extent in the second level pad semiconductor material 84. The spacers 87 are then removed, such as by an etch selective to a material of the spacers 87.

In FIG. 8, a third dielectric layer 90 is formed over the second dielectric layer 82 and the second level metal-semiconductor compound region 88 and around the semiconductor posts 64. The third dielectric layer 90 can include a first sub-layer and a second sub-layer over the first sub-layer, for example. The first sub-layer of the third dielectric layer 90 may comprise silicon oxide, TEOS, PSG, BSG, FSG, SiO$_x$C$_y$, Spin-On-Glass, Spin-On-Polymers, silicon carbon material, a compound thereof, a composite thereof, a combination thereof, or the like, formed by any suitable method, such as CVD, PECVD, spinning, the like, or a combination thereof. In some embodiments, the first sub-layer of the third dielectric layer 90 is deposited with a thickness that extends above top surfaces of the mask caps 62. A planarization process, such as a CMP, is then performed to form a top surface of the first sub-layer of the third dielectric layer 90 to be co-planar with top surfaces of the mask caps 62. Subsequently, a controlled etch back, such as an anisotropic etch, etches the first sub-layer of the third dielectric layer 90 to an appropriate thickness, such as a thickness that allows the first sub-layer of the third dielectric layer 90 to be over the second level metal-semiconductor compound region 88, or a thickness substantially equal to a thickness of the second level metal-semiconductor compound region 88. The first sub-layer of the third dielectric layer 90 may serve various purposes, such as an ILD.

The second sub-layer of the third dielectric layer 90 is then formed over the first sub-layer of the third dielectric layer 90 and the second level metal-semiconductor compound region 88. The second sub-layer of the third dielectric layer 90 can comprise silicon nitride, SiCN, or the like deposited by CVD, PECVD, ALD, or the like. In some embodiments, the second sub-layer of the third dielectric layer 90 is deposited with a thickness that extends above top surfaces of the mask caps 62. A planarization process, such as a CMP, is then performed to form top surfaces of the mask caps 62 to be co-planar with a top surface of the second sub-layer of the third dielectric layer 90. Subsequently, a controlled etch back, such as an anisotropic etch, etches the second sub-layer of the third dielectric layer 90 to an appropriate thickness. The second sub-layer of the third dielectric layer 90 may serve various purposes, such as an etch stop layer for forming contacts to the second level metal-semiconductor compound region 88 and/or as a gate spacer.

A second level gate dielectric layer 92 and second level gate electrode layer 94 are formed are formed over the third dielectric layer 90 and around the semiconductor posts 64. Second level gate dielectric layer 92 is deposited conformally on the semiconductor posts 64, such as over the top surfaces of the mask caps 62 and along the sidewalls of the semiconductor posts 64, and over the third dielectric layer 90. In accordance with some embodiments, second level gate dielectric layer 92 comprises silicon oxide, silicon nitride, or multilayers thereof. In other embodiments, second level gate dielectric layer 92 comprises a high-k dielectric material, and in these embodiments, second level gate dielectric layer 92 may have a k value greater than about 7.0, or further, greater than about 10.0. A high-k dielectric material may include SiON, $Si_3N_4$, $Ta_2O_5$, $Al_2O_3$, a Hf oxide, a Ta oxide, an Al oxide, the like, and a combination thereof. The formation methods of second level gate dielectric layer 92 may include MBD, ALD, PECVD, the like, or a combination thereof. Next, second level gate electrode layer 94 is deposited over second level gate dielectric layer 92. The second level gate electrode layer 94 may comprise a metal-containing material such as TiN, TaN, TiAl, TaAl, a Ti-containing material, a Ta-containing material, an Al-containing material, a W-containing material, TiSi, NiSi, PtSi, polysilicon with a silicide, a Cu-containing material, a refractory material, the like, a combination thereof, or multi-layers thereof. In some embodiments, the second level gate electrode layer 94 is deposited with a thickness that extends above top surfaces of the mask caps 62. A planarization process, such as a CMP, is then performed to form top surfaces of the second level gate electrode layer 94 to be co-planar with a top surface of the mask caps 62. Subsequently, a controlled etch back, such as an anisotropic etch, etches the second level gate electrode layer 94 to an appropriate thickness. The second level gate electrode layer 94 and the second level gate dielectric layer 92 are then patterned, such as by using an acceptable photolithography and etching process, such as RIE or the like. The resulting second level gate electrode layer 94 and the second level gate dielectric layer 92 define second level channel regions 96 in the semiconductor posts 64.

A fourth dielectric layer 98 is formed over the third dielectric layer 90 and the second level gate electrode layer 94 and around the semiconductor posts 64. The fourth dielectric layer 98 can include a first sub-layer and a second sub-layer over the first sub-layer, for example. The first sub-layer of the fourth dielectric layer 98 may comprise silicon oxide, TEOS, PSG, BSG, FSG, $SiO_xC_y$, Spin-On-Glass, Spin-On-Polymers, silicon carbon material, a compound thereof, a composite thereof, a combination thereof, or the like, formed by any suitable method, such as CVD, PECVD, spinning, the like, or a combination thereof. In some embodiments, the first sub-layer of the fourth dielectric layer 98 is deposited with a thickness that extends above top surfaces of the mask caps 62. A planarization process, such as a CMP, is then performed to form a top surface of the first sub-layer of the fourth dielectric layer 98 to be co-planar with top surfaces of the mask caps 62. Subsequently, a controlled etch back, such as an anisotropic etch, etches the first sub-layer of the fourth dielectric layer 98 to an appropriate thickness, such as a thickness that allows the first sub-layer of the fourth dielectric layer 98 to be over the second level gate electrode layer 94, or a thickness substantially equal to a thickness of the stack of the second level gate dielectric layer 92 and the second level gate electrode layer 94. The first sub-layer of the fourth dielectric layer 98 may serve various purposes, such as an ILD.

The second sub-layer of the fourth dielectric layer 98 is then formed over the first sub-layer of the fourth dielectric layer 98 and the second level gate electrode layer 94. The second sub-layer of the fourth dielectric layer 98 can comprise silicon nitride, SiCN, or the like deposited by CVD, PECVD, ALD, or the like. In some embodiments, the second sub-layer of the fourth dielectric layer 98 is deposited with a thickness that extends above top surfaces of the mask caps 62. A planarization process, such as a CMP, is then performed to form top surfaces of the mask caps 62 to be co-planar with a top surface of the second sub-layer of the fourth dielectric layer 98.

An opening for contact 100 is then formed through the fourth dielectric layer 98, third dielectric layer 90, second dielectric layer 82, and first dielectric layer 74 to the first level metal-semiconductor compound region 72 using one or more etching steps. The opening may be formed using acceptable photolithography and etching techniques. A liner, such as a diffusion barrier layer, an adhesion layer, or the like, and a conductive material are formed in the opening. The liner may include titanium, titanium nitride, tantalum, tantalum nitride, or the like formed by ALD, CVD, or the like. The conductive material may be copper, a copper alloy, silver, gold, tungsten, aluminum, nickel, or the like formed by ALD, CVD, PVD, or the like. A planarization process, such as a CMP, may be performed to remove excess material from a surface of the fourth dielectric layer 98 and to form top surfaces of the fourth dielectric layer 98, conductive material and liner, and mask caps 62 to be co-planar. Subsequently, a controlled etch back, such as an anisotropic etch, etches the second sub-layer of the fourth dielectric layer 98 and the conductive material and liner to appropriate thicknesses. The second sub-layer of the fourth dielectric layer 98 may serve various purposes, such as an etch stop layer for forming contacts to the second level gate electrode layer 94 and/or as a gate spacer. The remaining liner and conductive material form the contact 100 in the opening. Contact 100 is physically and electrically coupled to the first level metal-semiconductor compound region 72. The mask caps 62 can then be removed, such as by using an etch selective to the material of the mask caps 62.

Third level first pad semiconductor material 102 and third level second pad semiconductor material 104 are deposited and patterned on the fourth dielectric layer 98. The third level first pad semiconductor material 102 is deposited on and around the semiconductor posts 64 protruding from the fourth dielectric layer 98. The third level second pad semiconductor material 104 is deposited on the contact 100. The third level first pad semiconductor material 102 and third level second pad semiconductor material 104 can be an amorphous or polycrystalline material. The third level first pad semiconductor material 102 and third level second pad semiconductor material 104 can be elemental semiconductor like silicon, germanium, or the like; a compound or alloy semiconductor including SiC, SiP, SiPC, GaAs, GaP, InP, InAs, InSb, SiGe, GaAsP, AlInAs, AlGaAs, GaInAs, GaInP, and/or GaInAsP; the like; or a combination thereof. The third level first pad semiconductor material 102 and third level second pad semiconductor material 104 can be deposited by CVD, deposition of doped amorphous semiconductor followed by SPER, ELO, epitaxy, or the like. In some embodiments, the third level first pad semiconductor material 102 and third level second pad semiconductor material 104 are deposited with a thickness that extends above top surfaces of the semiconductor posts 64. A planarization process, such as a CMP, is then performed to form a planar top surface of the third level first pad semiconductor material 102 and third level second pad semiconductor material 104. The third level first pad semiconductor material 102 and third level second pad semiconductor material 104 are then patterned, such as by using an acceptable photolithography and etching process, such as RIE or the like.

In some embodiments, the third level first pad semiconductor material 102 and third level second pad semiconductor material 104 are in situ doped during the deposition of the third level first pad semiconductor material 102 and third level second pad semiconductor material 104. In other embodiments, the third level first pad semiconductor material 102 and third level second pad semiconductor material 104 can be doped by an implantation process after the deposition. The dopant concentration of the third level first pad semiconductor material 102 and third level second pad semiconductor material 104 can be in a range from about $1\times10^{20}$ cm$^{-3}$ to about $1\times10^{21}$ cm$^{-3}$. The dopant can be a p-type dopant, such as boron (B), BF$_2$, or the like, for a p-type device, such as a p-type FET. The dopant can be an n-type dopant, such as arsenic (As), phosphorus (P), or the like, for an n-type device, such as an n-type FET.

The structure can then be annealed to diffuse dopants into third level source/drain regions 106 of the semiconductor posts 64 from the third level first pad semiconductor material 102. The anneal can be at a temperature in a range from about 800° C. to about 1100° C. and for a duration in a range from about 3600 seconds to about 1 millisecond, respectively. The dopant concentration of the third level source/drain regions 106 after the anneal can be in a range from about $5\times10^{19}$ cm$^{-3}$ to about $1\times10^{21}$ cm$^{-3}$.

Then, a third level first metal-semiconductor compound region 108 is formed in and/or on the third level first pad semiconductor material 102, and a third level second metal-semiconductor compound region 110 is formed in and/or on the third level second pad semiconductor material 104. The third level first metal-semiconductor compound region 108 and third level second metal-semiconductor compound region 110 can be formed by depositing a metal on the third level first pad semiconductor material 102 and third level second pad semiconductor material 104 and reacting the metal with the third level first pad semiconductor material 102 and third level second pad semiconductor material 104. In some embodiments, the metal can include cobalt, titanium, nickel, tungsten, the like, or a combination thereof, and can be deposited by PVD, ALD, CVD, the like, or a combination thereof. The metal can be caused to react with the semiconductor by using an anneal. Any unreacted metal that remains after the anneal can be removed using an etch selective to the unreacted metal. The third level first metal-semiconductor compound region 108 and third level second metal-semiconductor compound region 110 can include a silicide, such as CoSi, TiSi, NiSi, WSi, or the like; a germanicide; the like; or a combination thereof. As illustrated, the third level first metal-semiconductor compound region 108 and third level second metal-semiconductor compound region 110 are formed in, and consume, less than respective entireties of the third level first pad semiconductor material 102 and third level second pad semiconductor material 104. In other embodiments, the third level first metal-semiconductor compound region 108 and third level second metal-semiconductor compound region 110 can be formed to a greater or lesser extent in the third level first pad semiconductor material 102 and third level second pad semiconductor material 104.

In FIG. 9, a fifth dielectric layer 112, such as an ILD, is formed over the fourth dielectric layer 98, the third level first metal-semiconductor compound region 108, and third level second metal-semiconductor compound region 110, and contacts 114, 116, 118, 120, and 122 are formed through various dielectric layers to various components. The fifth dielectric layer 112 may comprise silicon oxide, TEOS, PSG, borophosphosilicate glass (BPSG), FSG, SiO$_x$C$_y$, Spin-On-Glass, Spin-On-Polymers, silicon carbon material, compounds thereof, composites thereof, combinations thereof, or the like, formed by any suitable method, such as CVD, PECVD, spinning, the like, or a combination thereof. A planarization process, such as a CMP, can be performed to planarize the fifth dielectric layer 112.

Openings for the contacts 114, 116, 118, 120, and 122 can be formed using one or more etching steps. An opening for contact 114 is etched through the fifth dielectric layer 112, fourth dielectric layer 98, and third dielectric layer 90 to the second level metal-semiconductor compound region 88. An opening for contact 116 is etched through the fifth dielectric layer 112 to the third level first metal-semiconductor compound region 108. An opening for contact 118 is etched through the fifth dielectric layer 112 and fourth dielectric layer 98 to the second level gate electrode layer 94. An opening for contact 120 is etched through the fifth dielectric layer 112, fourth dielectric layer 98, third dielectric layer 90, and second dielectric layer 82 to the first level gate electrode layer 78. An opening for contact 122 is etched through the fifth dielectric layer 112 to the third level second metal-semiconductor compound region 110. The openings may be formed using acceptable photolithography and etching techniques.

A liner, such as a diffusion barrier layer, an adhesion layer, or the like, and a conductive material are formed in the openings. The liner may include titanium, titanium nitride, tantalum, tantalum nitride, or the like formed by ALD, CVD, or the like. The conductive material may be copper, a copper alloy, silver, gold, tungsten, aluminum, nickel, or the like formed by ALD, CVD, PVD, or the like. A planarization process, such as a CMP, may be performed to remove excess material from a surface of the fifth dielectric layer 112. The remaining liner and conductive material form contacts 114, 116, 118, 120, and 122 in the openings. Contact 114 is physically and electrically coupled to the second level metal-semiconductor compound region 88. Contact 116 is physically and electrically coupled to the third level first metal-semiconductor compound region 108. Contact 118 is physically and electrically coupled to the second level gate electrode layer 94. Contact 120 is physically and electrically coupled to the first level gate electrode layer 78. Contact 122 is physically and electrically coupled to the third level second metal-semiconductor compound region 110.

In FIG. 10, a sixth dielectric layer 124 is formed over the fifth dielectric layer 112 and with metallizations 128, 132, 136, 140, and 144 with vias 126, 130, 134, 138 and 142, respectively. The sixth dielectric layer 124, such as an Inter-Metallization Dielectric (IMD), is formed over the fifth dielectric layer 112. The sixth dielectric layer 124 may comprise silicon oxide, TEOS, PSG, BPSG, FSG, $SiO_xC_y$, Spin-On-Glass, Spin-On-Polymers, silicon carbon material, compounds thereof, composites thereof, combinations thereof, or the like, formed by any suitable method, such as CVD, PECVD, spinning, the like, or a combination thereof. A planarization process, such as a CMP, can be performed to planarize the sixth dielectric layer 124.

Recesses and openings corresponding to the metallizations 128, 132, 136, 140, and 144 and vias 126, 130, 134, 138 and 142 are then formed in the sixth dielectric layer 124. The openings and recesses may be formed using acceptable photolithography and etching techniques. A liner, such as a diffusion barrier layer, an adhesion layer, or the like, and a conductive material are formed in the openings and recesses. The liner may include titanium, titanium nitride, tantalum, tantalum nitride, or the like formed by ALD, CVD, or the like. The conductive material can be copper, a copper alloy, silver, gold, tungsten, aluminum, or the like formed by ALD, CVD, PVD, plating, or the like. A planarization process, such as CMP, may be performed to remove any excess material from the top surface of the sixth dielectric layer 124. Remaining portions of the liner and the conductive material form the metallizations 128, 132, 136, 140, and 144 with vias 126, 130, 134, 138 and 142. Via 126 is physically and electrically coupled between contact 114 and metallization 128. Via 130 is physically and electrically coupled between contact 116 and metallization 132. Via 134 is physically and electrically coupled between contact 118 and metallization 136. Via 138 is physically and electrically coupled between contact 120 and metallization 140. Via 142 is physically and electrically coupled between contact 122 and metallization 144.

FIG. 10 illustrates a stacked device that includes a first device M1 and a second device M2. The first device M1 is, in this example, a VGAA FET that includes the first level source/drain regions 68, the first level channel regions 80, the second level source/drain regions 86, the first level gate dielectric layer 76, and the first level gate electrode layer 78. The second device M2 is, in this example, a VGAA FET that is over the first device M1 and that includes the second level source/drain regions 86, the second level channel regions 96, the third level source/drain regions 106, the second level gate dielectric layer 92, and the second level gate electrode layer 94. The devices M1 and M2 can have more or fewer semiconductor posts 64 that what is illustrated in FIG. 10. For example, the devices M1 and M2 can have one semiconductor post 64, two semiconductor posts 64, four semiconductor posts 64, etc. Further, and as will be illustrated later, the first device M1 can have a different number of semiconductor posts 64 than the second device M2. For example, the first device M1 can have one or more additional semiconductor post 64 than the second device M2 to provide for asymmetry between the devices M1 and M2 for appropriate functionality of the devices.

FIG. 10 further illustrates a first level source/drain SD1, a first level gate G1, a second level source/drain SD2, a second level gate G2, and a third level source/drain SD3. The first level source/drain SD1 is shown in an overlaid layout view in FIG. 11A. The first level gate G1 is shown in an overlaid layout view in FIG. 11B. The second level source/drain SD2 is shown in an overlaid layout view in FIG. 11C. The second level gate G2 is shown in an overlaid layout view in FIG. 11D. The third level source/drain SD3 is shown in an overlaid layout view in FIG. 11E.

FIG. 12 illustrates a circuit schematic of the structure shown in FIG. 10. Components in the circuit schematic of FIG. 12 are labeled with reference characters corresponding to the structure in FIG. 10. As shown, the first and second devices M1 and M2 share a source/drain region 86, which is coupled to a node 88/84, which can be a power supply node such as a VDD node or a VSS node.

Figure 29:
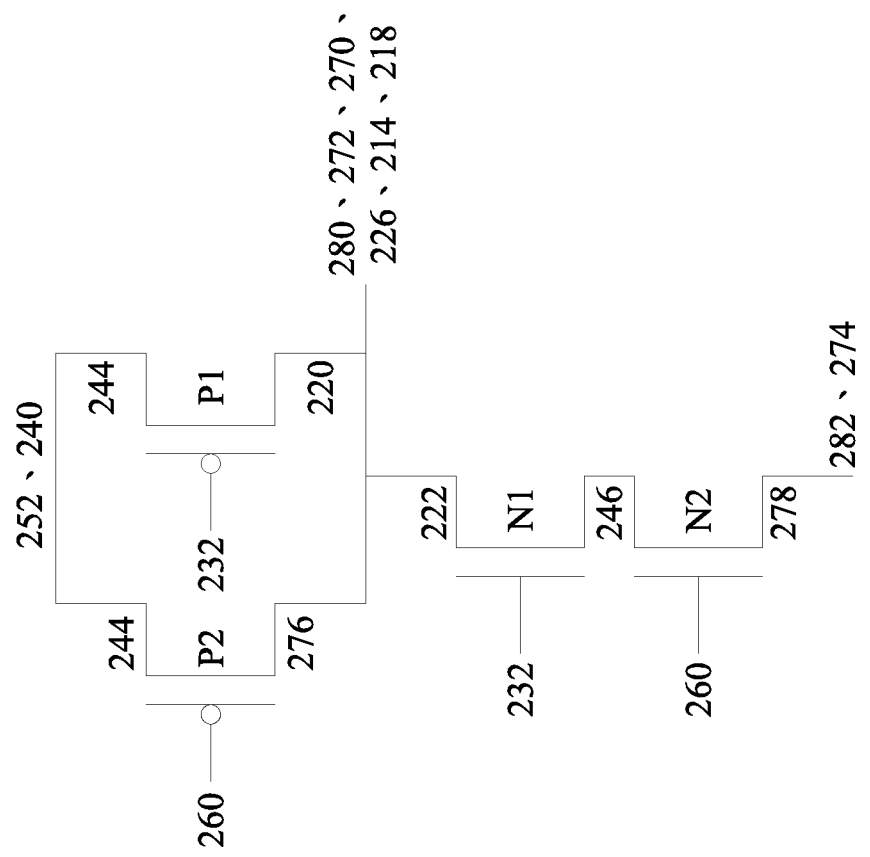
FIG. 29 is a circuit diagram of the circuit formed by the structure of FIG. 27 in accordance with some embodiments.

FIGS. 13 through 27 illustrate cross sectional views of intermediate steps during a process for forming stacked VGAA device structures in accordance with some embodiments. FIGS. 28A through 28E are overlaid layouts of various levels of the structure illustrated in FIG. 27, and FIG. 29 is a circuit diagram of the circuit formed by the structure of FIG. 27. The circuit formed by the structure in FIG. 27 is a NAND gate, as discussed in further detail below. Much of the processing in FIGS. 13 through 27 is the same or similar to processing described in FIGS. 1 through 10 such that much of the description will be omitted for brevity.

Figure 13:
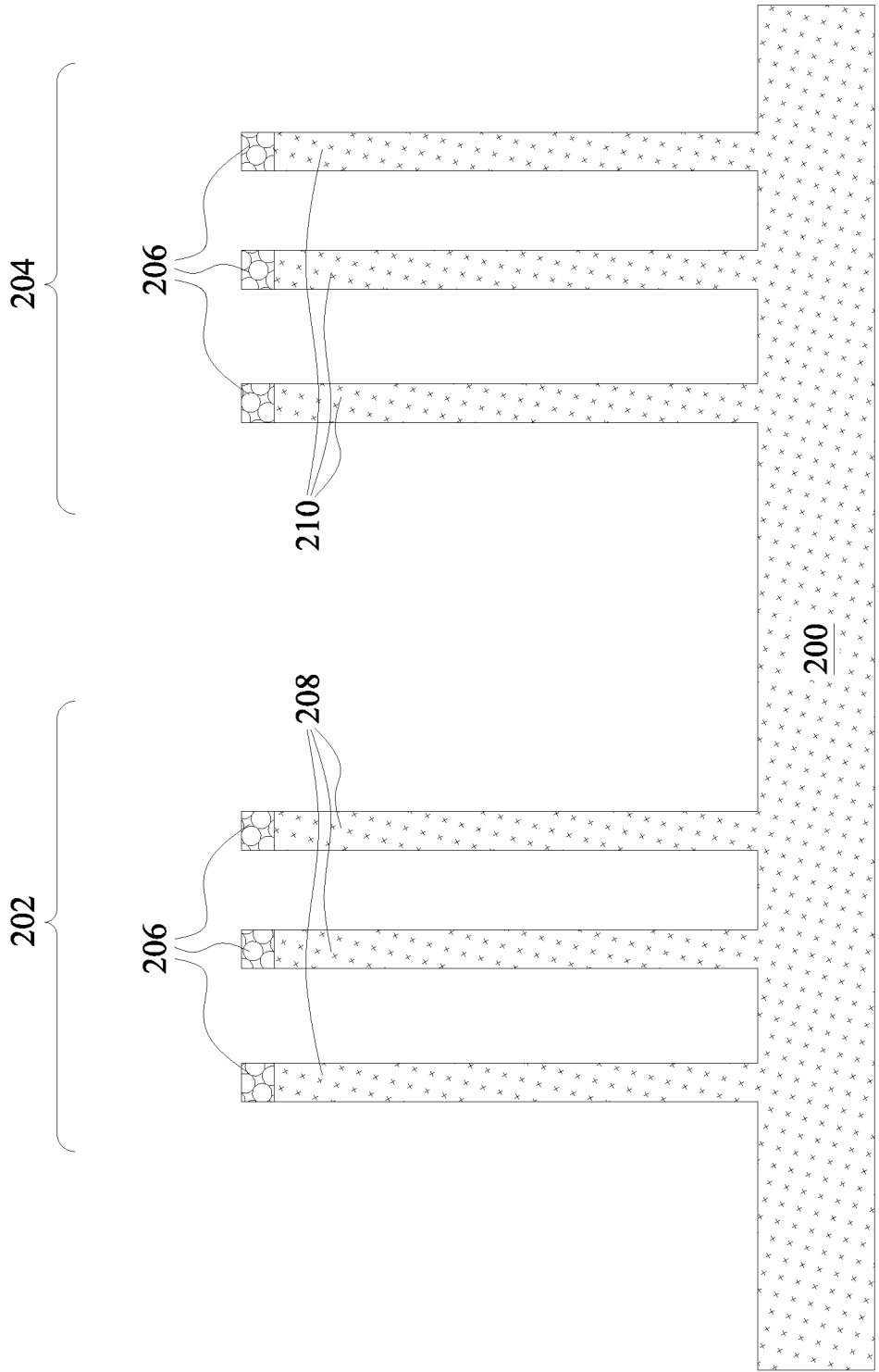
FIGS. 13 through 27 are cross sectional views of intermediate steps during a process for forming stacked VGAA device structures in accordance with some embodiments.

In FIG. 13, semiconductor posts 208 and 201 are formed on a substrate 200 using mask caps 206 as a mask. The substrate 200 has a first region 202, such as a p-type device region, and a second region 204, such as an n-type device region. Although not specifically illustrated, the substrate 200 can include an n doped well in the first region 202 and a p doped well in the second region 204. The dopants of the respective doped wells can be the dopants previously discussed, and a concentration of the dopant in the respective doped wells can be in a range from about $1\times10^{12}$ cm$^{-3}$ to about $5\times10^{13}$ cm$^{-3}$. The first region 202 includes semiconductor posts 208 formed in the n doped well in the substrate 200, and the second region 204 includes semiconductor posts 210 formed in the p doped well in the substrate 200.

Figure 14:
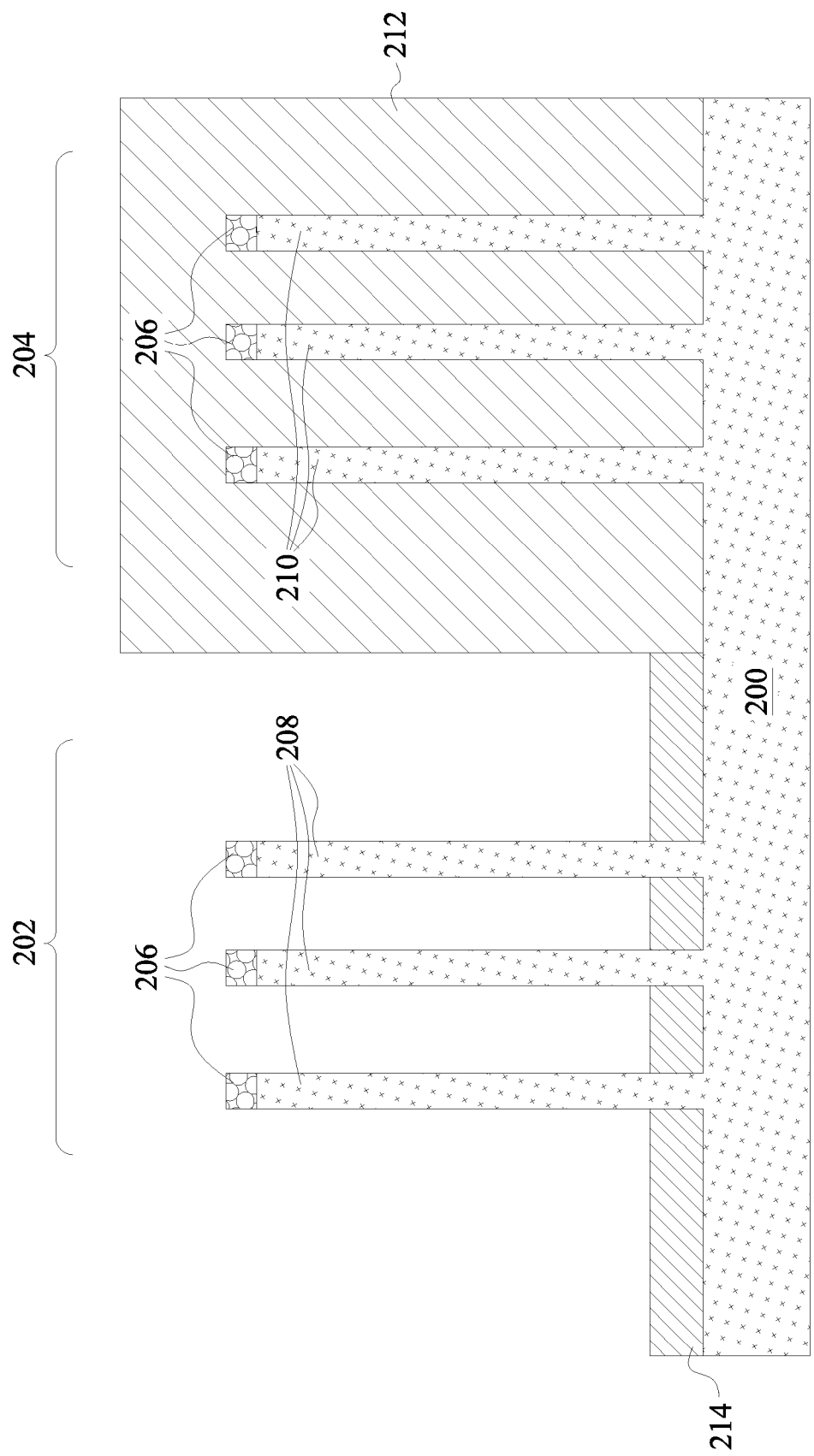

In FIG. 14, a first level first pad semiconductor material 214 is epitaxially grown on the substrate 200 in the first region 202. Before the growth, a mask 212, such as a hardmask, is formed over the second region 204. For example, the mask 212 can be SiN, SiCN, SiON, or the like, deposited by CVD, PECVD, or the like. The mask 212 can be patterned to remain masking the second region 204 while exposing the first region 202 using acceptable photolithography and etching techniques. While the second region 204 is masked by the mask 212, the first level first pad semiconductor material 214 is grown in the first region 202, such as with any of the materials and grown by any of the processes discussed with respect to FIG. 3. The epitaxial growth can be anisotropic such that the growth is substantially only in a vertical direction in the first region 202 and does not substantially nucleate on crystalline sidewalls, such as sidewalls of the semiconductor posts 208. The epitaxial growth may further not substantially nucleate on non-crystalline material, such as the mask 212. After the epitaxial growth of the first level first pad semiconductor material 214, the mask 212 can be removed, such as by using etching selective to the material of the mask 212.

Figure 15:
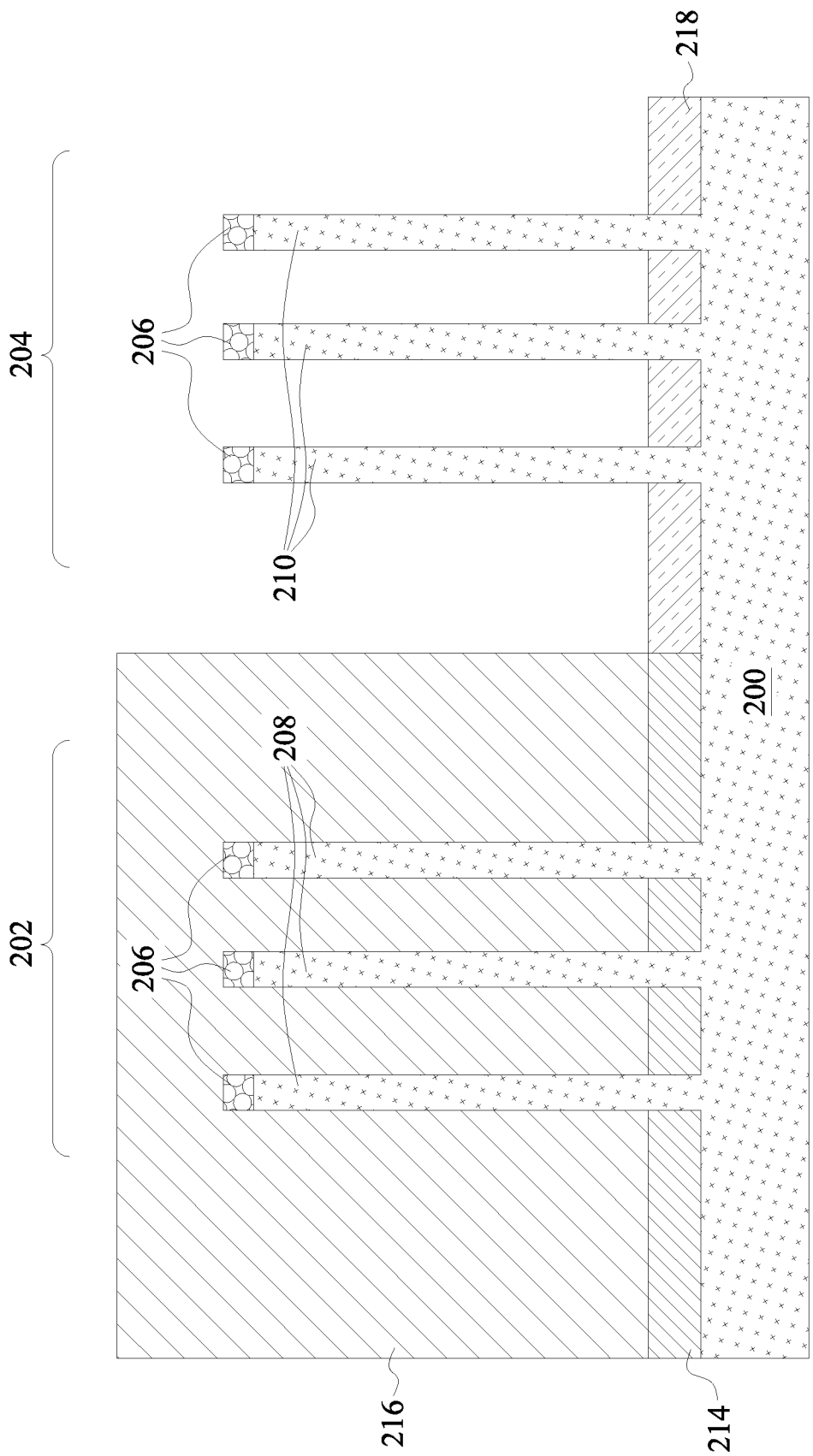
Figure 16:
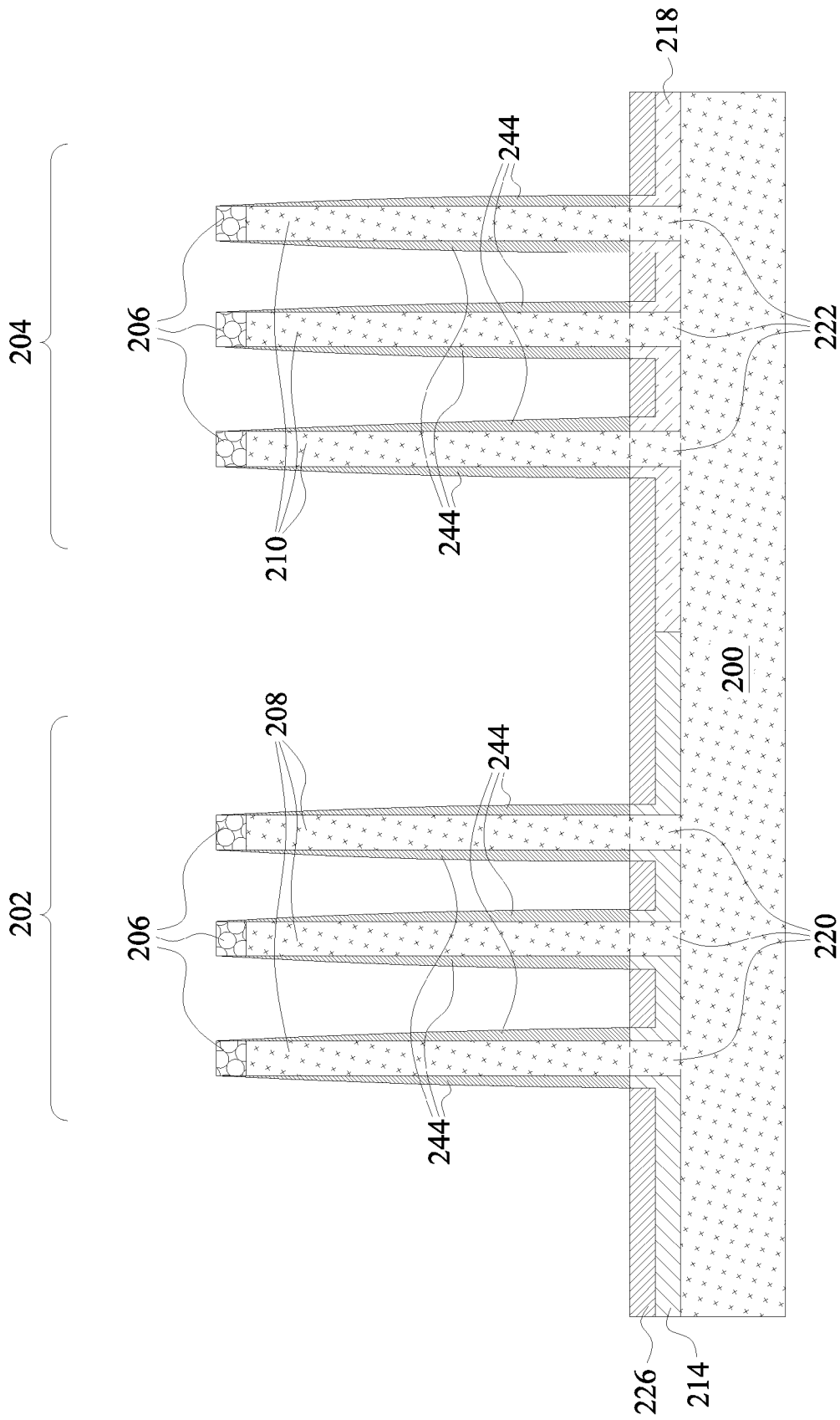

In FIG. 15, a first level second pad semiconductor material 218 is epitaxially grown on the substrate 200 in the second region 204. Before the growth, a mask 216, such as a hardmask, is formed over the first region 202. For example, the mask 216 can be SiN, SiCN, SiON, or the like, deposited by CVD, PECV, or the like. The mask 216 can be patterned to remain masking the first region 202 while exposing the second region 204 using acceptable photolithography and etching techniques. While the first region 202 is masked by the mask 216, the first level second pad semiconductor material 218 is grown in the second region 204, such as with any of the materials and grown by any of the processes discussed with respect to FIG. 3. The epitaxial growth can be anisotropic such that the growth is substantially only in a vertical direction in the second region 204 and does not substantially nucleate on crystalline sidewalls, such as sidewalls of the semiconductor posts 210. The epitaxial growth may further not substantially nucleate on non-crystalline material, such as the mask 216. The first level second pad semiconductor material 218 physically contacts the first level first pad semiconductor material 214. After the epitaxial growth of the first level second pad semiconductor material 218, the mask 216 can be removed, such as by using etching selective to the material of the mask 216.

In other embodiments, the first level first pad semiconductor material 214 can be deposited as an amorphous or polycrystalline material in the first region 202 and the second region 204. The first level first pad semiconductor material 214 can be deposited with a thickness that extends above top surfaces of the mask caps 206. The first level first pad semiconductor material 214 may then be planarized, such as by a CMP. The first level first pad semiconductor material 214 is then removed from the second region 204, such as by using an acceptable photolithography and etch process. Then, the first level second pad semiconductor material 218 can be deposited as an amorphous or polycrystalline material in the second region 204 with a thickness that extends above top surfaces of the mask caps 206, and possibly over the first level first pad semiconductor material 214 in the first region 202. A planarization process, such as a CMP, is then performed to form top surfaces of the first level first pad semiconductor material 214 and first level second pad semiconductor material 218 to be co-planar, which may remove any of the first level second pad semiconductor material 218 from the first region 202. Subsequently, a controlled etch back, such as an anisotropic etch, etches the first level first pad semiconductor material 214 and first level second pad semiconductor material 218 to an appropriate thickness. The first level first pad semiconductor material 214 and first level second pad semiconductor material 218 are then patterned, such as by using an acceptable photolithography and etching process, such as RIE or the like. The first level second pad semiconductor material 218 physically contacts the first level first pad semiconductor material 214.

In some embodiments, the first level first pad semiconductor material 214 and the first level second pad semiconductor material 218 are in situ doped during the growth and/or deposition of the first level first pad semiconductor material 214 and the first level second pad semiconductor material 218, respectively. In other embodiments, the first level first pad semiconductor material 214 and the first level second pad semiconductor material 218 can be doped by an implantation process after the growth and/or deposition. In still further embodiments, a single growth and/or deposition process may be used to form the first level first pad semiconductor material 214 and the first level second pad semiconductor material 218 across the first region 202 and the second region 204 followed by dopant implantation processes.

The first level first pad semiconductor material 214 in the first region 202 can be doped with a p-type dopant, and the dopant concentration of the first level first pad semiconductor material 214 can be in a range from about $1\times10^{20}$ cm$^{-3}$ to about $2\times10^{21}$ cm$^{-3}$. The first level second pad semiconductor material 218 in the second region 204 can be doped with an n-type dopant, and the dopant concentration of the first level second pad semiconductor material 218 can be in a range from about $5\times10^{19}$ cm$^{-3}$ to about $1\times10^{21}$ cm$^{-3}$.

The structure can then be annealed to diffuse dopants into first level first source/drain regions 220 of the semiconductor posts 208 in the first region 202 and to diffuse dopants into first level second source/drain regions 222 of the semiconductor posts 210 in the second region 204. The first level first source/drain regions 220 can be doped with a p-type dopant diffused from the first level first pad semiconductor material 214, and the first level second source/drain regions 222 can be doped with an n-type dopant diffused from the first level second pad semiconductor material 218. The anneal can be at a temperature in a range from about 800° C. to about 1100° C. and for a duration in a range from about 3600 seconds to about 1 millisecond, respectively. The dopant concentration of the first level first source/drain regions 220 and the first level second source/drain regions 222 after the anneal can be in a range from about $5\times10^{19}$ cm$^{-3}$ to about $1\times10^{21}$ cm$^{-3}$. Further, if the first level first pad semiconductor material 214 and first level second pad semiconductor material 218 are deposited as an amorphous material, the anneal can crystallize the first level first pad semiconductor material 214 and first level second pad semiconductor material 218 using the substrate 200 as a template for the crystalline orientation.

Spacers 224 are then formed around sidewalls of the semiconductor posts 208 and 210 and over the first level first pad semiconductor material 214 and first level second pad semiconductor material 218. Then, a first level metal-semiconductor compound region 226 is formed on and/or in the first level first pad semiconductor material 214 and first level second pad semiconductor material 218. The first level metal-semiconductor compound region 226 electrically couples the first level first source/drain regions 220 to the first level second source/drain regions 222 without a p-n junction being formed in the flow of current therebetween. The first level metal-semiconductor compound region 226 is formed on and/or in the exposed portions of the first level first pad semiconductor material 214 and first level second pad semiconductor material 218. As illustrated, the first level metal-semiconductor compound region 226 is formed in, and consumes, less than an entirety of the exposed portions of the first level first pad semiconductor material 214 and first level second pad semiconductor material 218 that are not under or protected by the spacers 224. In other embodiments, the first level metal-semiconductor compound region 226 can be formed to a greater or lesser extent in the first level first pad semiconductor material 214 and first level second pad semiconductor material 218 and/or substrate 200. The spacers 224 are then removed, such as by an etch selective to a material of the spacers 224.

Figure 17:
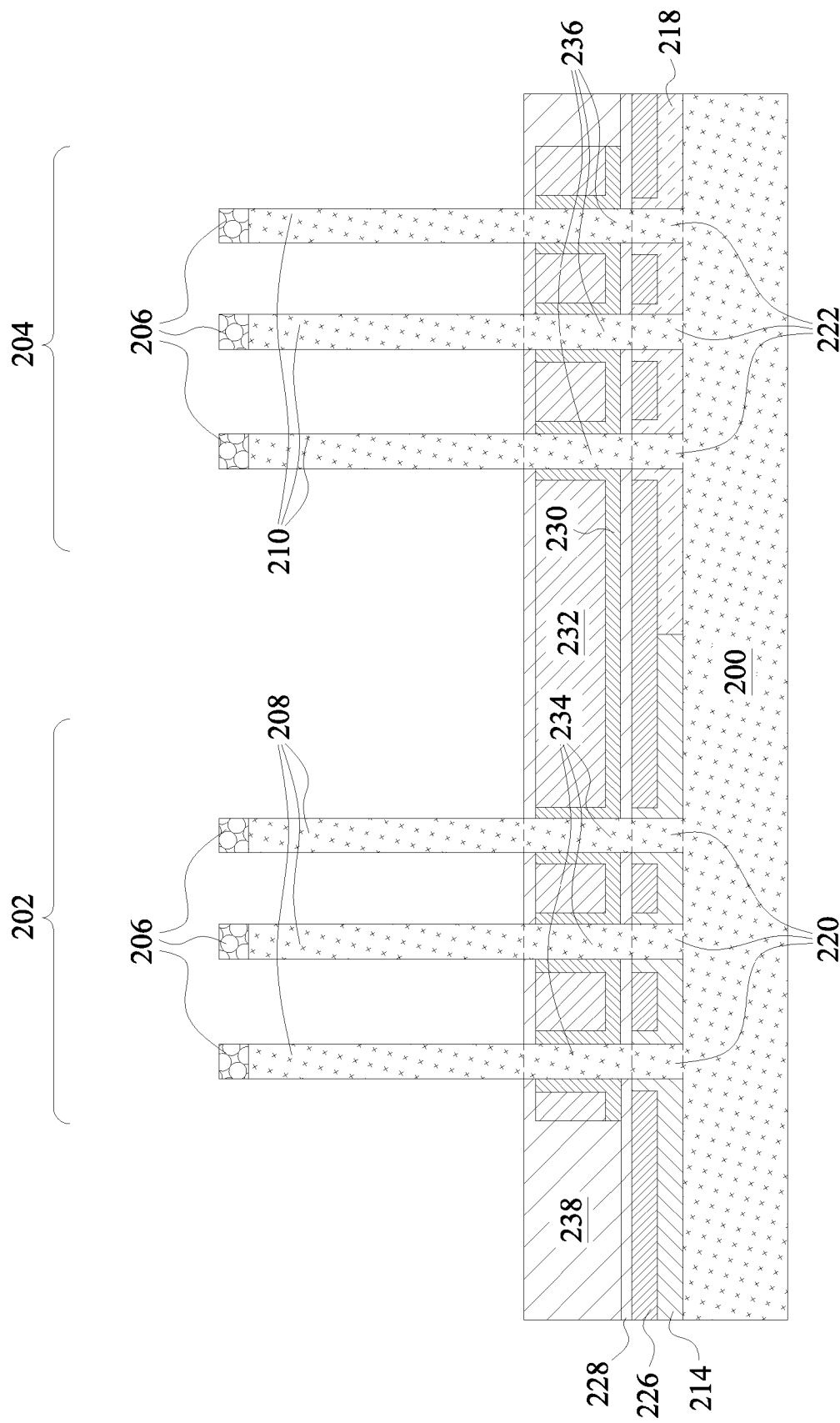

In FIG. 17, a first dielectric layer 228 is formed over the first level metal-semiconductor compound region 226 and around the semiconductor posts 208 and 210. A first level gate dielectric layer 230 and first level gate electrode layer 232 are formed over the first dielectric layer 228 and around the semiconductor posts 208 and 210. The first level gate electrode layer 232 and the first level gate dielectric layer 230 define first level first channel regions 234 in the semiconductor posts 208 and define first level second channel regions 236 in the semiconductor posts 210. A second dielectric layer 238 is formed over the first dielectric layer 228 and the first level gate electrode layer 232 and around the semiconductor posts 208 and 210.

Figure 18:
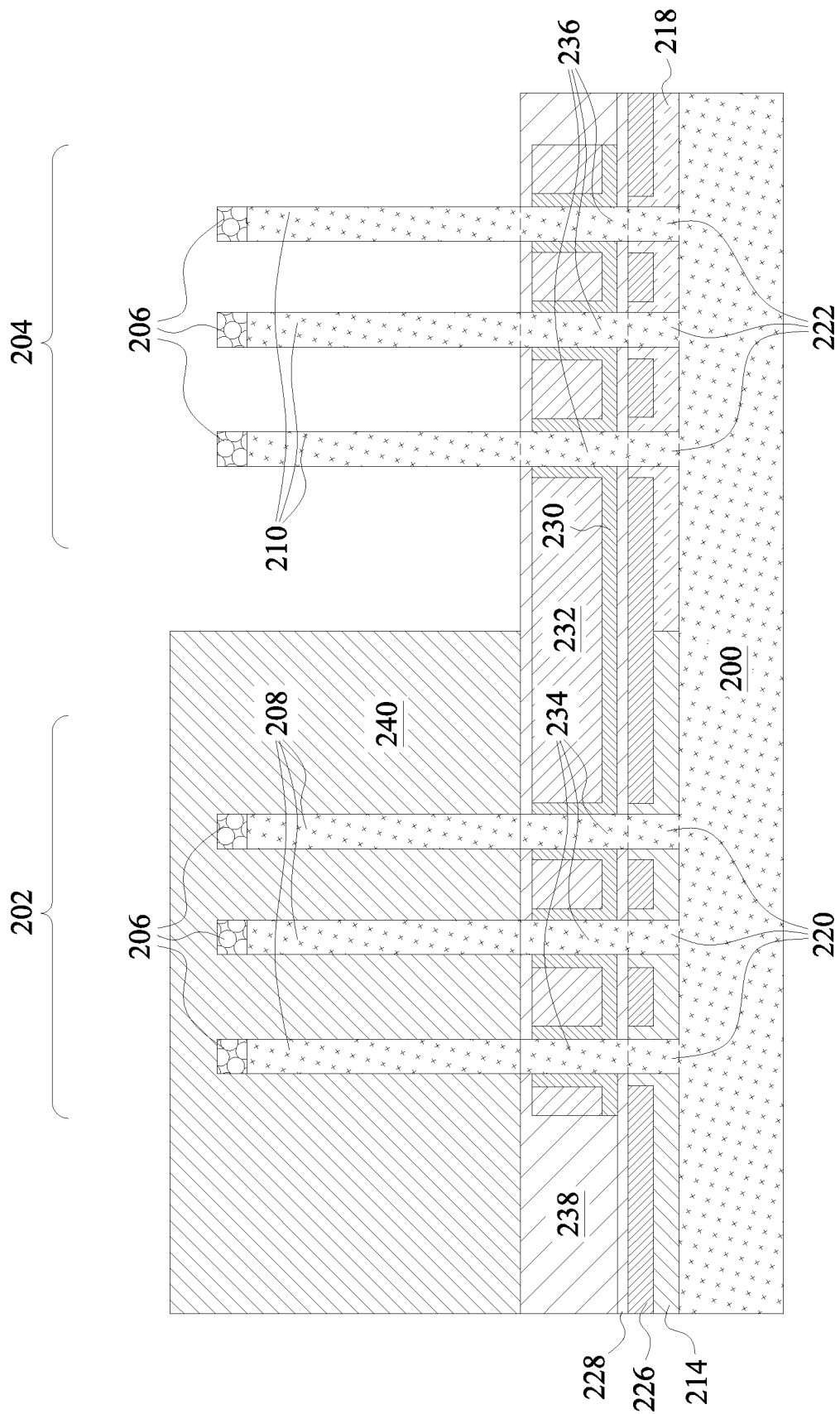

In FIG. 18, a second level first pad semiconductor material 240 is formed over the second dielectric layer 238 and around the semiconductor posts 208 in the first region 202. The second level first pad semiconductor material 240 can be deposited as an amorphous or polycrystalline material in the first region 202 and the second region 204 with a thickness that extends above top surfaces of the mask caps 206. The second level first pad semiconductor material 240 can be any of the material and deposited by any of the processes discussed with respect to FIG. 6. The second level first pad semiconductor material 240 may then be planarized, such as by a CMP. The second level first pad semiconductor material 240 is then removed from the second region 204, such as by using an acceptable photolithography and etch process.

Figure 19:
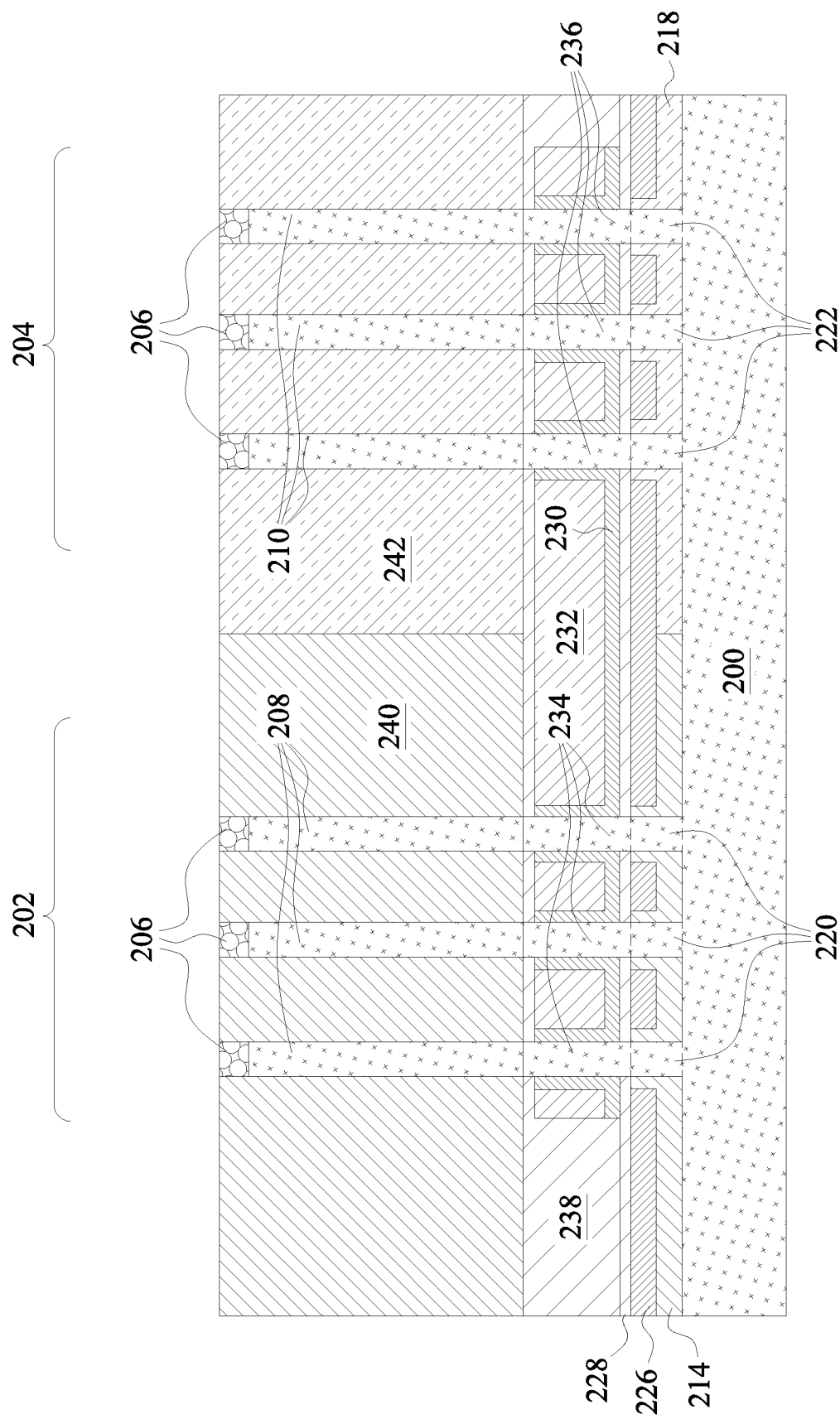

In FIG. 19, a second level second pad semiconductor material 242 is deposited over the second dielectric layer 238 and around the semiconductor posts 210 in the second region 204 and, possibly, on the second level first pad semiconductor material 240 in the first region 202. The second level second pad semiconductor material 242 can be deposited as an amorphous or polycrystalline material in the second region 204 with a thickness that extends above top surfaces of the mask caps 206, and possibly over the second level first pad semiconductor material 240 in the first region 202. The second level second pad semiconductor material 242 can be any of the material and deposited by any of the processes discussed with respect to FIG. 6. A planarization process, such as a CMP, is then performed to form top surfaces of the second level first pad semiconductor material 240 and second level second pad semiconductor material 242 to be co-planar, which may remove any of the second level second pad semiconductor material 242 from the first region 202.

Figure 20:
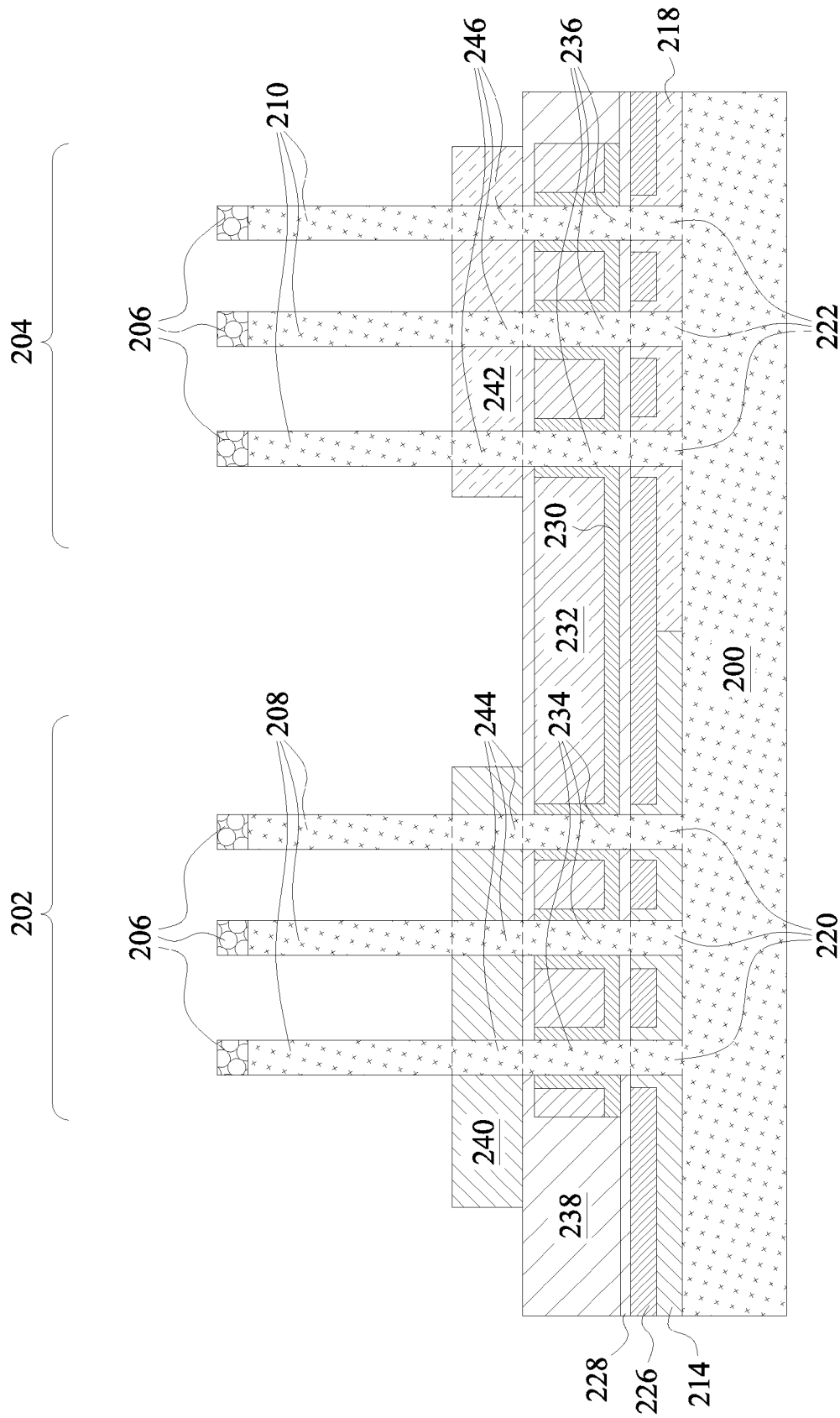
Figure 21:
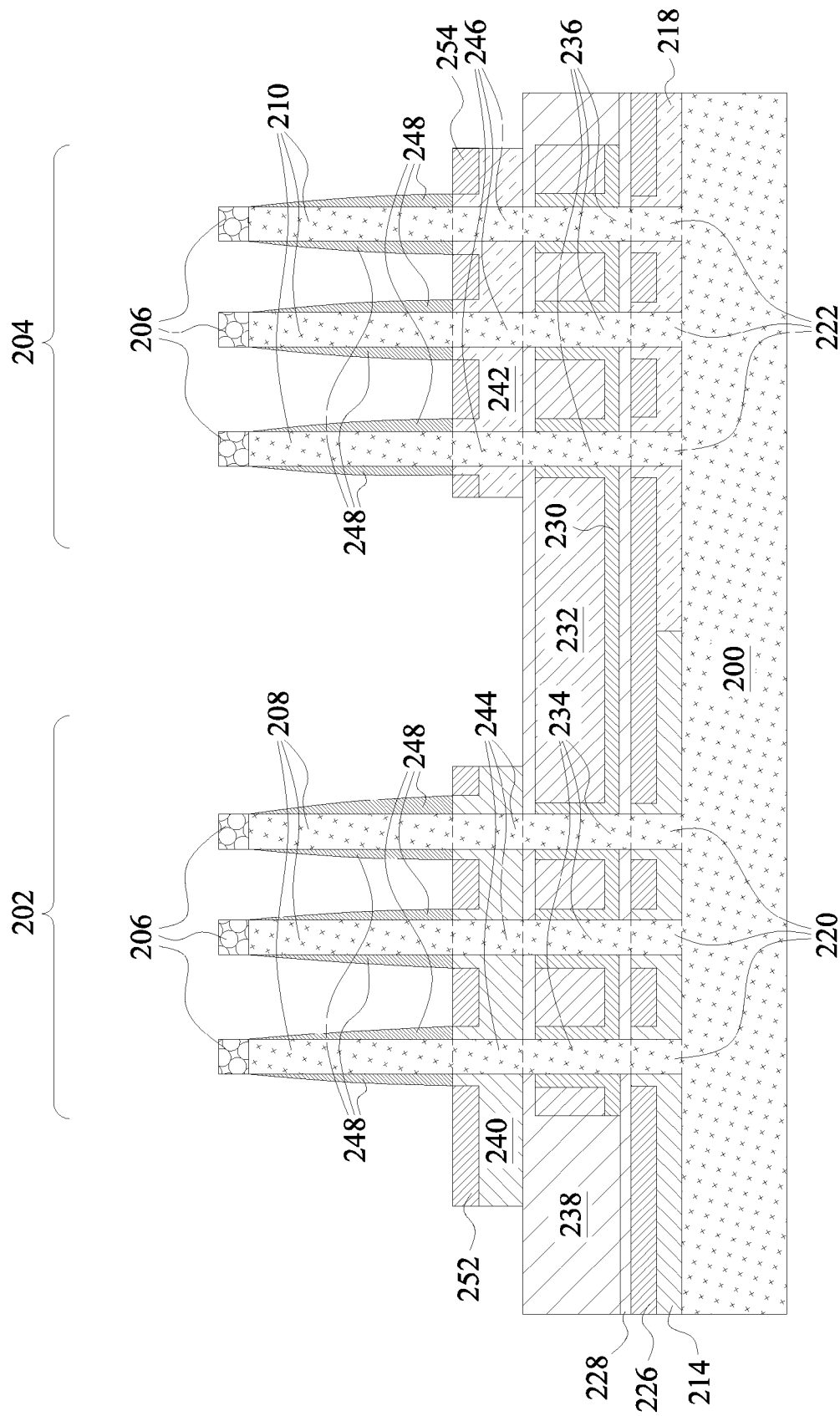

In FIG. 20, a controlled etch back, such as an anisotropic etch, etches the second level first pad semiconductor material 240 and second level second pad semiconductor material 242 to an appropriate thickness. The second level first pad semiconductor material 240 and second level second pad semiconductor material 242 are then patterned, such as by using an acceptable photolithography and etching process, such as RIE or the like. The second level second pad semiconductor material 242 is physically separated from the second level first pad semiconductor material 240.

In some embodiments, the second level first pad semiconductor material 240 and second level second pad semiconductor material 242 are in situ doped during the deposition of the second level first pad semiconductor material 240 and second level second pad semiconductor material 242, respectively. In other embodiments, the second level first pad semiconductor material 240 and second level second pad semiconductor material 242 can be doped by an implantation process after the deposition. The second level first pad semiconductor material 240 in the first region 202 can be doped with a p-type dopant, and the dopant concentration of the second level first pad semiconductor material 240 can be in a range from about $1\times10^{20}$ cm$^{-3}$ to about $2\times10^{21}$ cm$^{-3}$. The second level second pad semiconductor material 242 in the second region 204 can be doped with an n-type dopant, and the dopant concentration of the second level second pad semiconductor material 242 can be in a range from about $1\times10^{20}$ cm$^{-3}$ to about $2\times10^{21}$ cm$^{-3}$.

The structure can then be annealed to diffuse dopants into second level first source/drain regions 244 of the semiconductor posts 208 in the first region 202 and to diffuse dopants into second level second source/drain regions 246 of the semiconductor posts 210 in the second region 204. The second level first source/drain regions 244 can be doped with a p-type dopant diffused from the second level first pad semiconductor material 240, and the second level second source/drain regions 246 can be doped with an n-type dopant diffused from the second level second pad semiconductor material 242. The anneal can be at a temperature in a range from about 800° C. to about 1100° C. and for a duration in a range from about 3600 seconds to about 1 millisecond, respectively. The dopant concentration of the second level first source/drain regions 244 and the second level second source/drain regions 246 after the anneal can be in a range from about $5\times10^{19}$ cm$^{-3}$ to about $1\times10^{21}$ cm$^{-3}$.

Spacers 248 are then formed around sidewalls of the semiconductor posts 208 and 210 and over the second level first pad semiconductor material 240 and second level second pad semiconductor material 242. Then, second level first metal-semiconductor compound region 252 is formed on and/or in the second level first pad semiconductor material 240, and second level second metal-semiconductor compound region 254 is formed on and/or in the second level second pad semiconductor material 242. Since the second level first pad semiconductor material 240 and the second level second pad semiconductor material 242 are physically separated, the second level first metal-semiconductor compound region 252 and the second level second metal-semiconductor compound region 254 are physically separated. As illustrated, the second level first metal-semiconductor compound region 252 and second level second metal-semiconductor compound regions 254 are formed in, and consume, less than respective entireties of the exposed portions of the second level first pad semiconductor material 240 and second level second pad semiconductor material 242 that are not under or protected by the spacers 248. In other embodiments, the second level first metal-semiconductor compound region 252 and second level second metal-semiconductor compound region 254 can be formed to a greater or lesser extent in the second level first pad semiconductor material 240 and second level second pad semiconductor material 242. The spacers 248 are then removed, such as by an etch selective to a material of the spacers 248.

Figure 22:
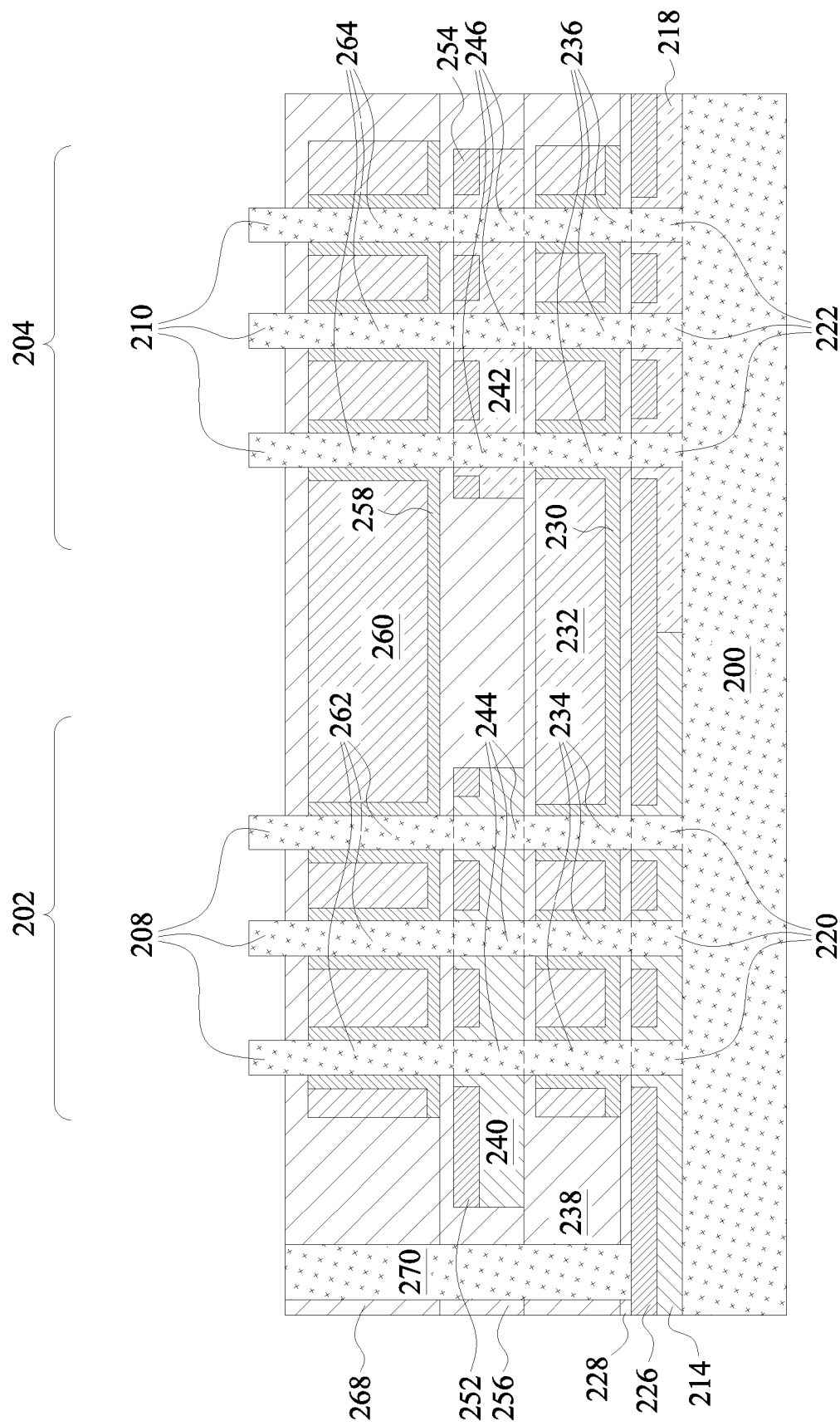

In FIG. 22, a third dielectric layer 256 is formed over the second level first metal-semiconductor compound region 252, the second level second metal-semiconductor compound region 254, and the second dielectric layer 238 and around the semiconductor posts 208 and 210. A second level gate dielectric layer 258 and second level gate electrode layer 260 are formed over the third dielectric layer 256 and around the semiconductor posts 208 and 210. The second level gate electrode layer 260 and the second level gate dielectric layer 258 define second level first channel regions 262 in the semiconductor posts 208 and define second level second channel regions 264 in the semiconductor posts 210. A fourth dielectric layer 268 is formed over the third dielectric layer 256 and the second level gate electrode layer 260 and around the semiconductor posts 208 and 210. Contact 270 is formed through the fourth dielectric layer 268, third dielectric layer 256, second dielectric layer 238, and first dielectric layer 228 to the first level metal-semiconductor compound region 226. Contact 270 is physically and electrically coupled to the first level metal-semiconductor compound region 226.

Figure 23:
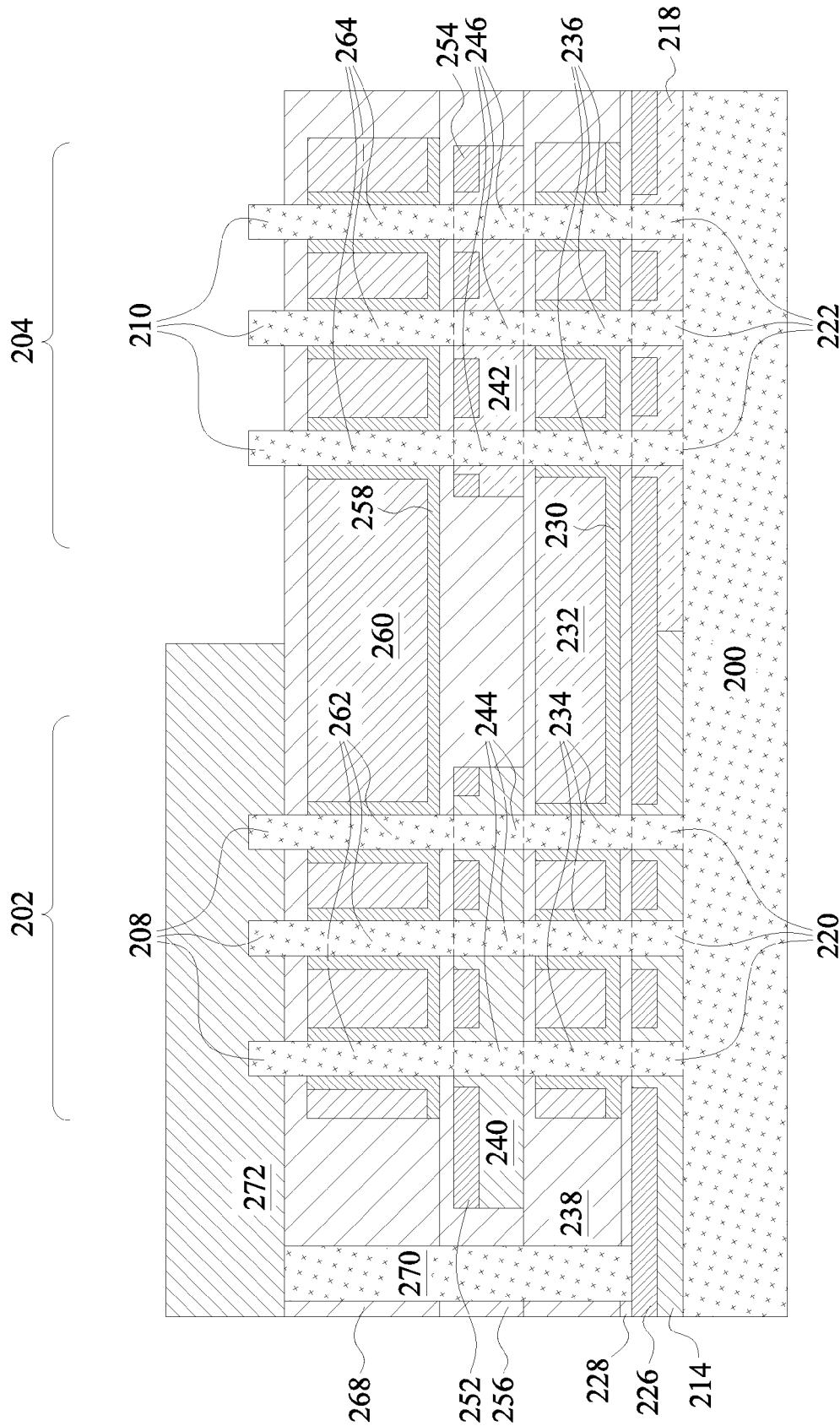

In FIG. 23, a third level first pad semiconductor material 272 is formed over the fourth dielectric layer 268 and around the semiconductor posts 208 in the first region 202. The third level first pad semiconductor material 272 can be deposited as an amorphous or polycrystalline material in the first region 202 and the second region 204 with a thickness that extends above top surfaces of the semiconductor posts 208 and 210. The third level first pad semiconductor material 272 can be any of the material and deposited by any of the processes discussed with respect to FIG. 8. The third level first pad semiconductor material 272 may then be planarized, such as by a CMP. The third level first pad semiconductor material 272 is then removed from the second region 204, such as by using an acceptable photolithography and etch process.

Figure 24:
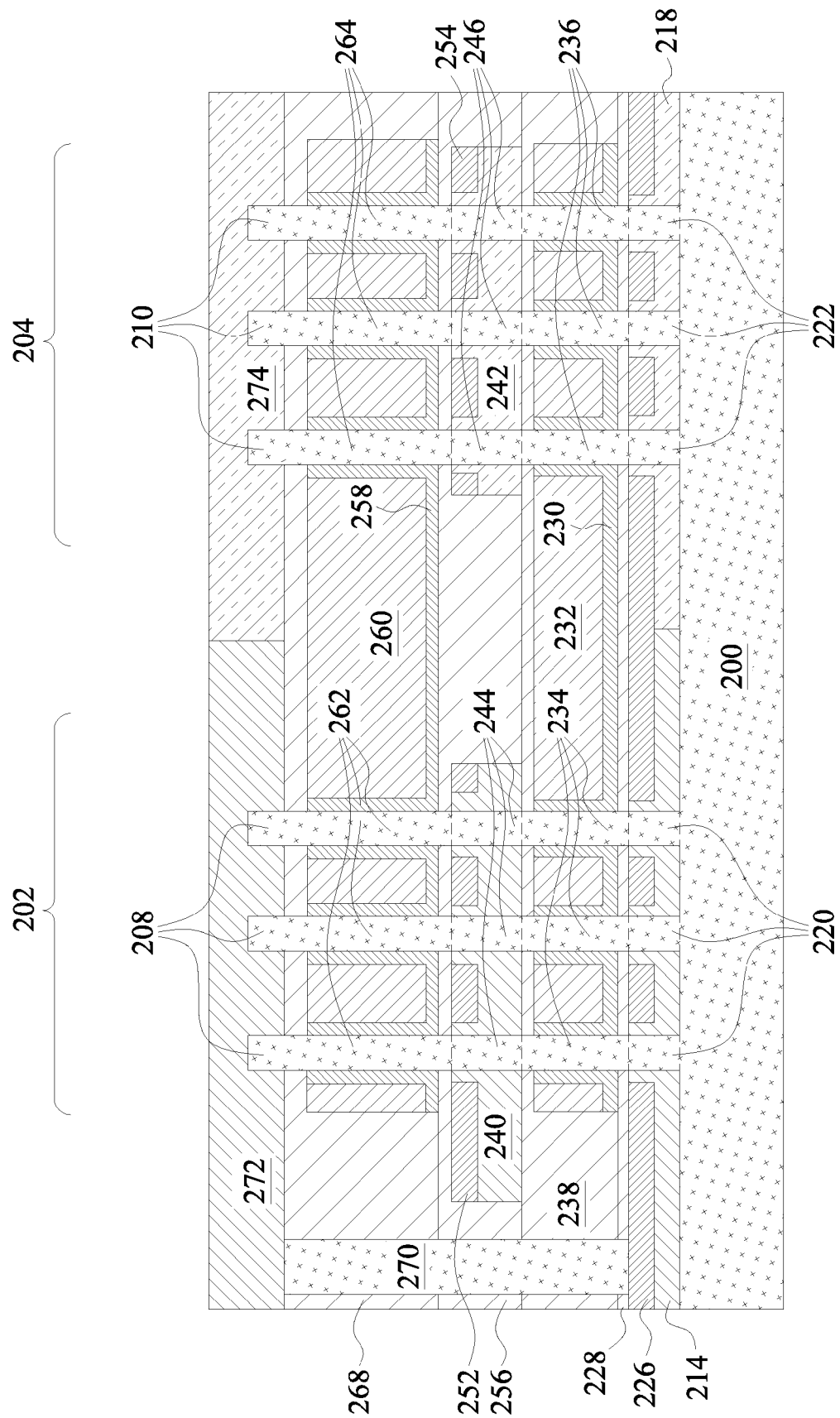

In FIG. 24, a third level second pad semiconductor material 274 is deposited over the fourth dielectric layer 268 and around the semiconductor posts 210 in the second region 204 and, possibly, on the third level first pad semiconductor material 272 in the first region 202. The third level second pad semiconductor material 274 can be deposited as an amorphous or polycrystalline material in the second region 204 with a thickness that extends above top surfaces of the semiconductor posts 210, and possibly over the third level first pad semiconductor material 272 in the first region 202. The third level second pad semiconductor material 274 can be any of the material and deposited by any of the processes discussed with respect to FIG. 8. A planarization process, such as a CMP, is then performed to form top surfaces of the third level first pad semiconductor material 272 and third level second pad semiconductor material 274 to be co-planar, which may remove any of the third level second pad semiconductor material 274 from the first region 202.

Figure 25:
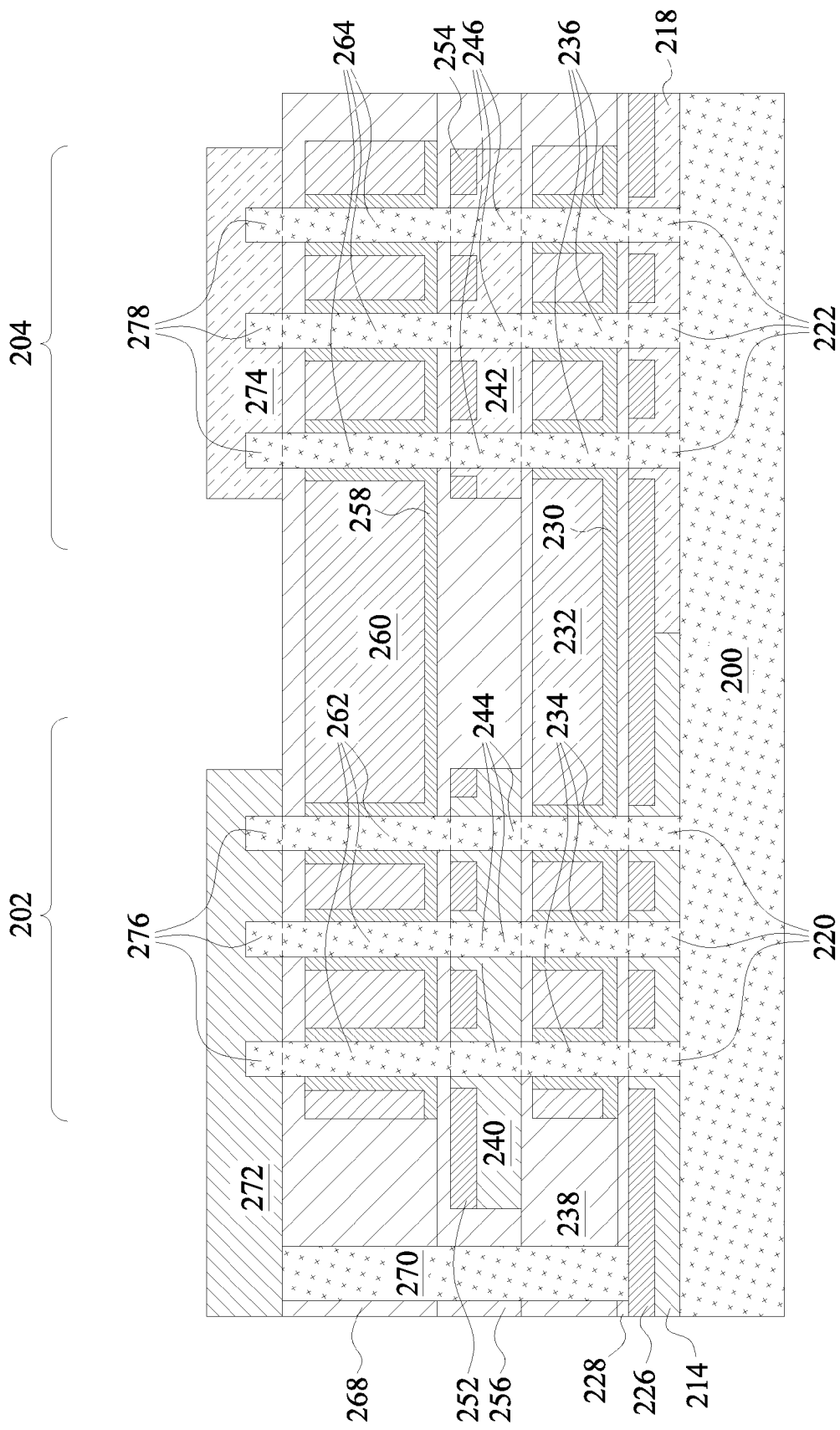

In FIG. 25, the third level first pad semiconductor material 272 and third level second pad semiconductor material 274 are then patterned, such as by using an acceptable photolithography and etching process, such as RIE or the like. The third level second pad semiconductor material 274 is physically separated from the third level first pad semiconductor material 272. The third level first pad semiconductor material 272 is on and physically and electrically coupled to the contact 270.

In some embodiments, the third level first pad semiconductor material 272 and third level second pad semiconductor material 274 are in situ doped during the deposition of the third level first pad semiconductor material 272 and third level second pad semiconductor material 274, respectively. In other embodiments, the third level first pad semiconductor material 272 and third level second pad semiconductor material 274 can be doped by an implantation process after the deposition. The third level first pad semiconductor material 272 in the first region 202 can be doped with a p-type dopant, and the dopant concentration of the third level first pad semiconductor material 272 can be in a range from about $1\times10^{20}$ cm$^{-3}$ to about $2\times10^{21}$ cm$^{-3}$. The third level second pad semiconductor material 274 in the second region 204 can be doped with an n-type dopant, and the dopant concentration of the third level second pad semiconductor material 274 can be in a range from about $1\times10^{20}$ cm$^{-3}$ to about $2\times10^{21}$ cm$^{-3}$.

The structure can then be annealed to diffuse dopants into third level first source/drain regions 276 of the semiconductor posts 208 in the first region 202 and to diffuse dopants into third level second source/drain regions 278 of the semiconductor posts 210 in the second region 204. The third level first source/drain regions 276 can be doped with a p-type dopant diffused from the third level first pad semiconductor material 272, and the third level second source/drain regions 278 can be doped with an n-type dopant diffused from the third level second pad semiconductor material 274. The anneal can be at a temperature in a range from about 800° C. to about 1100° C. and for a duration in a range from about 3600 seconds to about 1 millisecond, respectively. The dopant concentration of the third level first source/drain regions 276 and the third level second source/drain regions 278 after the anneal can be in a range from about $5\times10^{19}$ cm$^{-3}$ to about $1\times10^{21}$ cm$^{-3}$.

Figure 26:
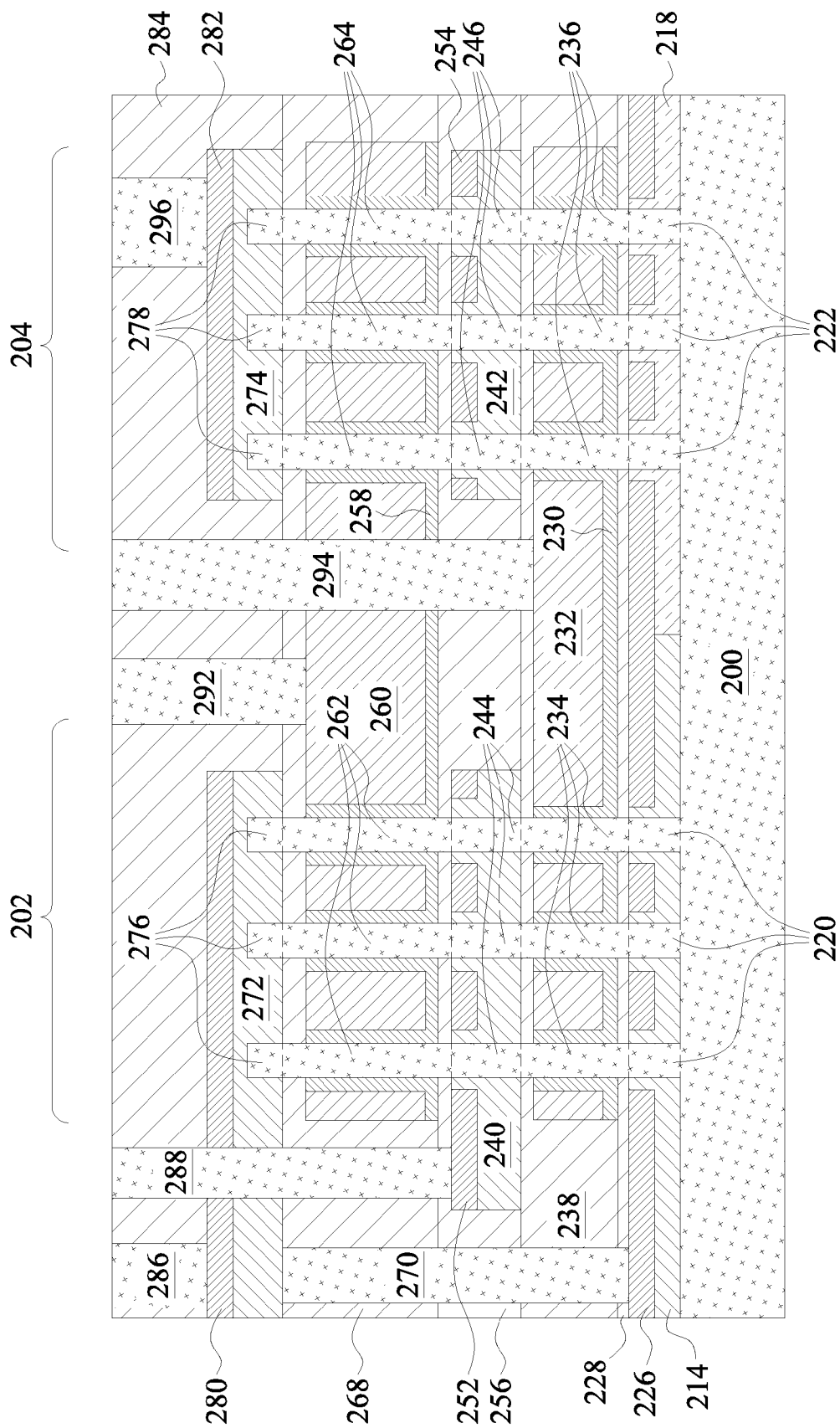
Figure 27:
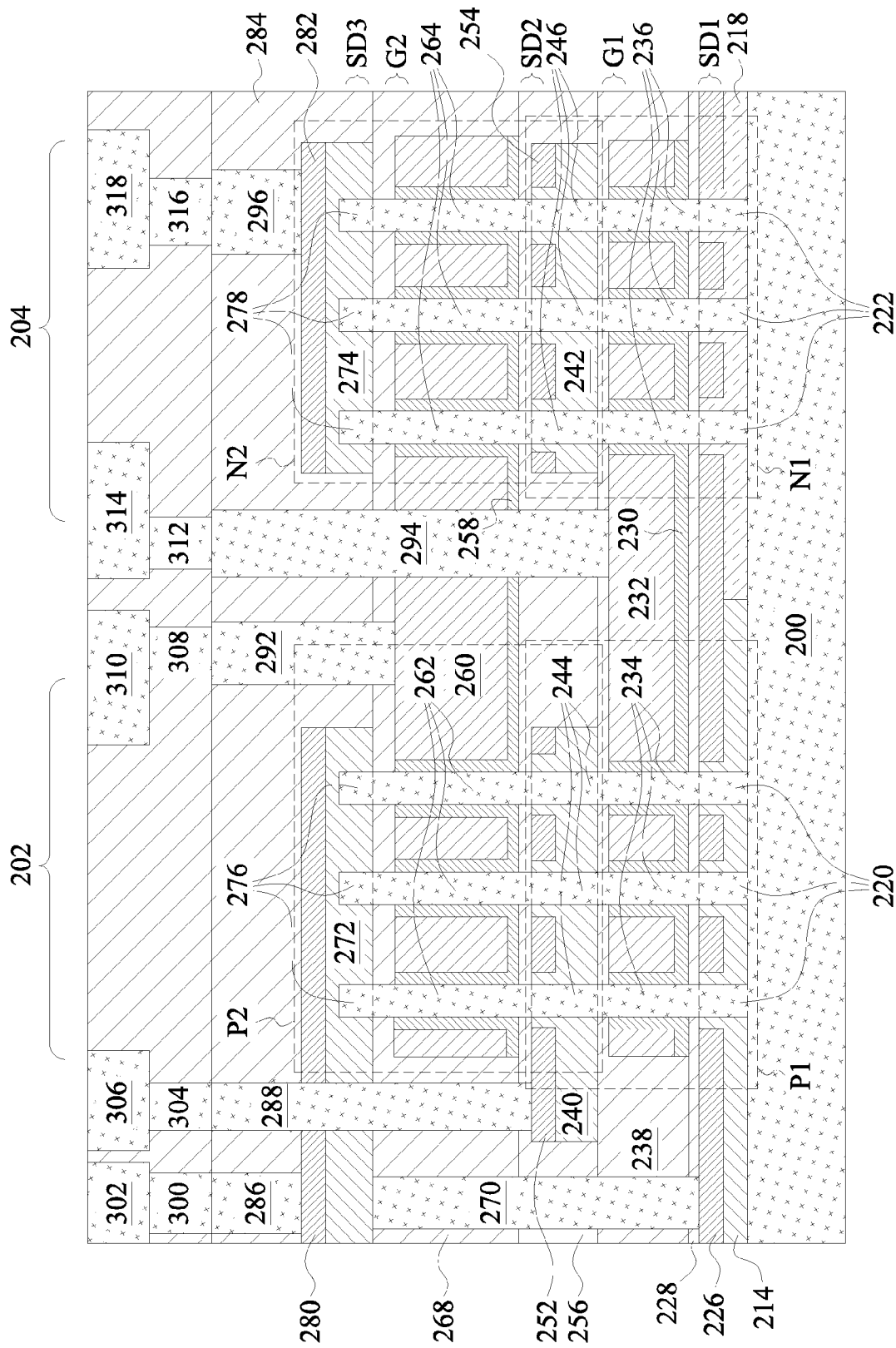
Figure 28A:
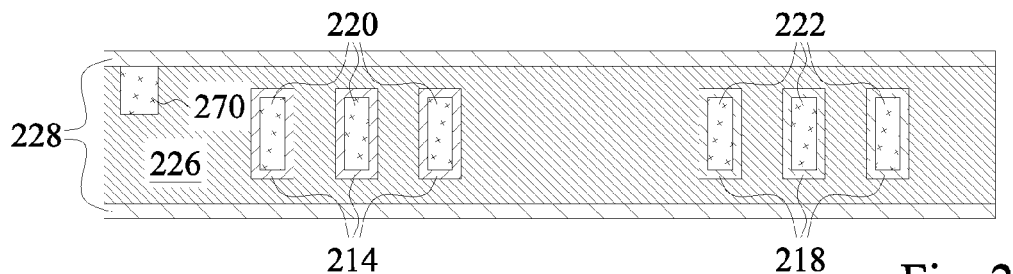
FIGS. 28A through 28E are overlaid layouts of various levels of the structure illustrated in FIG. 27 in accordance with some embodiments.
Figure 28B:
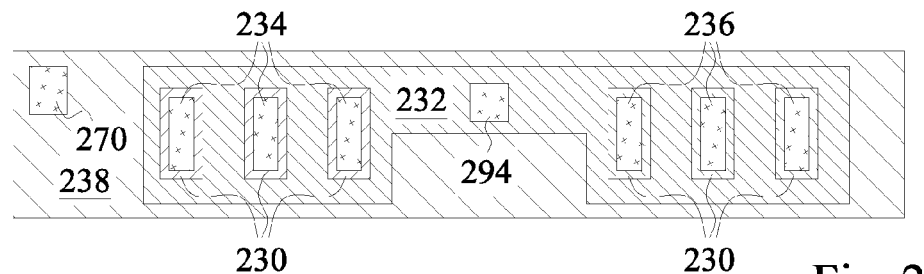
Figure 28C:
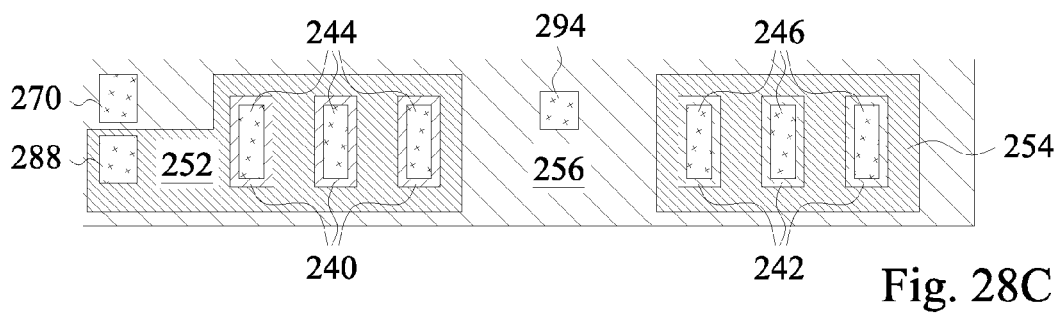
Figure 28D:
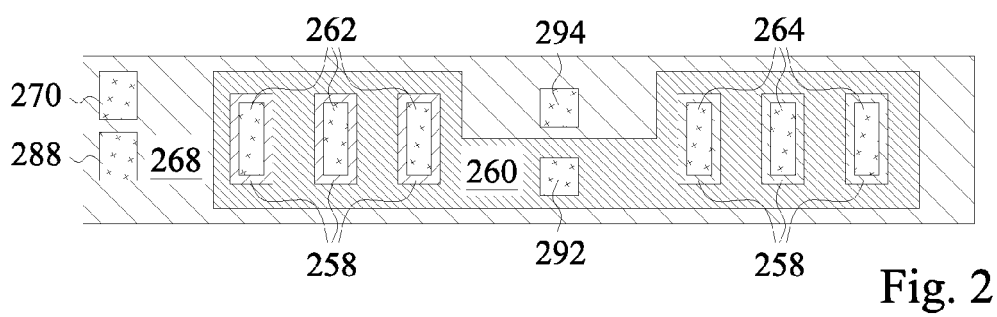
Figure 28E:
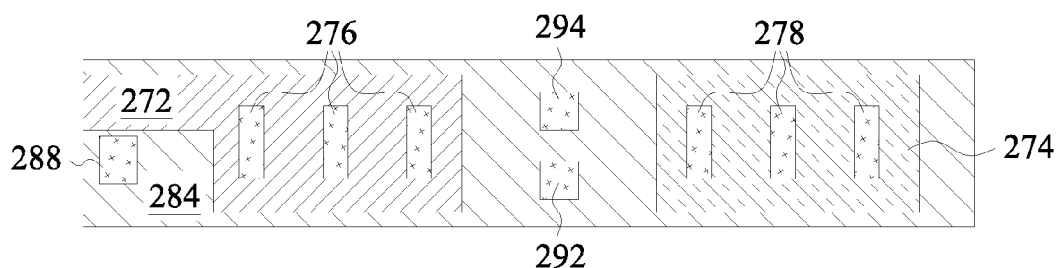

In FIG. 26, third level first metal-semiconductor compound region 280 is formed on and/or in third level first pad semiconductor material 272, and third level second metal-semiconductor compound region 282 is formed on and/or in third level second pad semiconductor material 274. As illustrated, the third level first metal-semiconductor compound region 280 and third level second metal-semiconductor compound region 282 are formed in, and consume, less than respective entireties of the third level first pad semiconductor material 272 and third level second pad semiconductor material 274. In other embodiments, the third level first metal-semiconductor compound region 280 and third level second metal-semiconductor compound region 282 can be formed to a greater or lesser extent in the third level first pad semiconductor material 272 and third level second pad semiconductor material 274.

Then, a fifth dielectric layer 284 is formed over the fourth dielectric layer 268 and the third level first metal-semiconductor compound region 280 and third level second metal-semiconductor compound region 282, and contacts 286, 288, 290, 292, 294, and 296 are formed through various dielectric layers to various components. Contact 286 extends through the fifth dielectric layer 284 and is physically and electrically coupled to the third level first metal-semiconductor compound region 280. Contact 288 extends through the fifth dielectric layer 284, fourth dielectric layer 268, and third dielectric layer 256 and is physically and electrically coupled to the second level first metal-semiconductor compound region 252. Contact 292 extends through the fifth dielectric layer 284 and fourth dielectric layer 268 and is physically and electrically coupled to the second level gate electrode layer 260. Contact 294 extends through the fifth dielectric layer 284, fourth dielectric layer 268, third dielectric layer 256, and second dielectric layer 238 and is physically and electrically coupled to the first level gate electrode layer 232. Contact 296 extends through the fifth dielectric layer 284 and is physically and electrically coupled to the third level second metal-semiconductor compound region 282.

Although contact 288 appears to be extending through the third level first metal-semiconductor compound region 280 and third level first pad semiconductor material 272, the contact 288 is not electrically coupled to the third level first metal-semiconductor compound region 280 and third level first pad semiconductor material 272; rather, the contact 288 is overlaid in the view of FIG. 26 to depict other aspects. Similarly, although contact 294 appears to be extending through the second level gate dielectric layer 258 and the second level gate electrode layer 260, the contact 294 is not electrically coupled to the second level gate dielectric layer 258 and the second level gate electrode layer 260; rather, the contact 294 is overlaid in the view of FIG. 26 to depict other aspects. The location of contacts 288 and 294 will become more apparent in FIGS. 28A through 28E.

In FIG. 27, a sixth dielectric layer 298 is formed over the fifth dielectric layer 284 and with metallizations 302, 306, 310, 314, 318, and 322 with vias 300, 304, 308, 312, 316, and 320, respectively. Via 300 is physically and electrically coupled between contact 286 and metallization 302. Via 304 is physically and electrically coupled between contact 288 and metallization 306. Via 308 is physically and electrically coupled between contact 292 and metallization 310. Via 312 is physically and electrically coupled between contact 294 and metallization 314. Via 316 is physically and electrically coupled between contact 296 and metallization 318.

FIG. 27 illustrates a stacked device that includes a first p-type device P1 and a second p-type device P2 in the first region 202, and a first n-type device N1 and a second n-type device N2 in the second region 204. The first p-type device P1 is, in this example, a VGAA PFET that includes the first level first source/drain regions 220, the first level first channel regions 234, the second level first source/drain regions 244, the first level gate dielectric layer 230, and the first level gate electrode layer 232. The second p-type device P2 is, in this example, a VGAA PFET that is over the first p-type device P1 and that includes the second level first source/drain regions 244, the second level first channel regions 262, the third level first source/drain regions 276, the second level gate dielectric layer 258, and the second level gate electrode layer 260. The first n-type device N1 is, in this example, a VGAA NFET that includes the first level second source/drain regions 222, the first level second channel regions 236, the second level second source/drain regions 246, the first level gate dielectric layer 230, and the first level gate electrode layer 232. The second n-type device N2 is, in this example, a VGAA NFET that is over the first n-type device N1 and that includes the second level second source/drain regions 246, the second level second channel regions 264, the third level second source/drain regions 278, the second level gate dielectric layer 258, and the second level gate electrode layer 260.

The devices P1, P2, N1, and N2 can have more or fewer semiconductor posts 208 and 210 than what is illustrated in FIG. 27. For example, the devices P1, P2, N1, and N2 can have one semiconductor post 208 and 210, two semiconductor posts 208 and 210, four semiconductor posts 208 and 210, etc. Further, and as will be illustrated later, the first devices P1 and/or N1 can have a different number of semiconductor posts 208 and/or 210 than the respective second devices P2 and/or N2.

FIG. 27 further illustrates a first level source/drain SD1, a first level gate G1, a second level source/drain SD2, a second level gate G2, and a third level source/drain SD3. The first level source/drain SD1 is shown in an overlaid layout view in FIG. 28A. The first level gate G1 is shown in an overlaid layout view in FIG. 28B. The second level source/drain SD2 is shown in an overlaid layout view in FIG. 28C. The second level gate G2 is shown in an overlaid layout view in FIG. 28D. The third level source/drain SD3 is shown in an overlaid layout view in FIG. 28E.

FIG. 29 illustrates a circuit schematic of the structure shown in FIG. 27, which may be a two-input NAND gate. Components in the circuit schematic of FIG. 29 are labeled with reference characters corresponding to the structure in FIG. 27. Node 252/240 can be a first power supply node, such as a VDD node, and node 282/274 can be a second power supply node, such as a VSS node. Node 280/272/270/226/214/218 is an output node of the NAND gate circuit. Node 260 is a first input, and node 232 is a second input. As shown, the first and second p-type devices P1 and P2 are in parallel, and the first and second n-type devices N1 and N2 are in series. The parallel coupled p-type devices P1 and P2 are connected to the serially connected n-type devices N1 and N2 at the output node.

Figure 31:
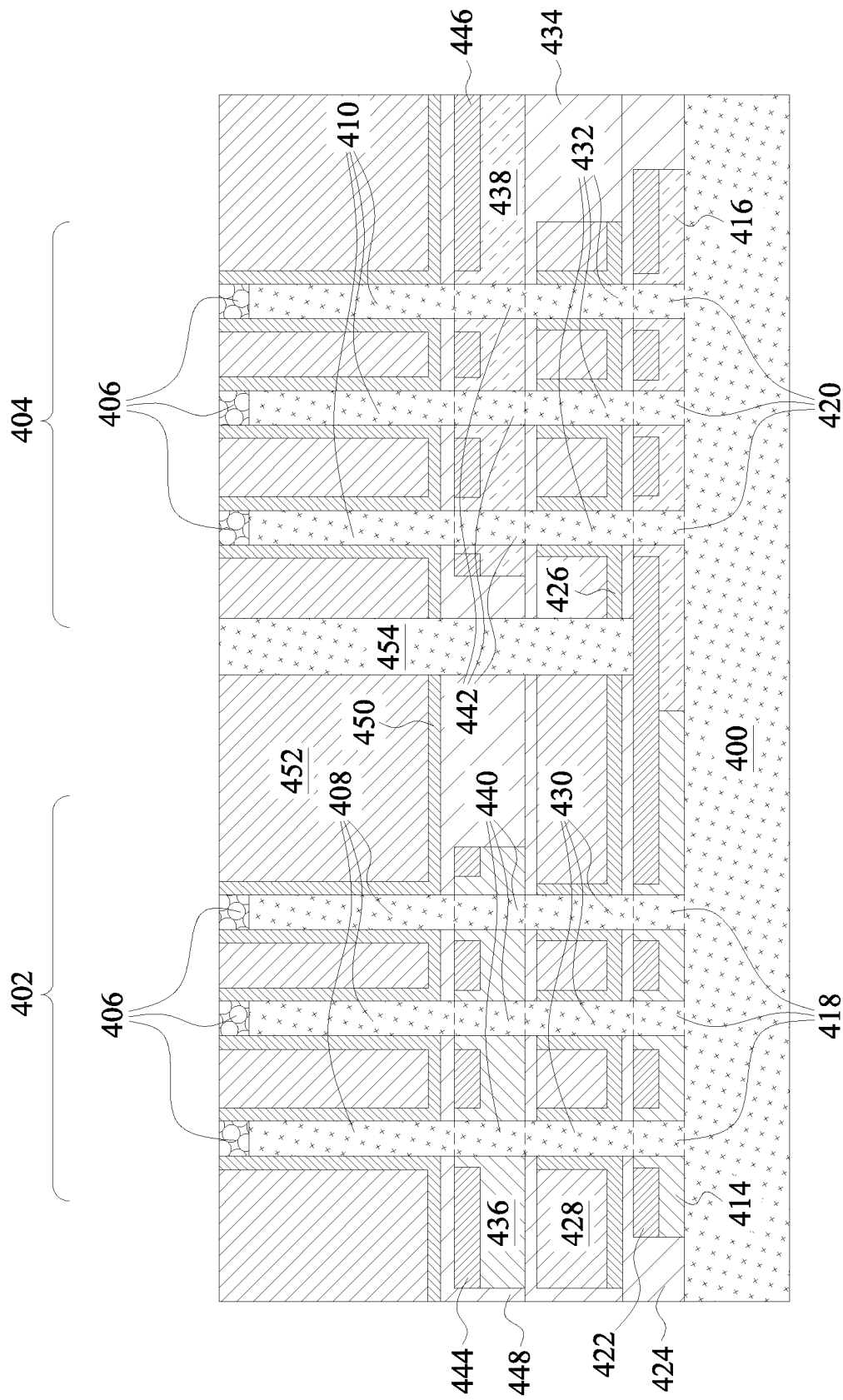
Figure 32:
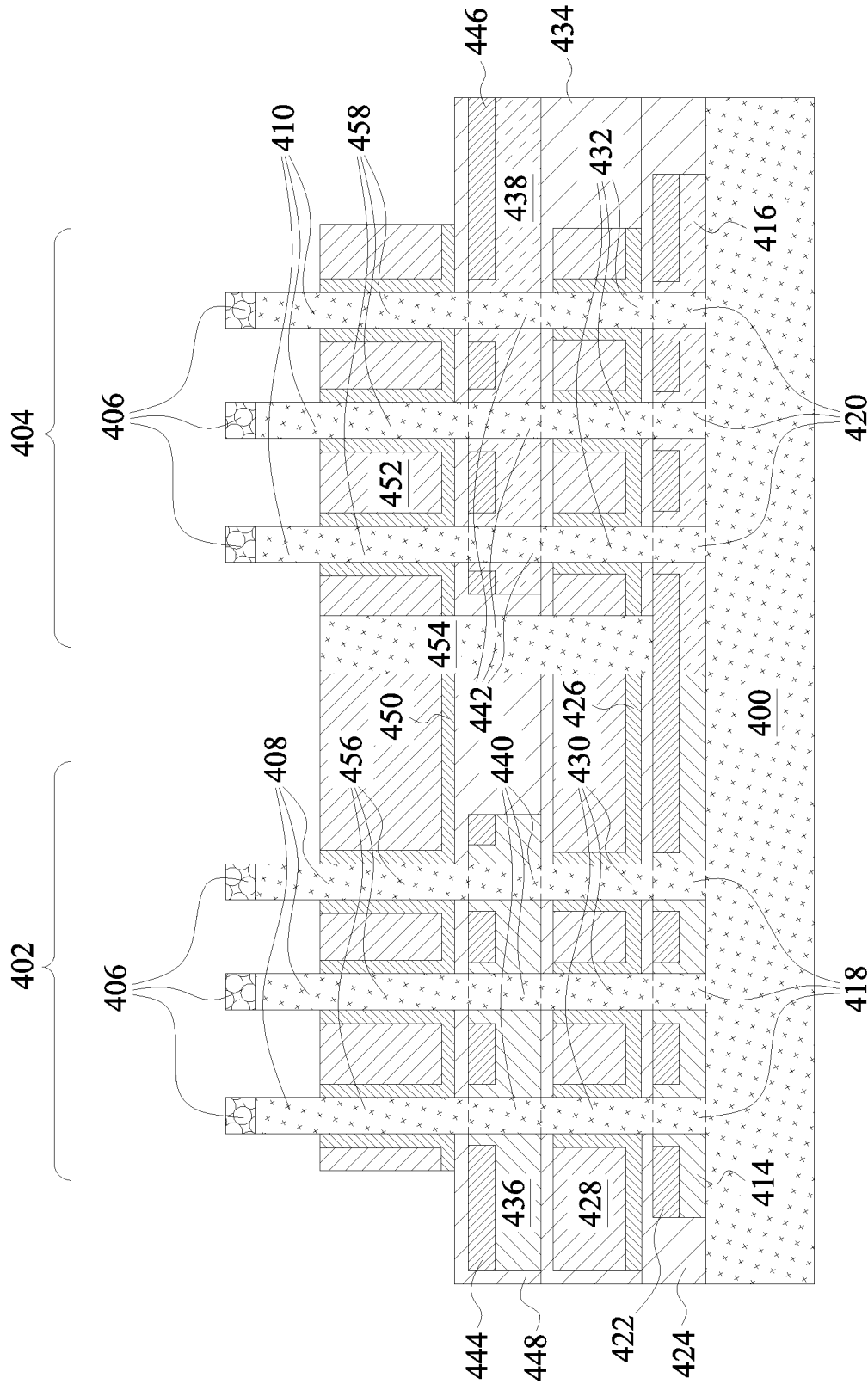
Figure 33:
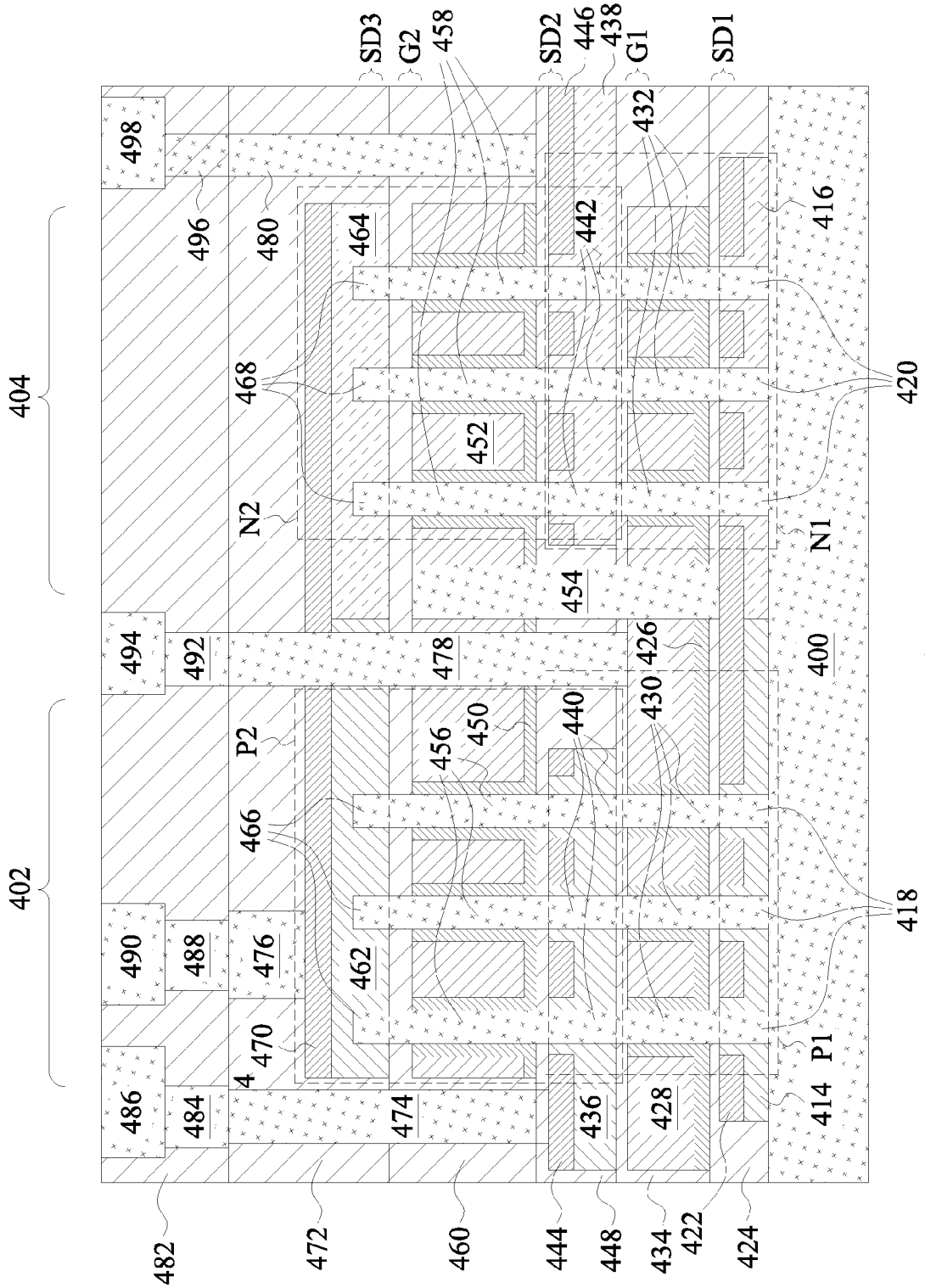
Figure 34A:
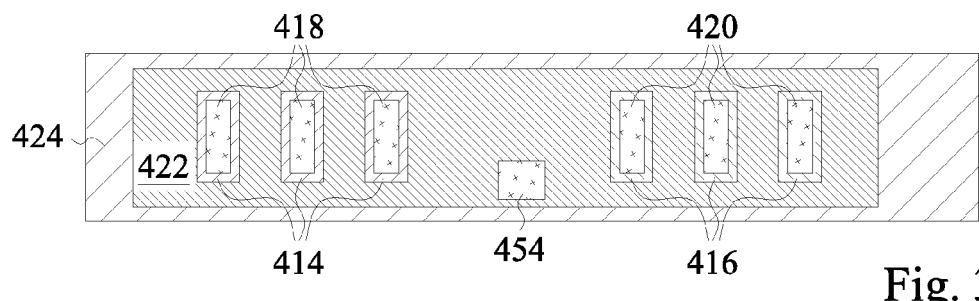
FIGS. 34A through 34E are overlaid layouts of various levels of the structure illustrated in FIG. 33 in accordance with some embodiments.
Figure 34B:
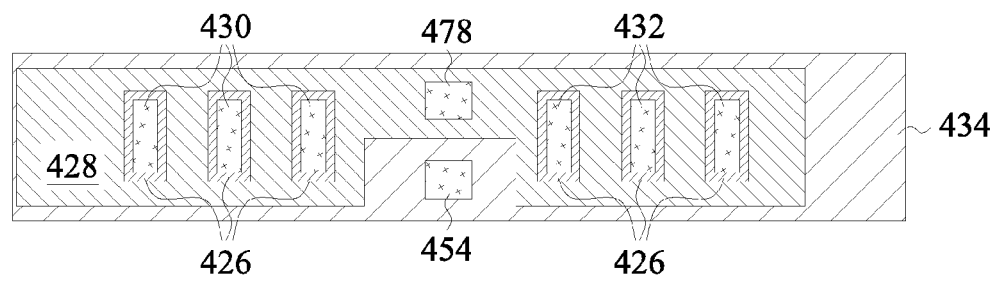
Figure 34C:
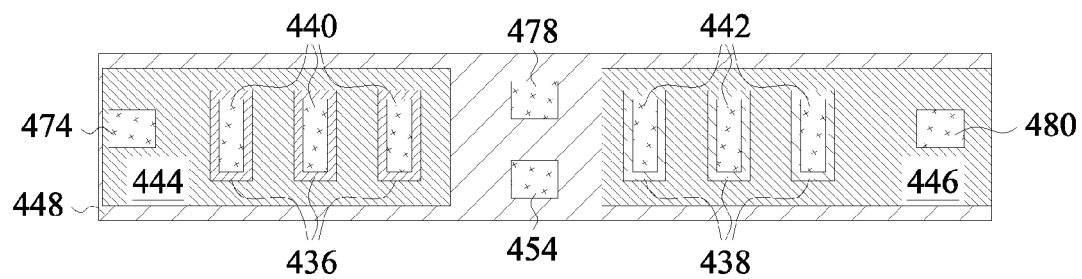
Figure 34D:
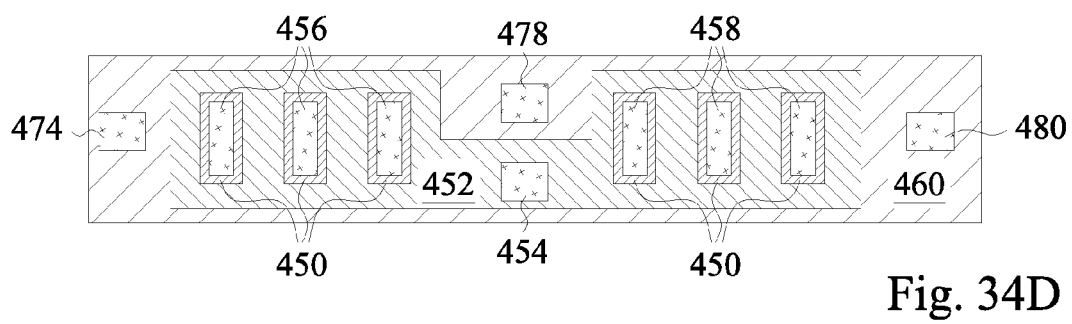
Figure 34E:
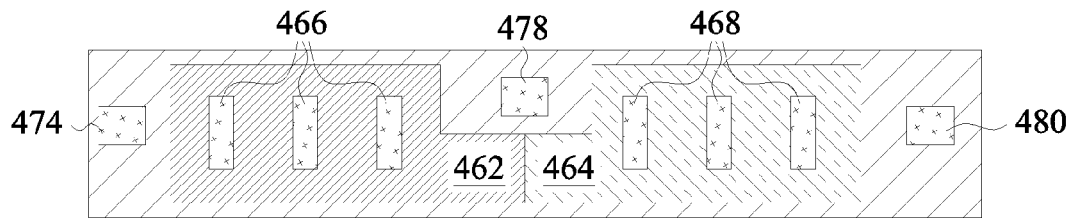
Figure 35:
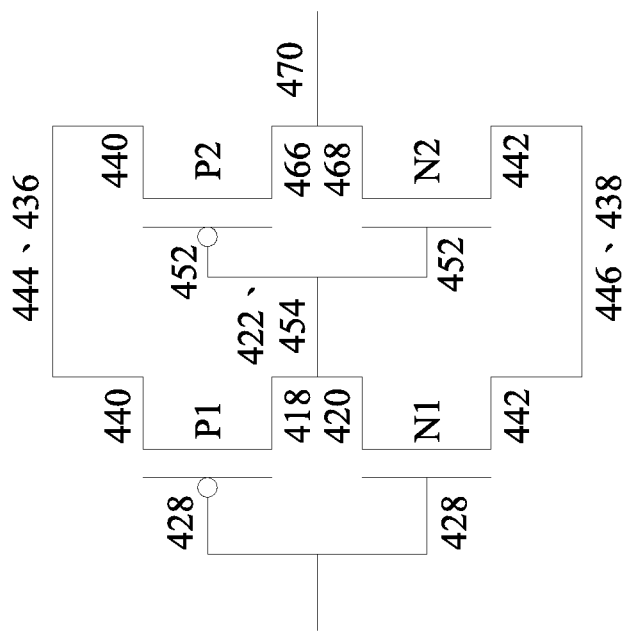
FIG. 35 is a circuit diagram of the circuit formed by the structure of FIG. 33 in accordance with some embodiments.

FIGS. 30 through 33 illustrate cross sectional views of intermediate steps during a process for forming stacked VGAA device structures in accordance with some embodiments. FIGS. 34A through 34E are overlaid layouts of various levels of the structure illustrated in FIG. 33, and FIG. 35 is a circuit diagram of the circuit formed by the structure of FIG. 33. The circuit formed by the structure in FIG. 33 is a buffer circuit, as discussed in further detail below. Much of the processing in FIGS. 30 through 33 is the same or similar to processing described in FIGS. 1 through 10 and/or 13 through 27 such that much of the description will be omitted for brevity.

Figure 30:
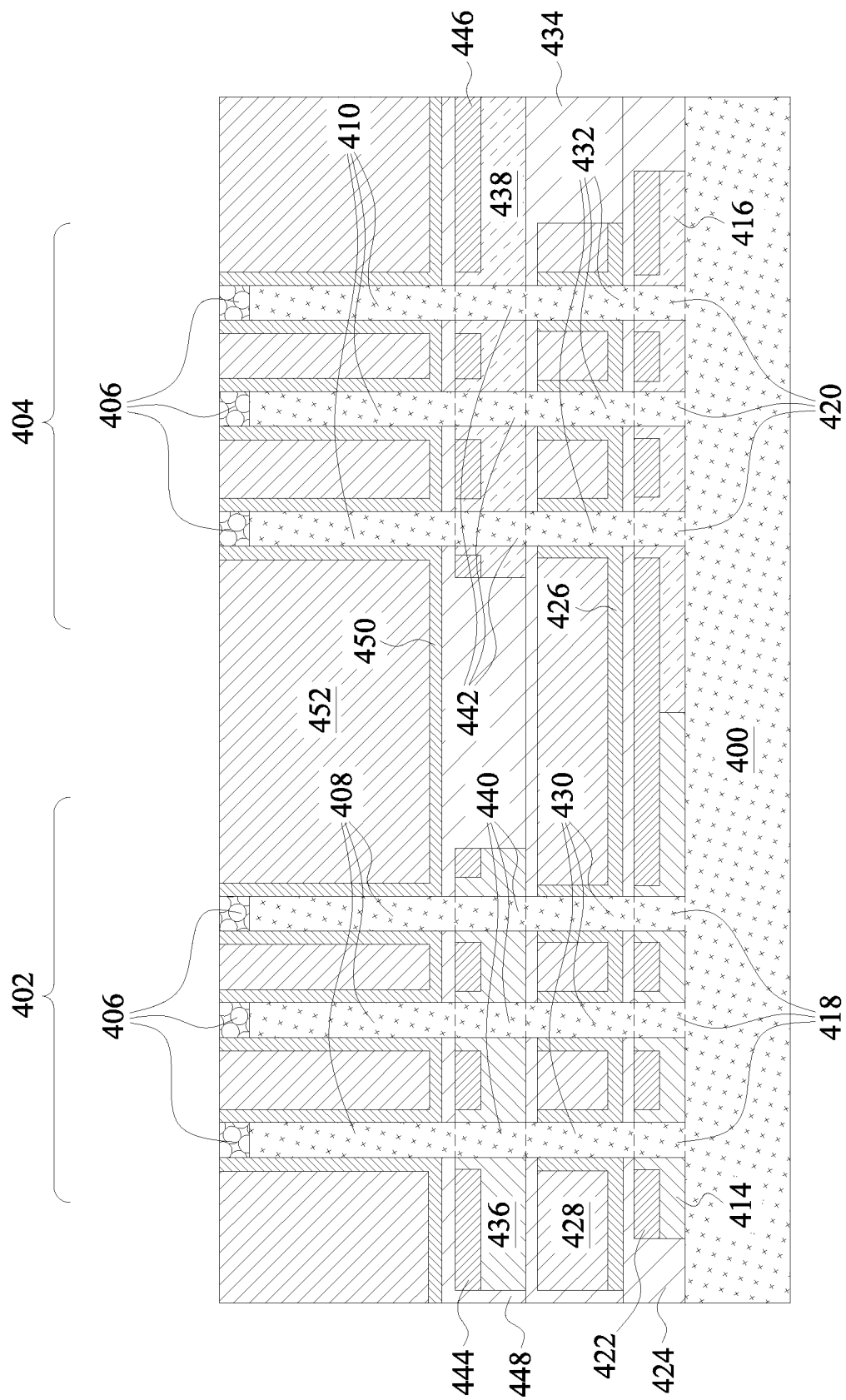
FIGS. 30 through 33 are cross sectional views of intermediate steps during a process for forming stacked VGAA device structures in accordance with some embodiments.

Referring to FIG. 30, semiconductor posts 408 and 410 are formed on a substrate 400 using mask caps 406 as a mask. The substrate 400 has a first region 402, such as a p-type device region, and a second region 404, such as an n-type device region. Although not specifically illustrated, the substrate 400 can include an n doped well in the first region 402 and a p doped well in the second region 404. The dopants of the respective doped wells can be the dopants previously discussed, and a concentration of the dopant in the respective doped wells can be in a range from about $1 \times 10^{12}$ cm$^{-3}$ to about $5 \times 10^{13}$ cm$^{-3}$. The first region 402 includes semiconductor posts 408 formed in the n doped well in the substrate 400, and the second region 404 includes semiconductor posts 410 formed in the p doped well in the substrate 400.

First level first pad semiconductor material 414 is formed on the substrate 400 in the first region 402, and first level second pad semiconductor material 416 is formed on the substrate 400 in the second region 404. The first level first pad semiconductor material 414 in the first region 402 can be doped with a p-type dopant, and the dopant concentration of the first level first pad semiconductor material 414 can be in a range from about $1 \times 10^{20}$ cm$^{-3}$ to about $2 \times 10^{21}$ cm$^{-3}$. The first level second pad semiconductor material 416 in the second region 404 can be doped with an n-type dopant, and the dopant concentration of the first level second pad semiconductor material 416 can be in a range from about $1 \times 10^{20}$ cm$^{-3}$ to about $2 \times 10^{21}$ cm$^{-3}$. First level first source/drain regions 418 are formed in the semiconductor posts 408, and first level second source/drain regions 420 are formed in the semiconductor posts 410. The first level first source/drain regions 418 can be doped with a p-type dopant, and the first level second source/drain regions 420 can be doped with an n-type dopant. The dopant concentration of the first level first source/drain regions 418 and first level second source/drain regions 420 can be in a range from about $5 \times 10^{19}$ cm$^{-3}$ to about $1 \times 10^{21}$ cm$^{-3}$.

Then, a first level metal-semiconductor compound region 422 is formed on and/or in the first level first pad semiconductor material 414 and first level second pad semiconductor material 416. The first level metal-semiconductor compound region 422 electrically couples the first level first source/drain regions 418 to the first level second source/drain regions 420 without a p-n junction being formed in the flow of current therebetween. The first level metal-semiconductor compound region 422 can be formed to a greater or lesser extent in the first level first pad semiconductor material 414 and first level second pad semiconductor material 416 and/or substrate 400.

Then, a first dielectric layer 424 is formed over the first level metal-semiconductor compound region 422 and around the semiconductor posts 408 and 410. A first level gate dielectric layer 426 and first level gate electrode layer 428 are formed over the first dielectric layer 424 and around the semiconductor posts 408 and 410. The first level gate electrode layer 428 and the first level gate dielectric layer 426 define first level first channel regions 430 in the semiconductor posts 408 and define first level second channel regions 432 in the semiconductor posts 410. A second dielectric layer 434 is formed over the first dielectric layer 424 and the first level gate electrode layer 428 and around the semiconductor posts 408 and 410.

Second level first pad semiconductor material 436 is formed over the second dielectric layer 434 and around the semiconductor posts 408 in the first region 402, and second level second pad semiconductor material 438 is formed over the second dielectric layer 434 and around the semiconductor posts 410 in the second region 404. The second level first pad semiconductor material 436 is physically separated from the second level second pad semiconductor material 438. The second level first pad semiconductor material 436 in the first region 402 can be doped with a p-type dopant, and the dopant concentration of the second level first pad semiconductor material 436 can be in a range from about $1\times10^{20}$ $cm^{-3}$ to about $2\times10^{21}$ $cm^{-3}$. The second level second pad semiconductor material 438 in the second region 404 can be doped with an n-type dopant, and the dopant concentration of the second level second pad semiconductor material 438 can be in a range from about $1\times10^{20}$ $cm^{-3}$ to about $2\times10^{21}$ $cm^{-3}$. Second level first source/drain regions 440 are formed in the semiconductor posts 408, and second level second source/drain regions 442 are formed in the semiconductor posts 410. The second level first source/drain regions 440 can be doped with a p-type dopant, and the second level second source/drain regions 442 can be doped with an n-type dopant. The dopant concentration of the second level first source/drain regions 440 and second level second source/drain regions 4442 can be in a range from about $5\times10^{19}$ $cm^{-3}$ to about $1\times10^{21}$ $cm^{-3}$.

Then, second level first metal-semiconductor compound region 444 is formed on and/or in the second level first pad semiconductor material 436, and second level second metal-semiconductor compound region 446 is formed on and/or in the second level second pad semiconductor material 438. Since the second level first pad semiconductor material 436 and the second level second pad semiconductor material 438 are physically separated, the second level first metal-semiconductor compound region 444 and the second level second metal-semiconductor compound region 446 are physically separated. The second level first metal-semiconductor compound region 444 and second level second metal-semiconductor compound region 446 can be formed to a greater or lesser extent in the second level first pad semiconductor material 436 and second level second pad semiconductor material 438, respectively. Next, a third dielectric layer 448 is formed over the second level first metal-semiconductor compound region 444, second level second metal-semiconductor compound region 446, and the second dielectric layer 434 and around the semiconductor posts 408 and 410.

A second level gate dielectric layer 450 and second level gate electrode layer 452 are formed over the third dielectric layer 448 and around the semiconductor posts 408 and 410. Second level gate dielectric layer 450 is deposited conformally on the semiconductor posts 408 and 410, such as over the top surfaces of the mask caps 406 and along the sidewalls of the semiconductor posts 408 and 410, and over the third dielectric layer 448. Next, second level gate electrode layer 452 is deposited over second level gate dielectric layer 450. In some embodiments, the second level gate electrode layer 452 is deposited with a thickness that extends above top surfaces of the mask caps 406. The deposition processes and materials of the second level gate dielectric layer 450 and second level gate electrode layer 452 may be as discussed with respect to FIG. 8. A planarization process, such as a CMP, is then performed to form top surfaces of the second level gate electrode layer 452 and second level gate dielectric layer 450 to be co-planar with top surfaces of the mask caps 406.

In FIG. 31, a contact 454 is formed through the second level gate electrode layer 452, the third dielectric layer 448, the second dielectric layer 434, and the first dielectric layer 424 to the first level metal-semiconductor compound region 422. An opening for contact 454 is formed using one or more etching steps. The opening is etched through second level gate electrode layer 452, second level gate dielectric layer 450, third dielectric layer 448, second dielectric layer 434, and first dielectric layer 424 to the first level metal-semiconductor compound region 422. The opening may be formed using acceptable photolithography and etching techniques. A liner, such as a diffusion barrier layer, an adhesion layer, or the like, and a conductive material are formed in the opening. The liner may include titanium, titanium nitride, tantalum, tantalum nitride, or the like formed by ALD, CVD, or the like. The conductive material may be copper, a copper alloy, silver, gold, tungsten, aluminum, nickel, or the like formed by ALD, CVD, PVD, or the like. A planarization process, such as a CMP, may be performed to remove excess material from top surfaces of the second level gate electrode layer 452 and mask caps 406. The remaining liner and conductive material form the contact 454 in the opening. Contact 454 is physically and electrically coupled to the second level gate electrode layer 452 and the first level metal-semiconductor compound region 422. Although contact 454 appears to be extending through the first level gate electrode layer 428, the contact 454 is not electrically coupled to the first level gate electrode layer 428; rather, the contact 454 is overlaid in the view of FIG. 31 to depict other aspects.

In FIG. 32, a controlled etch back, such as an anisotropic etch, etches the second level gate electrode layer 452 and contact 454 to an appropriate thickness. The second level gate electrode layer 452 and the second level gate dielectric layer 450 are then patterned, such as by using an acceptable photolithography and etching process, such as RIE or the like. The resulting second level gate electrode layer 452 and the second level gate dielectric layer 450 define second level first channel regions 456 in the semiconductor posts 408 and define second level second channel regions 458 in the semiconductor posts 410.

In FIG. 33, a fourth dielectric layer 460 is formed over the third dielectric layer 448 and the second level gate electrode layer 452 and around the semiconductor posts 408 and 410. Third level first pad semiconductor material 462 is formed over the fourth dielectric layer 460 and around the semiconductor posts 408 in the first region 402, and third level second pad semiconductor material 464 is formed over the fourth dielectric layer 460 and around the semiconductor posts 410 in the second region 404. The third level second pad semiconductor material 464 physically contacts the third level first pad semiconductor material 462. The third level first pad semiconductor material 462 in the first region 402 can be doped with a p-type dopant, and the dopant concentration of the third level first pad semiconductor material 462 can be in a range from about $1\times10^{20}$ $cm^{-3}$ to about $2\times10^{21}$ $cm^{-3}$. The third level second pad semiconductor material 464 in the second region 404 can be doped with an n-type dopant, and the dopant concentration of the third level second pad semiconductor material 464 can be in a range from about $1\times10^{20}$ $cm^{-3}$ to about $2\times10^{21}$ $cm^{-3}$. Third level first source/drain regions 466 are formed in the semiconductor posts 408, and third level second source/drain regions 468 are formed in the semiconductor posts 410. The third level first source/drain regions 466 can be doped with a p-type dopant, and the third level second source/drain regions 468 can be doped with an n-type dopant. The dopant concentration of the third level first source/drain regions 466 and third level second source/drain regions 468 can be in a range from about $5\times10^{19}$ $cm^{-3}$ to about $1\times10^{21}$ $cm^{-3}$.

Then, a third level metal-semiconductor compound region 470 is formed on and/or in the third level first pad semiconductor material 462 and third level second pad semiconductor material 464. The third level metal-semiconductor compound region 470 electrically couples the third level first source/drain regions 466 to the third level second source/drain regions 468 without a p-n junction being formed in the flow of current therebetween. The third level metal-semiconductor compound region 470 can be formed to a greater or lesser extent in the third level first pad semiconductor material 462 and third level second pad semiconductor material 464.

Next, a fifth dielectric layer 472 is formed over the third level metal-semiconductor compound region 470 and the fourth dielectric layer 460. Then, contacts 474, 476, 478, and 480 are formed through various dielectric layers to various components. Contact 474 extends through the fifth dielectric layer 472, fourth dielectric layer 460, and third dielectric layer 448 and is physically and electrically coupled to the second level first metal-semiconductor compound region 444. Contact 476 extends through the fifth dielectric layer 472 and is physically and electrically coupled to the third level metal-semiconductor compound region 470. Contact 478 extends through the fifth dielectric layer 472, fourth dielectric layer 460, third dielectric layer 448, and second dielectric layer 434 and is physically and electrically coupled to the first level gate electrode layer 428. Contact 480 extends through the fifth dielectric layer 472, fourth dielectric layer 460, and third dielectric layer 448 and is physically and electrically coupled to the second level second metal-semiconductor compound region 446.

Although contact 478 appears to be extending through the third level metal-semiconductor compound region 470, third level first pad semiconductor material 462, and second level gate electrode layer 452, the contact 478 is not electrically coupled to the third level metal-semiconductor compound region 470, third level first pad semiconductor material 462, and second level gate electrode layer 452; rather, the contact 478 is overlaid in the view of FIG. 33 to depict other aspects. The location of contact 478 will become more apparent in FIGS. 34A through 34E.

Further, a sixth dielectric layer 482 is formed with metallizations 486, 490, 494, and 498 with vias 484, 488, 492, and 496, respectively. Via 484 is physically and electrically coupled between contact 474 and metallization 486. Via 488 is physically and electrically coupled between contact 476 and metallization 490. Via 492 is physically and electrically coupled between contact 478 and metallization 494. Via 496 is physically and electrically coupled between contact 480 and metallization 498.

FIG. 33 illustrates a stacked device that includes a first p-type device P1 and a second p-type device P2 in the first region 402 and a first n-type device N1 and a second n-type device N2 in the second region 404. The first p-type device P1 is, in this example, a VGAA PFET that includes the first level first source/drain regions 418, the first level first channel regions 430, the second level first source/drain regions 440, the first level gate dielectric layer 426, and the first level gate electrode layer 428. The second p-type device P2 is, in this example, a VGAA PFET that is over the first p-type device P1 and that includes the second level first source/drain regions 440, the second level first channel regions 456, the third level first source/drain regions 466, the second level gate dielectric layer 450, and the second level gate electrode layer 452. The first n-type device N1 is, in this example, a VGAA NFET that includes the first level second source/drain regions 420, the first level second channel regions 432, the second level second source/drain regions 442, the first level gate dielectric layer 426, and the first level gate electrode layer 428. The second n-type device N2 is, in this example, a VGAA NFET that is over the first n-type device N1 and that includes the second level second source/drain regions 442, the second level second channel regions 458, the third level second source/drain regions 468, the second level gate dielectric layer 450, and the second level gate electrode layer 452.

The devices P1, P2, N1, and N2 can have more or fewer semiconductor posts 408 and 410 than what is illustrated in FIG. 33. For example, the devices P1, P2, N1, and N2 can have one semiconductor post 408 and 410, two semiconductor posts 408 and 410, four semiconductor posts 408 and 410, etc. Further, and as will be illustrated later, the first devices P1 and/or N1 can have a different number of semiconductor posts 408 and/or 410 than the respective second devices P2 and/or N2.

FIG. 33 further illustrates a first level source/drain SD1, a first level gate G1, a second level source/drain SD2, a second level gate G2, and a third level source/drain SD3. The first level source/drain SD1 is shown in an overlaid layout view in FIG. 34A. The first level gate G1 is shown in an overlaid layout view in FIG. 34B. The second level source/drain SD2 is shown in an overlaid layout view in FIG. 34C. The second level gate G2 is shown in an overlaid layout view in FIG. 34D. The third level source/drain SD3 is shown in an overlaid layout view in FIG. 34E.

FIG. 35 illustrates a circuit schematic of the structure shown in FIG. 33, which may be a buffer circuit. Components in the circuit schematic of FIG. 35 are labeled with reference characters corresponding to the structure in FIG. 33. Respective first source/drains of the first and second p-type devices P1 and P2 (node 440) are electrically coupled to node 444/436, which may be a first power supply node, such as a VDD node. A second source/drain of the first p-type device P1 (node 418) is electrically coupled to a first source/drain of the first n-type device P1 (node 420). The gates of the first p-type device P1 and the first n-type device N1 are coupled together at node 428, which is an input node. A second source/drain of the second p-type device P2 (node 466) is electrically coupled to a first source/drain of the second n-type device N2 (node 468) at node 470, which is an output node. The gates of the second p-type device P2 and the second n-type device N2 are coupled together (node 452) and to the second source/drain of the first n-type device N1 (node 420) and the first source/drain of the first p-type device P1 (node 418) by node 422/454. The respective second source/drains of the first and second n-type devices N1 and N2 (node 442) are electrically coupled to node 446/438, which may be a second power supply node, such as a VSS node.

Figure 36:
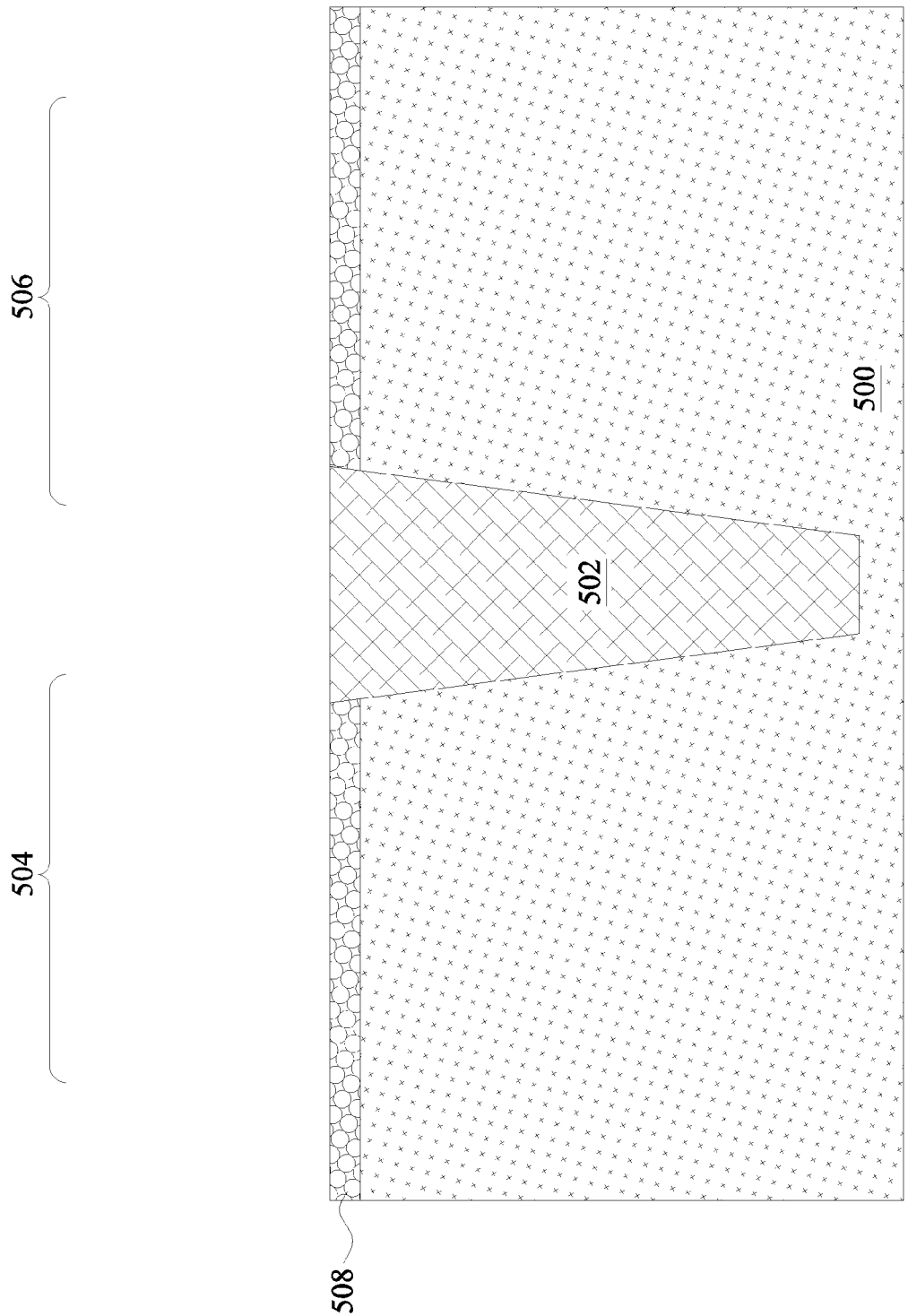
FIGS. 36, 37, 38A, and 38B are cross sectional views of intermediate steps during a process for forming stacked VGAA device structures in accordance with some embodiments.
Figure 37:
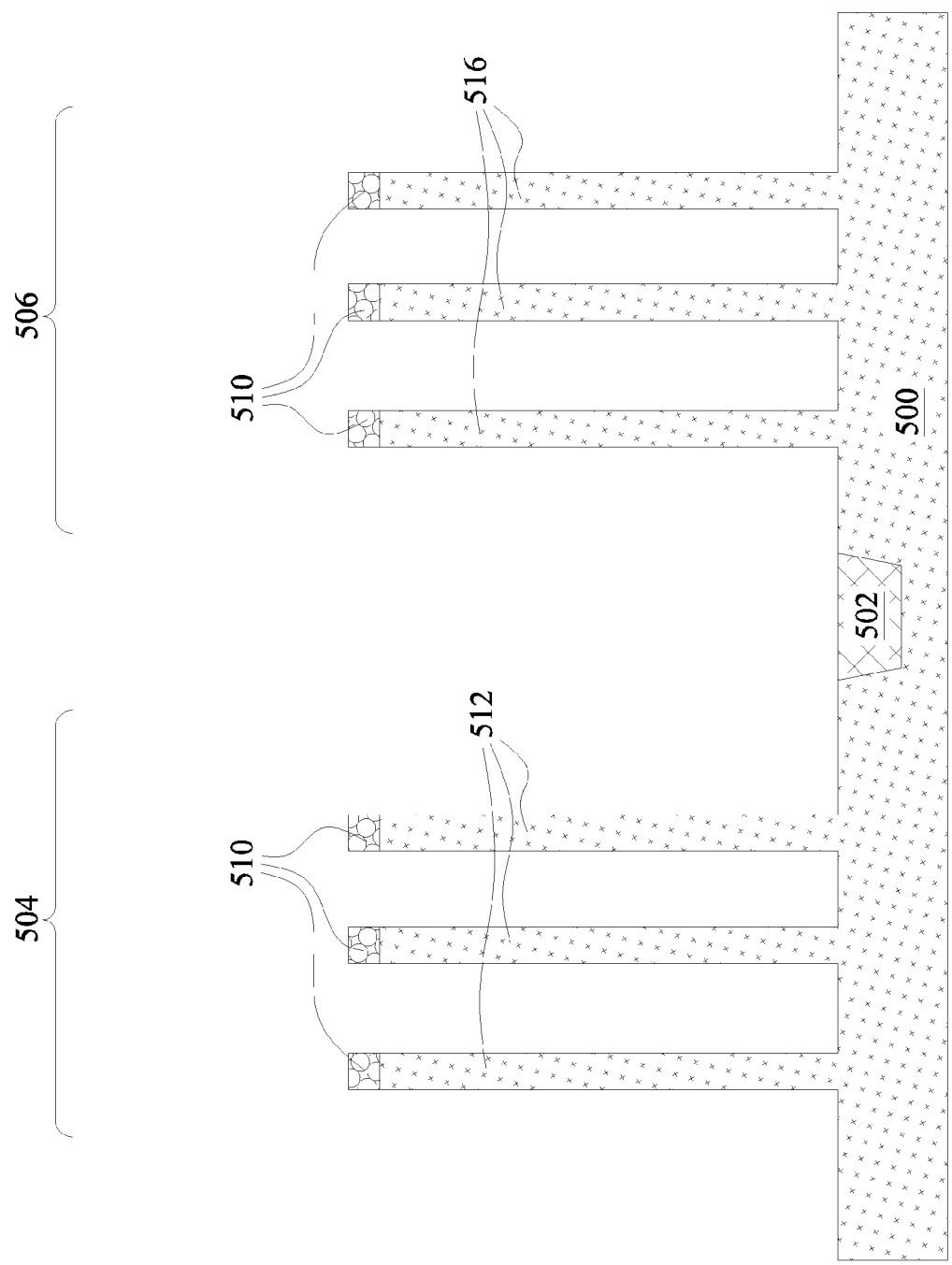
Figure 38A:
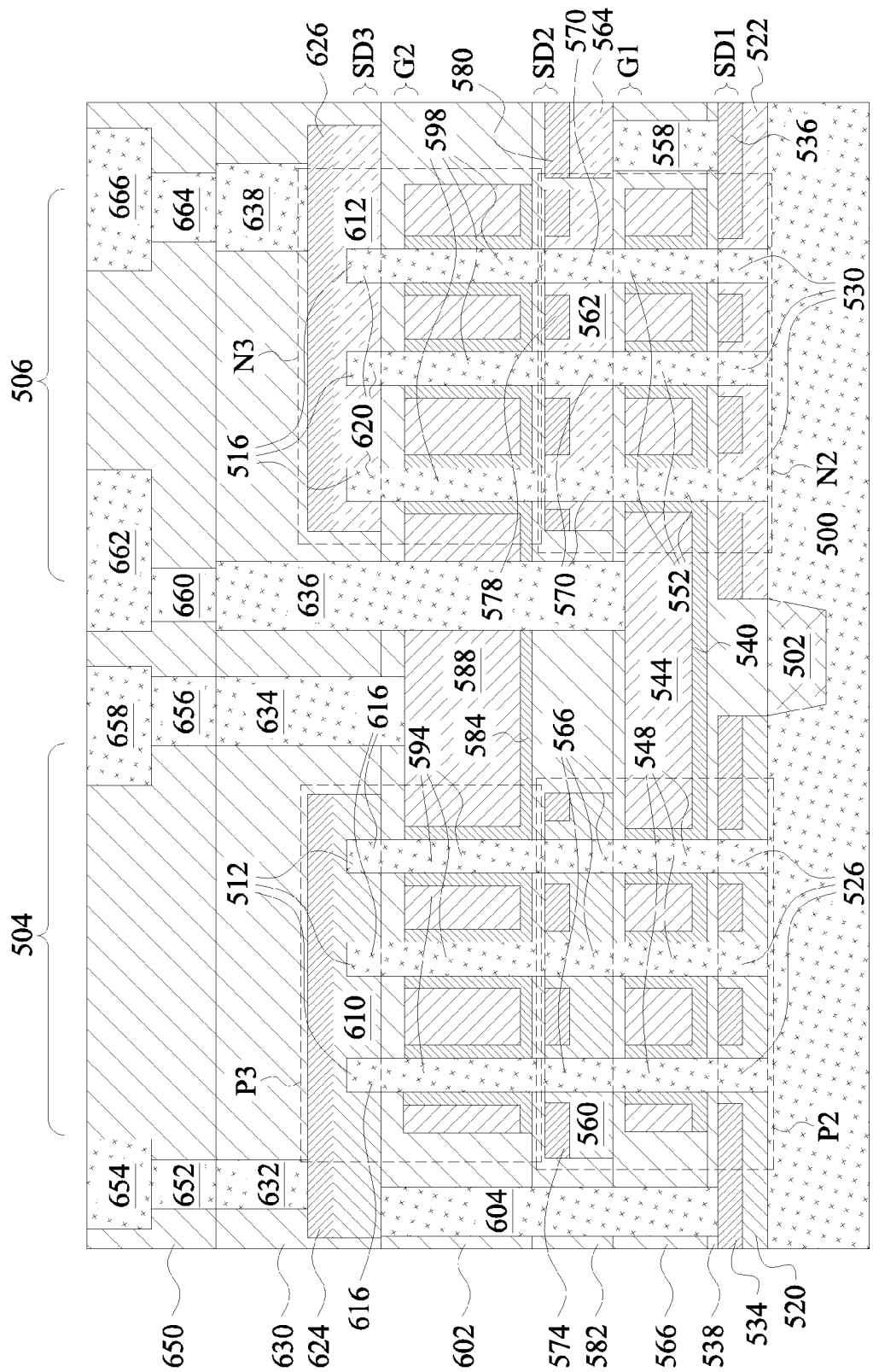
Figure 38B:
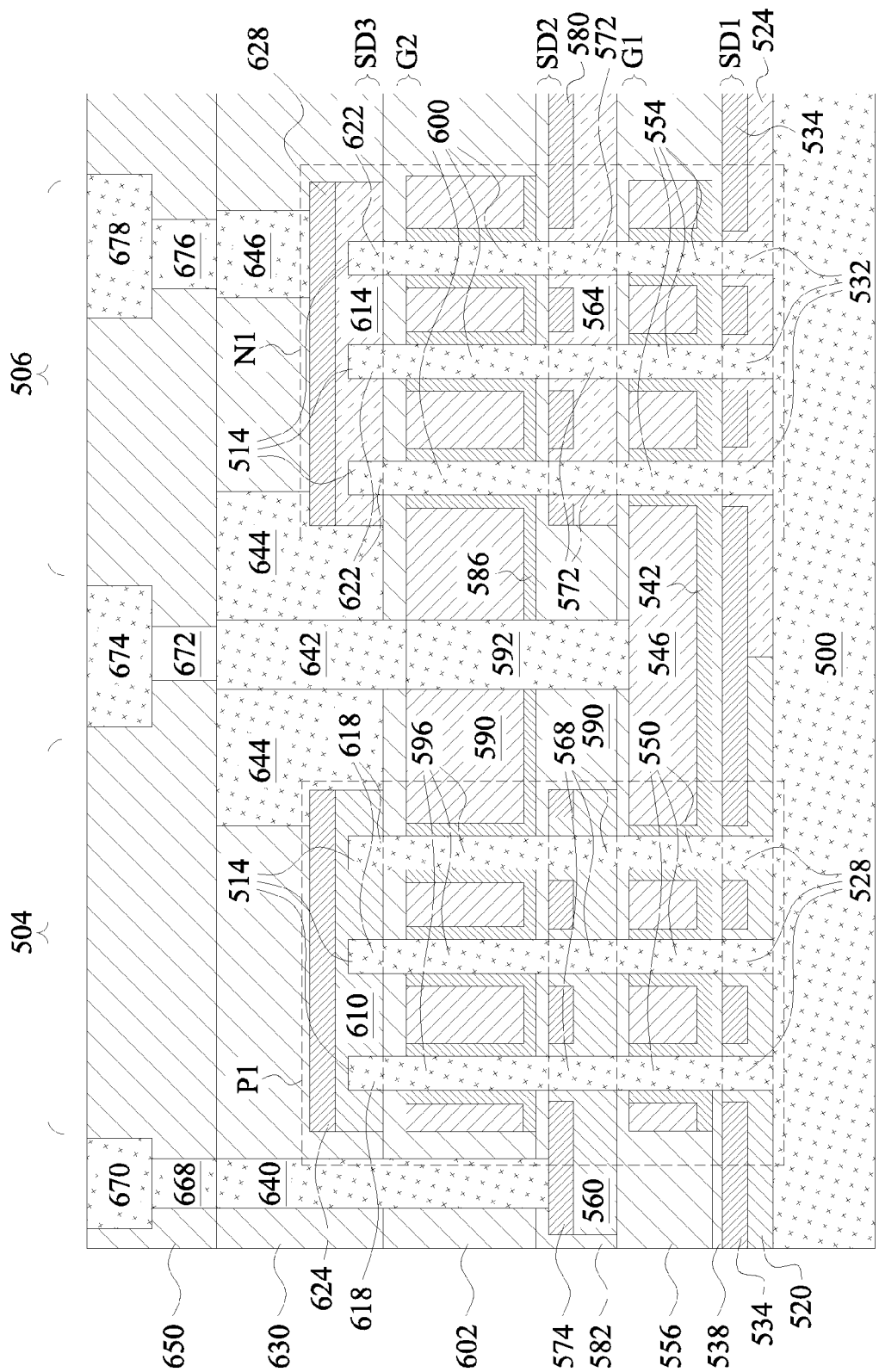
Figure 39A:
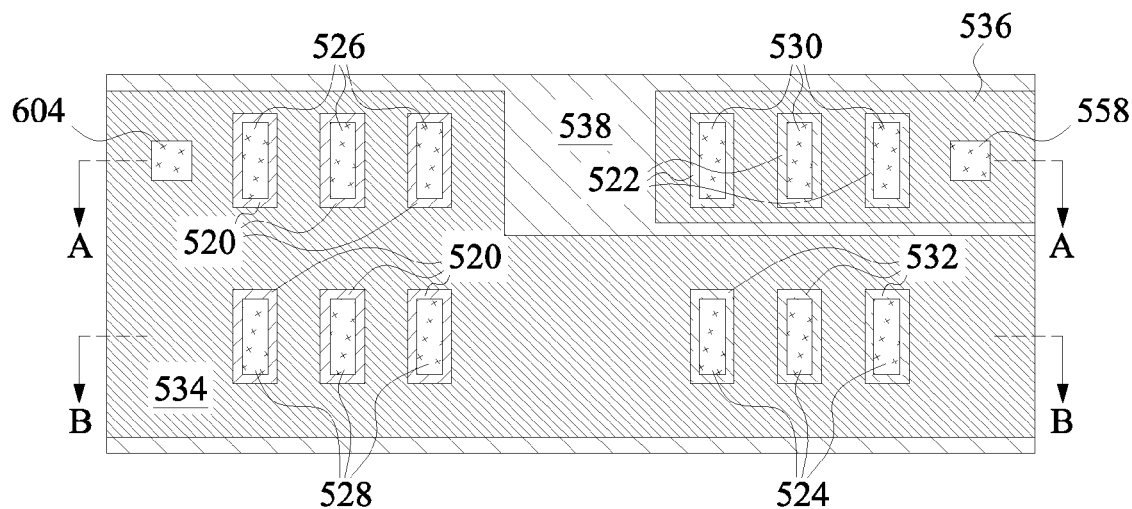
FIGS. 39A through 39E are overlaid layouts of various levels of the structure illustrated in FIGS. 38A and 38B in accordance with some embodiments.
Figure 39B:
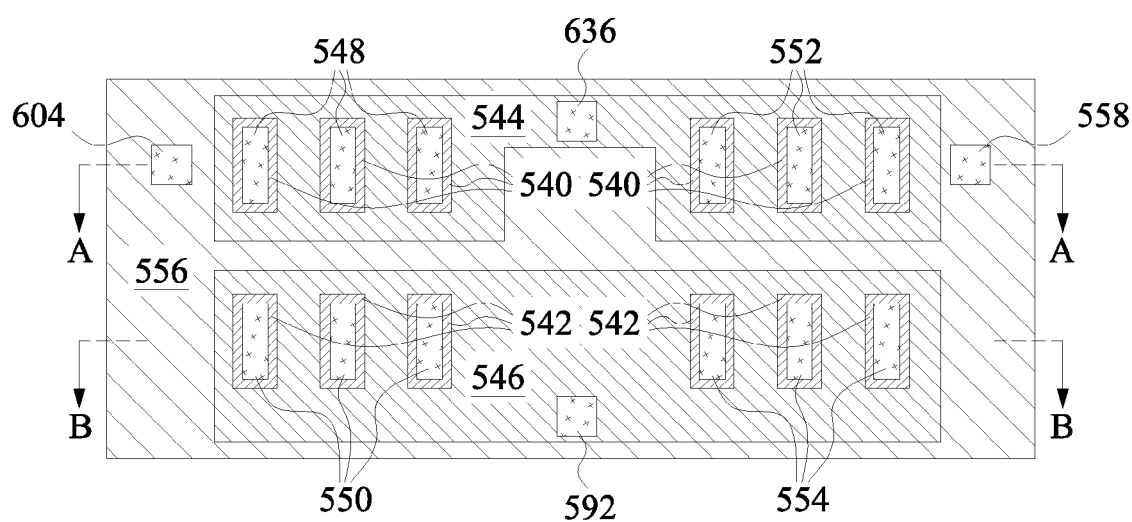
Figure 39C:
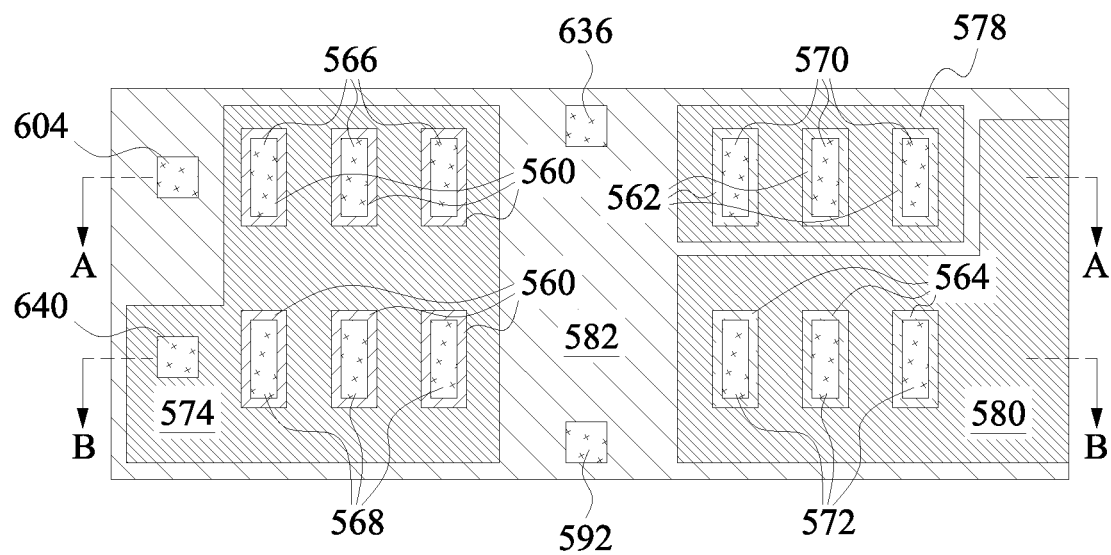
Figure 39D:
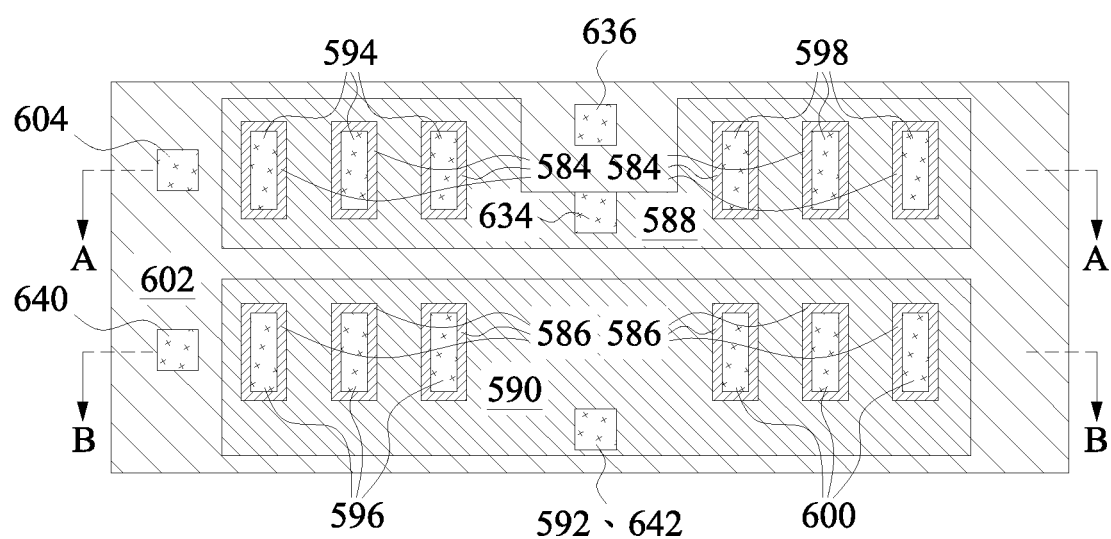
Figure 39E:
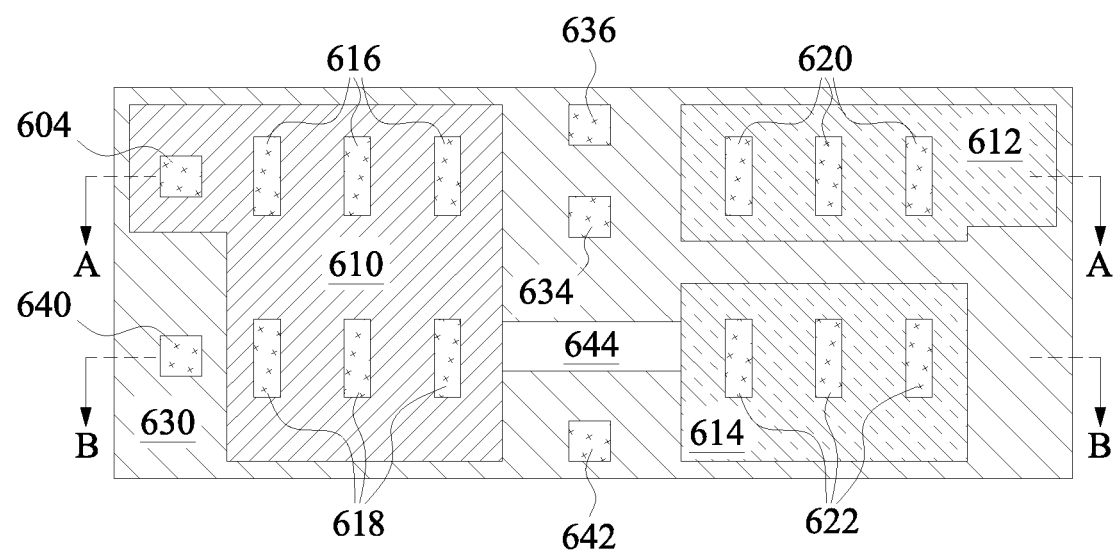
Figure 40:
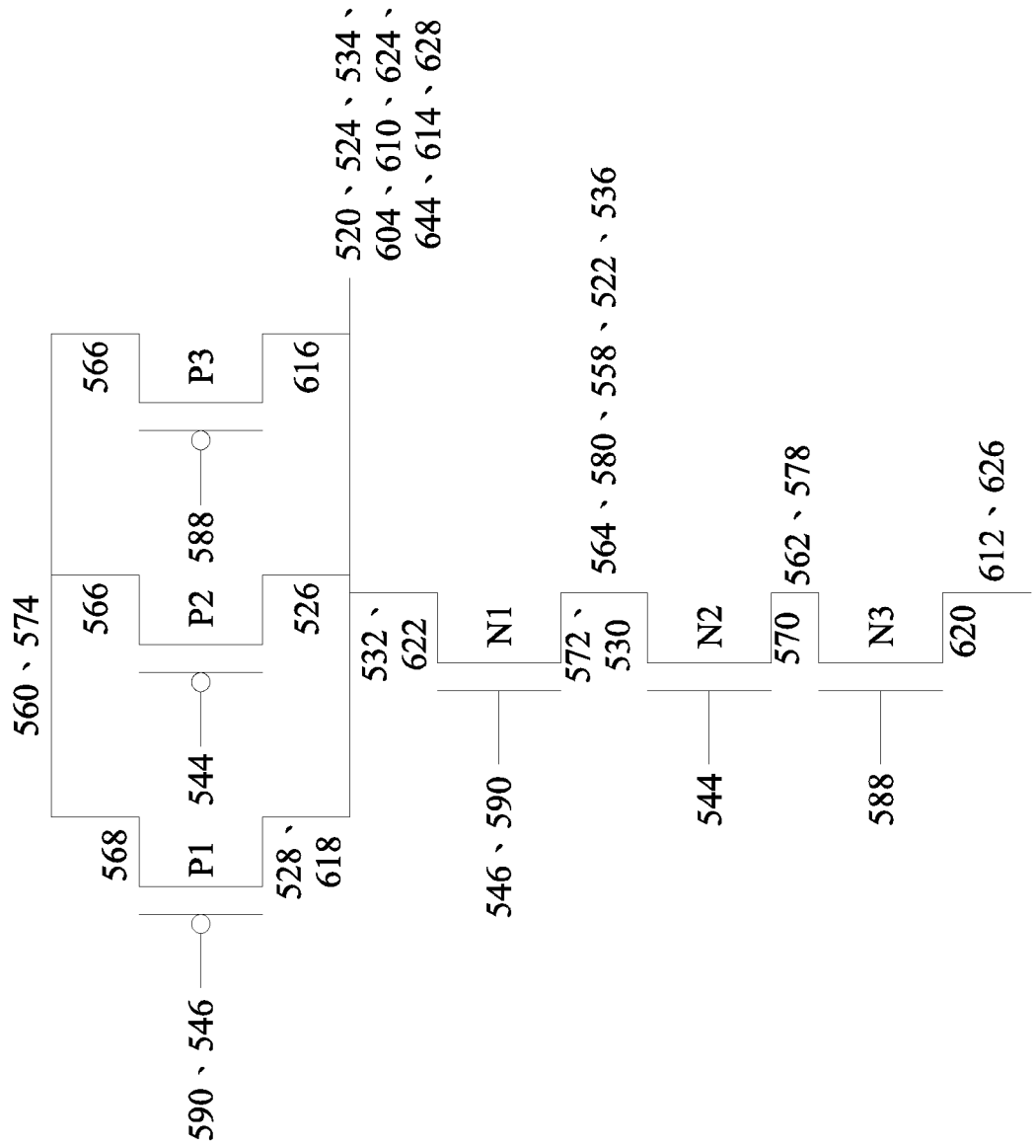
FIG. 40 is a circuit diagram of the circuit formed by the structure of FIGS. 38A and 38B in accordance with some embodiments.

FIGS. 36, 37, 38A, and 38B illustrate cross sectional views of intermediate steps during a process for forming stacked VGAA device structures in accordance with some embodiments. FIGS. 39A through 39E are overlaid layouts of various levels of the structure illustrated in FIGS. 38A and 38B, and FIG. 40 is a circuit diagram of the circuit formed by the structure of FIGS. 38A and 38B. The circuit formed by the structure in FIGS. 38A and 38B is a NAND gate, as discussed in further detail below. Much of the processing in FIGS. 36, 37, 38A, and 38B is the same or similar to processing described in FIGS. 1 through 10, 13 through 27, and/or 30 through 33 such that much of the description will be omitted for brevity. FIGS. 36, 37 and 38A illustrate a first cross-sectional view A-A during processing, and FIG. 38B illustrates a second cross-sectional view B-B in the formed structure. Cross-sectional views A-A and B-B are identified in FIGS. 39A through 39E.

In FIG. 36, an isolation region 502 is formed in a substrate 500. The isolation region 502 separates at least a portion of a first region 504 of the substrate 500 from a second region 506 of the substrate 500. Although not specifically illustrated, the substrate 500 can include an n doped well in the first region 504 and a p doped well in the second region 506. The dopant of the respective doped wells can be the dopants previously discussed, and a concentration of the dopant in the respective doped wells can be in a range from about $1\times10^{12}$ cm$^{-3}$ to about $5\times10^{13}$ cm$^{-3}$.

A mask layer 508, such as a hardmask, is deposited on the substrate 500. The mask layer 508 may be formed of, for example, silicon nitride, silicon carbide, silicon oxynitride, silicon carbon nitride, or the like, and may be formed using CVD, PECVD, ALD, or the like. The mask layer 508 is then patterned to expose the substrate 500, and a recess, or trench, is etched in the substrate 500. The patterning and etching may use an acceptable photolithography and etching process, such as RIE or the like.

The recess in the substrate 500 is then filled with a dielectric material to form the isolation region 502. The isolation region 502 may be referred to as a trench isolation region. The isolation region 502 may be formed of silicon oxide deposited by a high density plasma, for example, although other dielectric materials formed according to various techniques may also be used. A planarization process, such as a CMP, may be performed to remove excess dielectric material and form the top surface of the isolation region 502 to be co-planar with the top surface of the mask layer 508. In other embodiments, the isolation regions can be formed by thermal oxidation to grow a dielectric material, such as silicon oxide.

The mask layer 508 is then patterned with openings corresponding to channel structures that are to be formed, and a mask cap 510 is formed in each opening in the mask layer 508. The mask layer 508 may be patterned using an acceptable photolithography and etching process, such as RIE or the like. The mask caps 510 can be formed by depositing a material with a different etch selectivity than the mask layer 508 in the openings and on the mask layer 508. The material of the mask cap 510 may be, for example, silicon nitride, silicon carbide, silicon oxynitride, silicon carbon nitride, or the like, and may be formed using CVD, PECVD, ALD, or the like. The material of the mask cap 510 may then be planarized, such as by a CMP, to form top surfaces of the mask caps 510 to be co-planar with the top surface of the mask layer 508.

The mask layer 508 is then removed, such as by an appropriate etch selective to the mask layer 508. As shown in FIG. 37, semiconductor posts 512 and 514 (see FIG. 38B) are formed in the n doped well in the substrate 500 in the first region 504, and semiconductor posts 516 and 518 (see FIG. 38B) are formed in the p doped well in the substrate 500 in the second region 506. Using the mask caps 510 as a mask, the substrate 500 is recessed, such as by using an appropriate anisotropic etch such as RIE or the like, to form the semiconductor posts 512, 514, 516, and 518.

A filler dielectric layer (not illustrated) is formed on the substrate 500 and around the semiconductor posts 512, 514, 516, and 518. In some embodiments, the filler dielectric layer is an oxide formed by a flowable CVD (FCVD) (e.g., a CVD-based material deposition in a remote plasma system) and a post curing, such as an anneal. In other embodiments, the filler dielectric layer can be formed by an another deposition technique, such as CVD, PECVD, the like, or a combination thereof, and can be a dielectric material such as silicon oxide, PSG, BSG, BPSG, un-doped silicate glass (USG), a nitride, oxynitride, or the like. After deposition of the filler dielectric layer, a CMP may be performed to planarize the filler dielectric layer to have a top surface co-planar with top surface of the mask caps 510 and isolation region 502. Then, the filler dielectric layer and the isolation region 502 are etched back, such as by using an appropriate etch, such as RIE or the like, removing the filler dielectric layer while the isolation region 502 remains, as illustrated in FIG. 37.

First level first pad semiconductor material 520 is formed on the substrate 500 in the first region 504 and around the semiconductor posts 512 and 514; first level second pad semiconductor material 522 is formed on the substrate 500 in the second region 506 and around the semiconductor posts 516; and first level third pad semiconductor material 524 is formed on the substrate 500 in the second region 506 and around the semiconductor posts 518. First level first pad semiconductor material 520 and first level third pad semiconductor material 524 are physically connected. First level second pad semiconductor material 522 is physically separated from the first level first pad semiconductor material 520 and first level third pad semiconductor material 524. For example, when epitaxial growth is used, pad semiconductor material may substantially not nucleate on the isolation region 502 such that first level second pad semiconductor material 522 is physically separated from first level first pad semiconductor material 520 and first level third pad semiconductor material 524. In other embodiments, the first level second pad semiconductor material 522 may be patterned to be separated from the first level first pad semiconductor material 520 and first level third pad semiconductor material 524.

The first level first pad semiconductor material 520 in the first region 504 can be doped with a p-type dopant, and the dopant concentration of the first level first pad semiconductor material 520 can be in a range from about $1\times10^{20}$ cm$^{-3}$ to about $2\times10^{21}$ cm$^{-3}$. The first level second pad semiconductor material 522 and first level third pad semiconductor material 524 in the second region 506 can be doped with an n-type dopant, and the dopant concentration of the first level second pad semiconductor material 522 and first level third pad semiconductor material 524 can be in a range from about $1\times10^{20}$ cm$^{-3}$ to about $2\times10^{21}$ cm$^{-3}$. First level first source/drain regions 526 are formed in the semiconductor posts 512; first level second source/drain regions 528 are formed in the semiconductor posts 514; first level third source/drain regions 530 are formed in the semiconductor posts 516; and first level fourth source/drain regions 532 are formed in the semiconductor posts 518. The first level first source/drain regions 526 and first level second source/drain regions 528 can be doped with a p-type dopant, and the first level third source/drain regions 530 and first level fourth source/drain regions 532 can be doped with an n-type dopant. The dopant concentration of the first level first, second, third, and fourth source/drain regions 526, 528, 530, and 532 can be in a range from about $5\times10^{19}$ cm$^{-3}$ to about $1\times10^{21}$ cm$^{-3}$.

Then, a first level first metal-semiconductor compound region 534 is formed on and/or in the first level first pad semiconductor material 520 and first level third pad semiconductor material 524, and a first level second metal-semiconductor compound region 536 is formed on and/or in the first level second pad semiconductor material 522. The first level first metal-semiconductor compound region 534 electrically couples the first level first source/drain regions 526, first level second source/drain regions 528, and first level fourth source/drain regions 532 together without a p-n junction being formed in the flow of current therebetween. Since the first level first pad semiconductor material 520 and the first level third pad semiconductor material 524 are physically separated from the first level second pad semiconductor material 522, the first level first metal-semiconductor compound region 534 is physically separated from the first level second metal-semiconductor compound region 536. The first level first metal-semiconductor compound region 534 and first level second metal-semiconductor compound region 536 can be formed to a greater or lesser extent in the respective first level first pad semiconductor material 520, first level second pad semiconductor material 522, and first level third pad semiconductor material 524 and/or substrate 500.

Then, a first dielectric layer 538 is formed over the first level first metal-semiconductor compound region 534 and first level second metal-semiconductor compound region 536 and around the semiconductor posts 512, 514, 516, and 518. A first level first gate dielectric layer 540 and first level first gate electrode layer 544 are formed over the first dielectric layer 538 and around the semiconductor posts 512 and 516, and a first level second gate dielectric layer 542 and first level second gate electrode layer 546 are formed over the first dielectric layer 538 and around the semiconductor posts 514 and 518. The first level first gate dielectric layer 540 and first level second gate dielectric layer 542 can be formed in same processing steps, and the first level first gate electrode layer 544 and first level second gate electrode layer 546 can be formed in same processing steps. The first level first gate electrode layer 544 and the first level first gate dielectric layer 540 define first level first channel regions 548 in the semiconductor posts 512 and define first level third channel regions 552 in the semiconductor posts 516. The first level second gate electrode layer 546 and the first level second gate dielectric layer 542 define first level second channel regions 550 in the semiconductor posts 514 and define first level fourth channel regions 554 in the semiconductor posts 518. A second dielectric layer 556 is formed over the first dielectric layer 538, the first level first gate electrode layer 544, and the first level second gate electrode layer 546 and around the semiconductor posts 512, 514, 516, and 518. A contact 558 is formed through the second dielectric layer 556 and the first dielectric layer 538 to the first level second metal-semiconductor compound region 536. The contact 558 is physically and electrically coupled to the first level second metal-semiconductor compound region 536.

Second level first pad semiconductor material 560 is formed over the second dielectric layer 556 in the first region 504 and around the semiconductor posts 512 and 514. Second level second pad semiconductor material 562 is formed over the second dielectric layer 556 in the second region 506 and around the semiconductor posts 516, and second level third pad semiconductor material 564 is formed over the second dielectric layer 556 in the second region 506, around the semiconductor posts 518, and on the contact 558. The second level first pad semiconductor material 560 in the first region 504 can be doped with a p-type dopant, and the dopant concentration of the second level first pad semiconductor material 560 can be in a range from about $1 \times 10^{20}$ cm$^{-3}$ to about $2 \times 10^{21}$ cm$^{-3}$. The second level second pad semiconductor material 562 and second level third pad semiconductor material 564 in the second region 506 can be doped with an n-type dopant, and the dopant concentration of the second level second pad semiconductor material 562 and second level third pad semiconductor material 564 can be in a range from about $1 \times 10^{20}$ cm$^{-3}$ to about $2 \times 10^{21}$ cm$^{-3}$. The second level first pad semiconductor material 560, second level second pad semiconductor material 562, and second level third pad semiconductor material 564 are physically separated from each other. Second level first source/drain regions 566 are formed in the semiconductor posts 512; second level second source/drain regions 568 are formed in the semiconductor posts 514; second level third source/drain regions 570 are formed in the semiconductor posts 516; and second level fourth source/drain regions 572 are formed in the semiconductor posts 518. The second level first source/drain regions 566 and second level second source/drain regions 568 can be doped with a p-type dopant, and the second level third source/drain regions 570 and second level fourth source/drain regions 572 can be doped with an n-type dopant. The dopant concentration of the second level first, second, third, and fourth source/drain regions 566, 568, 570, and 572 can be in a range from about $5 \times 10^{19}$ cm$^{-3}$ to about $1 \times 10^{21}$ cm$^{-3}$.

Then, second level first metal-semiconductor compound region 574 is formed on and/or in the second level first pad semiconductor material 560; second level second metal-semiconductor compound region 578 is formed on and/or in the second level second pad semiconductor material 562; and second level third metal-semiconductor compound region 580 is formed on and/or in the second level third pad semiconductor material 564. Since the second level first pad semiconductor material 560, second level second pad semiconductor material 562, and second level third pad semiconductor material 564 are physically separated from each other, the second level first metal-semiconductor compound region 574, second level second metal-semiconductor compound region 578, and second level third metal-semiconductor compound region 580 are physically separated from each other. The second level first metal-semiconductor compound region 574, second level second metal-semiconductor compound region 578, and second level third metal-semiconductor compound region 580 can be formed to a greater or lesser extent in the respective second level first pad semiconductor material 560, second level second pad semiconductor material 562, and second level third pad semiconductor material 564.

Next, a third dielectric layer 582 is formed over the second dielectric layer 556, the second level first metal-semiconductor compound region 574, second level second metal-semiconductor compound region 578, and second level third metal-semiconductor compound region 580, and around the semiconductor posts 512, 514, 516, and 518. A second level first gate dielectric layer 584 and second level first gate electrode layer 588 are formed over the third dielectric layer 582 and around the semiconductor posts 512 and 516, and a second level second gate dielectric layer 586 and second level second gate electrode layer 590 are formed over the third dielectric layer 582 and around the semiconductor posts 514 and 518. The second level first gate dielectric layer 584 and second level second gate dielectric layer 586 can be formed in same processing steps, and the second level first gate electrode layer 588 and second level second gate electrode layer 590 can be formed in same processing steps. The second level first gate electrode layer 588 and the second level first gate dielectric layer 584 define second level first channel regions 594 in the semiconductor posts 512 and define second level third channel regions 598 in the semiconductor posts 516. The second level second gate electrode layer 590 and the second level second gate dielectric layer 586 define second level second channel regions 596 in the semiconductor posts 514 and second level fourth channel regions 600 in the semiconductor posts 518. A contact 592 is formed through the second level second gate electrode layer 590, second level second gate dielectric layer 586, third dielectric layer 582, and second dielectric layer 556 to the first level second gate electrode layer 546. The contact 592 is physically and electrically coupled to the second level second gate electrode layer 590 and the first level second gate electrode layer 546. A fourth dielectric layer 602 is formed over the third dielectric layer 582, the second level first gate electrode layer 588, and second level second gate electrode layer 590, and around the semiconductor posts 512, 514, 516, and 518. A contact 604 is formed through the fourth dielectric layer 602, third dielectric layer 582, second dielectric layer 556, and first dielectric layer 538 to the first level first metal-semiconductor compound region 534. The contact 604 is physically and electrically coupled to the first level first metal-semiconductor compound region 534.

Third level first pad semiconductor material 610 is formed over the fourth dielectric layer 602 in the first region 504, around the semiconductor posts 512 and 514, and on the contact 604. Third level second pad semiconductor material 612 is formed over the fourth dielectric layer 602 in the second region 506 and around the semiconductor posts 516, and third level third pad semiconductor material 614 is formed over the fourth dielectric layer 602 in the second region 506 and around the semiconductor posts 518. The third level first pad semiconductor material 610, third level second pad semiconductor material 612, and third level third pad semiconductor material 614 are physically separated from each other. The third level first pad semiconductor material 610 in the first region 504 can be doped with a p-type dopant, and the dopant concentration of the third level first pad semiconductor material 610 can be in a range from about $1\times10^{20}$ cm$^{-3}$ to about $2\times10^{21}$ cm$^{-3}$. The third level second pad semiconductor material 612 and third level third pad semiconductor material 614 in the second region 506 can be doped with an n-type dopant, and the dopant concentration of the third level second pad semiconductor material 612 and third level third pad semiconductor material 614 can be in a range from about $1\times10^{20}$ cm$^{-3}$ to about $2\times10^{21}$ cm$^{-3}$. Third level first source/drain regions 616 are formed in the semiconductor posts 512; third level second source/drain regions 618 are formed in the semiconductor posts 514; third level third source/drain regions 620 are formed in the semiconductor posts 516; and third level fourth source/drain regions 622 are formed in the semiconductor posts 518. The third level first source/drain regions 616 and third level second source/drain regions 618 can be doped with a p-type dopant, and the third level third source/drain regions 620 and third level fourth source/drain regions 622 can be doped with an n-type dopant. The dopant concentration of the third level first, second, third, and fourth source/drain regions 616, 618, 620, and 622 can be in a range from about $5\times10^{19}$ cm$^{-3}$ to about $1\times10^{21}$ cm$^{-3}$.

Then, third level first metal-semiconductor compound region 624 is formed on the third level first pad semiconductor material 610; third level second metal-semiconductor compound region 626 is formed on the third level second pad semiconductor material 612; and third level third metal-semiconductor compound region 628 is formed on the third level third pad semiconductor material 614. Since the third level first pad semiconductor material 610, third level second pad semiconductor material 612, and third level third pad semiconductor material 614 are physically separated from each other, the third level first metal-semiconductor compound region 624, third level second metal-semiconductor compound region 626, and third level third metal-semiconductor compound region 628 are physically separated from each other. The third level first metal-semiconductor compound region 624, third level second metal-semiconductor compound region 626, and third level third metal-semiconductor compound region 628 can be formed to a greater or lesser extent in the respective third level first pad semiconductor material 610, third level second pad semiconductor material 612, and third level third pad semiconductor material 614.

Next, a fifth dielectric layer 630 is formed over the fourth dielectric layer 602, the third level first metal-semiconductor compound region 624, third level second metal-semiconductor compound region 626, and third level third metal-semiconductor compound region 628. Then, contacts 632, 634, 636, 638, 640, 642, 644, and 646 are formed through various dielectric layers to various components. Contact 632 extends through the fifth dielectric layer 630 and is physically and electrically coupled to the third level first metal-semiconductor compound region 624. Contact 634 extends through the fifth dielectric layer 630 and fourth dielectric layer 602 and is physically and electrically coupled to the second level first gate electrode layer 588. Contact 636 extends through the fifth dielectric layer 630, fourth dielectric layer 602, third dielectric layer 582, and second dielectric layer 556 and is physically and electrically coupled to the first level first gate electrode layer 544. Contact 638 extends through the fifth dielectric layer 630 and is physically and electrically coupled to the third level second metal-semiconductor compound region 626. Contact 640 extends through the fifth dielectric layer 630, fourth dielectric layer 602, and third dielectric layer 582 and is physically and electrically coupled to the second level first metal-semiconductor compound region 574. Contact 642 extends through the fifth dielectric layer 630 and fourth dielectric layer 602 and is physically and electrically coupled to the second level second gate electrode layer 590 and/or contact 592. Contact 644 is a butted contact in the fifth dielectric layer 630 and is physically and electrically coupled to the third level first metal-semiconductor compound region 624 and third level third metal-semiconductor compound region 628. Contact 646 extends through the fifth dielectric layer 630 and is physically and electrically coupled to the third level third metal-semiconductor compound region 628.

Although contact 636 appears to be extending through the second level first gate electrode layer 588, the contact 636 is not electrically coupled to the second level first gate electrode layer 588; rather, the contact 636 is overlaid in the view of FIG. 38A to depict other aspects. Although contact 642 appears to be extending through the contact 644, the contact 642 is not electrically coupled to the contact 644; rather, the contact 642 is overlaid in the view of FIG. 38B to depict other aspects. The location of contacts 636 and 644 will become more apparent in FIGS. 39A through 39E.

Further, a sixth dielectric layer 650 is formed over the fifth dielectric layer 630 and with metallizations 654, 658, 662, 666, 670, 674, and 678 with vias 652, 656, 660, 664, 668, 672, and 676, respectively. Via 652 is physically and electrically coupled between contact 632 and metallization 654. Via 656 is physically and electrically coupled between contact 634 and metallization 658. Via 660 is physically and electrically coupled between contact 636 and metallization 662. Via 664 is physically and electrically coupled between contact 638 and metallization 666. Via 668 is physically and electrically coupled between contact 640 and metallization 670. Via 672 is physically and electrically coupled between contact 642 and metallization 674. Via 676 is physically and electrically coupled between contact 646 and metallization 678.

FIGS. 38A and 38B illustrate a stacked device that includes a first p-type device P1, a second p-type device P2, and a third p-type device P3 in the first region 504 and a first n-type device N1, a second n-type device N2, and a third n-type device N3 in the second region 506. The first p-type device P1 is, in this example, a VGAA PFET that includes the first level second source/drain regions 528, the first level second channel regions 550, the second level second source/drain regions 568, the second level second channel regions 596, the third level second source/drain regions 618, the first level second gate dielectric layer 542, the first level second gate electrode layer 546, the second level second gate dielectric layer 586, and the second level second gate electrode layer 590. The second p-type device P2 is, in this example, a VGAA PFET that includes the first level first source/drain regions 526, the first level first channel regions 548, the second level first source/drain regions 566, the first level first gate dielectric layer 540, and the first level first gate electrode layer 544. The third p-type device P3 is, in this example, a VGAA PFET that is over the second p-type device P2 and that includes the second level first source/drain regions 566, the second level first channel regions 594, the third level first source/drain regions 616, the second level first gate dielectric layer 584, and the second level first gate electrode layer 588. In this configuration, since the first p-type device P1 includes the first level second channel regions 550 and the second level second channel regions 596, the first p-type device P1 has an effective channel width twice the respective effective channel widths of the second p-type device P2 and the third p-type device P3.

The first n-type device N1 is, in this example, a VGAA NFET that includes the first level fourth source/drain regions 532, the first level fourth channel regions 554, the second level fourth source/drain regions 572, the second level fourth channel regions 600, the third level fourth source/drain regions 622, the first level second gate dielectric layer 542, the first level second gate electrode layer 546, the second level second gate dielectric layer 586, and the second level second gate electrode layer 590. The first level fourth source/drain regions 532 and third level fourth source/drain regions 622 in the first n-type device N1 are electrically coupled together through third level third metal-semiconductor compound region 6238, contact 644, third level first metal-semiconductor compound region 624, contact 604, and first level first metal-semiconductor compound region 534. The second n-type device N2 is, in this example, a VGAA NFET that includes the first level third source/drain regions 530, the first level third channel regions 552, the second level third source/drain regions 570, the first level first gate dielectric layer 540, and the first level first gate electrode layer 544. The third n-type device N3 is, in this example, a VGAA NFET that is over the second n-type device N3 and that includes the second level third source/drain regions 570, the second level third channel regions 598, the third level third source/drain regions 620, the second level first gate dielectric layer 584, and the second level first gate electrode layer 588. In this configuration, since the first n-type device N1 includes the first level fourth channel regions 554 and the second level fourth channel regions 600, the first n-type device N1 has an effective channel width twice the respective effective channel widths of the second n-type device N2 and the third n-type device N3.

The devices P1, P2, P3, N1, N2, and N3 can have more or fewer semiconductor posts 512, 514, 516, and 518 than what is illustrated in FIGS. 38A and 38B. For example, the devices P1, P2, P3, N1, N2, and N3 each can have one semiconductor post 512, 514, 516, or 518, two semiconductor posts 512, 514, 516, or 518, four semiconductor posts 512, 514, 516, or 518, etc. Further, and as will be illustrated later, the devices can have a different number of semiconductor posts 512, 514, 516, and/or 518 than other devices.

FIGS. 38A and 38B further illustrate a first level source/drain SD1, a first level gate G1, a second level source/drain SD2, a second level gate G2, and a third level source/drain SD3. The first level source/drain SD1 is shown in an overlaid layout view in FIG. 39A. The first level gate G1 is shown in an overlaid layout view in FIG. 39B. The second level source/drain SD2 is shown in an overlaid layout view in FIG. 39C. The second level gate G2 is shown in an overlaid layout view in FIG. 39D. The third level source/drain SD3 is shown in an overlaid layout view in FIG. 39E. FIGS. 39A through 39E illustrate a cross-section A-A that is illustrated in FIG. 38A, and illustrate a cross-section B-B that is illustrated in FIG. 38B.

FIG. 40 illustrates a circuit schematic of the structure shown in FIGS. 38A and 38B, which may be a three-input NAND gate. Components in the circuit schematic of FIG. 40 are labeled with reference characters corresponding to the structure in FIGS. 38A and 38B. Node 560/574 can be a first power supply node, such as a VDD node, and node 612/626 can be a second power supply node, such as a VSS node. Node 520/524/534/604/610/624/644/614/628 is an output node of the NAND gate circuit. Node 590/546 is a first input; node 544 is a second input; and node 588 is a third input. As shown, the first, second, and third p-type devices P1, P2, and P3 are in parallel, and the first, second, and third n-type devices N1, N2, and N3 are in series. The parallel coupled p-type devices P1, P2, and P3 are connected to the serially connected n-type devices N1, N2, and N3 at the output node.

Figure 41:
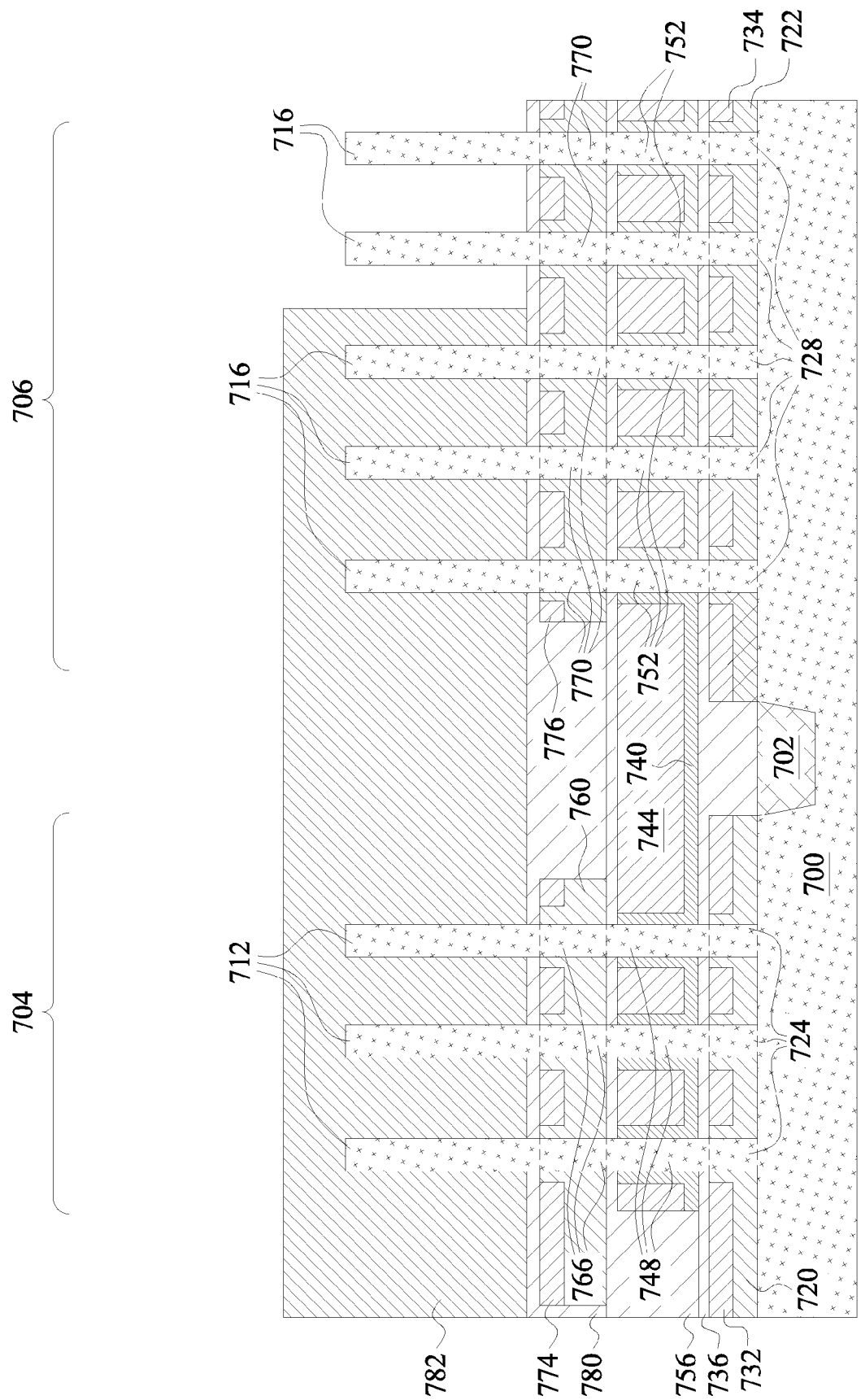
FIGS. 41, 42, 43A, and 43B illustrate cross sectional views of intermediate steps during a process for forming stacked VGAA device structures in accordance with some embodiments.
Figure 42:
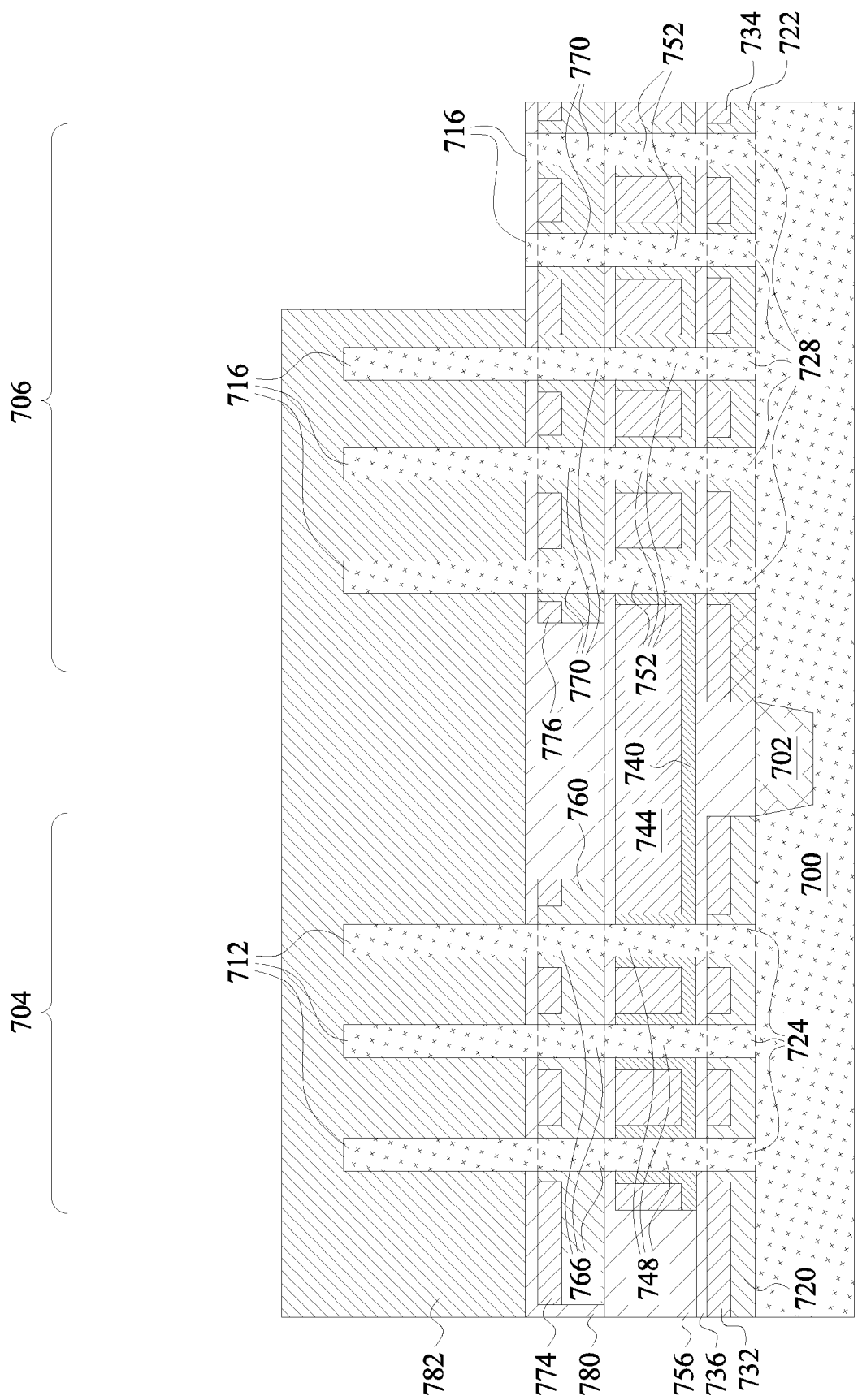
Figure 43A:
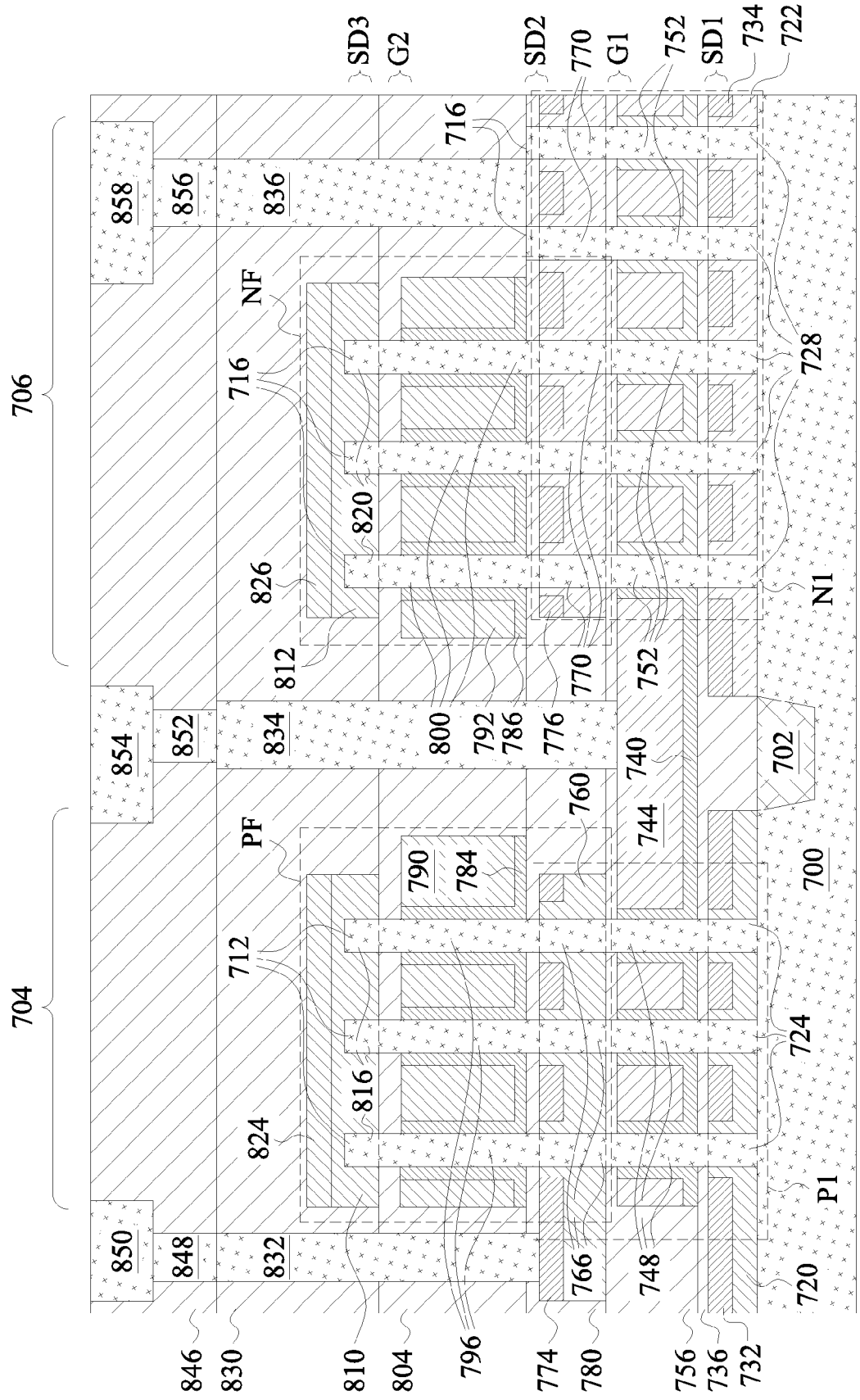
Figure 43B:
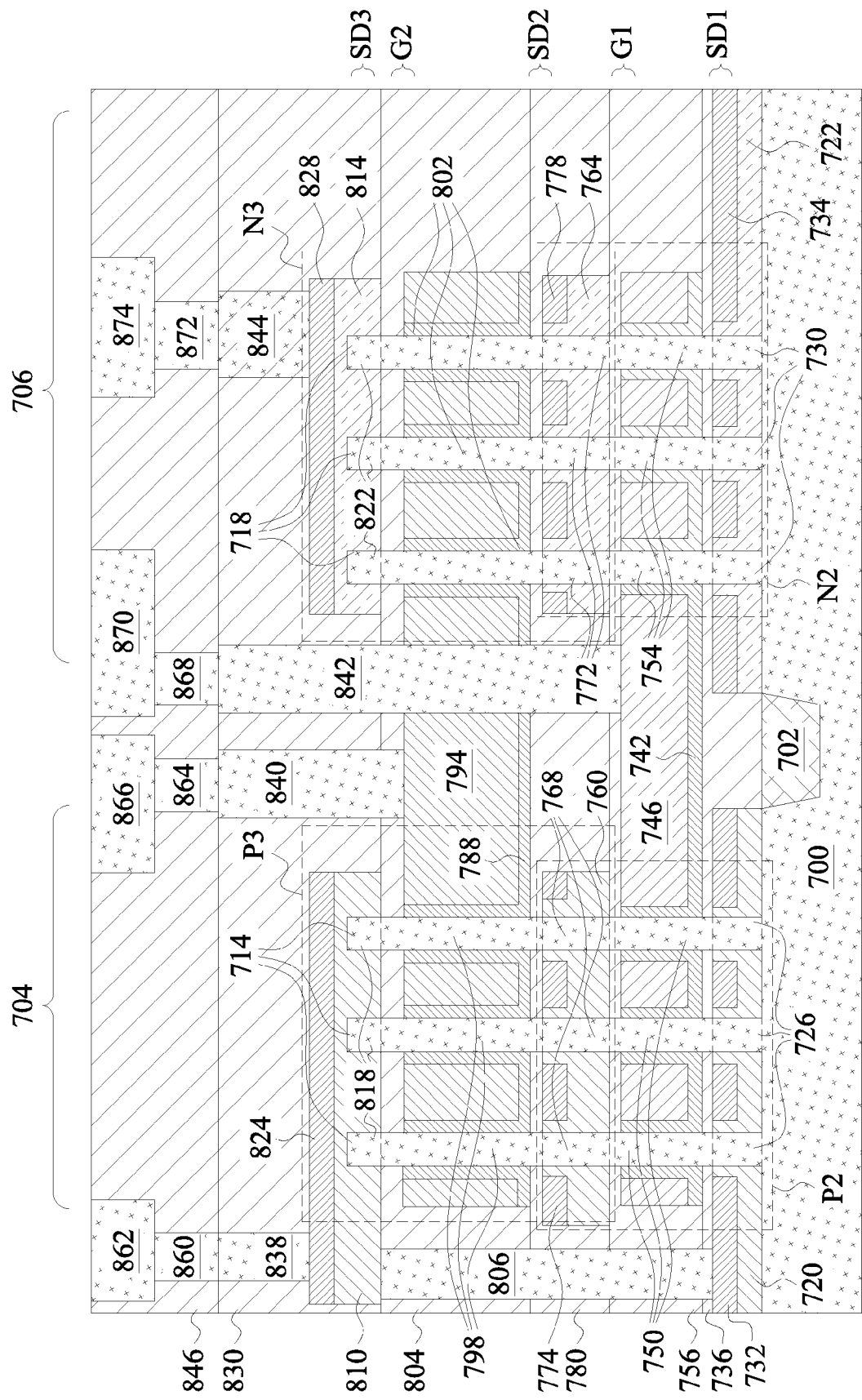
Figure 44E:
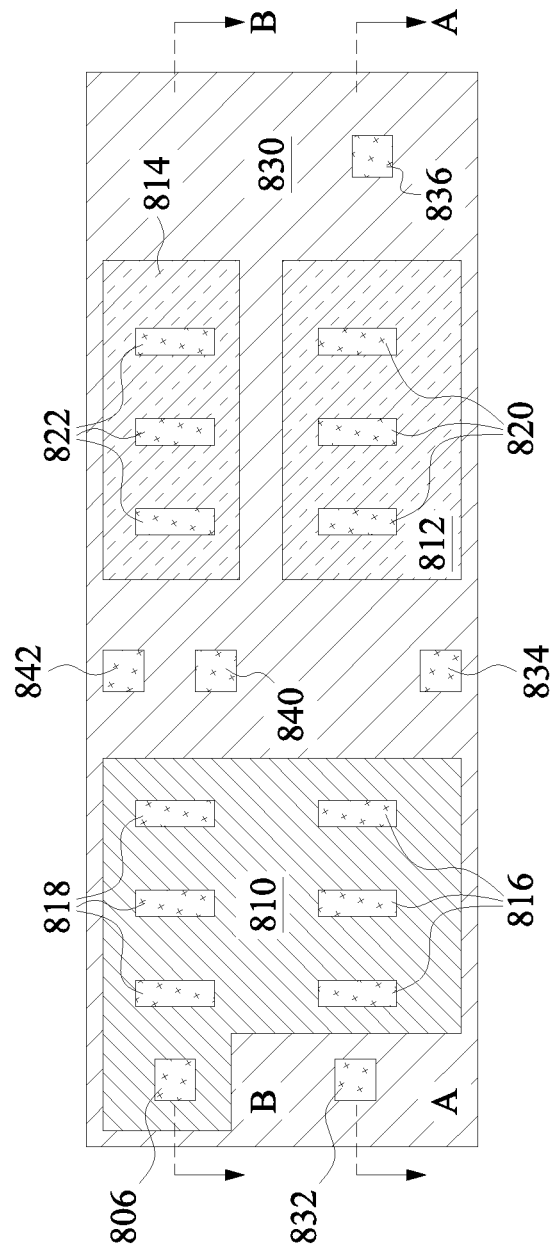
Figure 45:
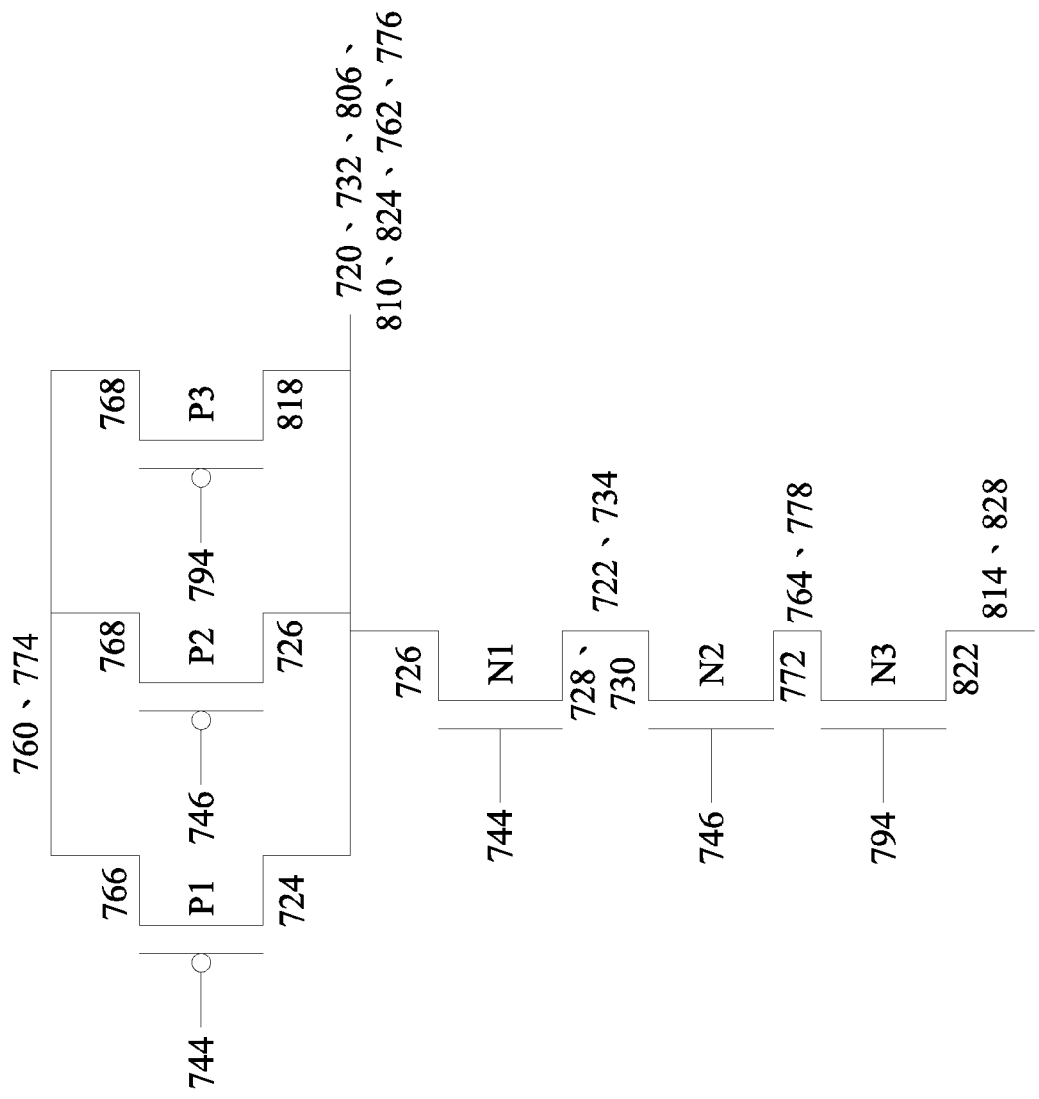
FIG. 45 is a circuit diagram of the circuit formed by the structure of FIGS. 43A and 43B in accordance with some embodiments.

FIGS. 41, 42, 43A, and 43B illustrate cross sectional views of intermediate steps during a process for forming stacked VGAA device structures in accordance with some embodiments. FIGS. 44A through 44E are overlaid layouts of various levels of the structure illustrated in FIGS. 43A and 43B, and FIG. 45 is a circuit diagram of the circuit formed by the structure of FIGS. 43A and 43B. The circuit formed by the structure in FIGS. 43A and 43B is a NAND gate, as discussed in further detail below. Much of the processing in FIGS. 41, 42, 43A, and 43B is the same or similar to processing described in FIGS. 1 through 10, 13 through 27, 30 through 33, and/or 36 through 38B such that much of the description will be omitted for brevity. FIGS. 41, 42, 43A illustrate a first cross-sectional view A-A during processing, and FIG. 43B illustrates a second cross-sectional view B-B in the formed structure. Cross-sectional views A-A and B-B are identified in FIGS. 44A through 44E.

An isolation region 702 is formed in a substrate 700. The isolation region 702 separates at least a portion of a first region 704 of the substrate 700 from a second region 706 of the substrate 700. Although not specifically illustrated, the substrate 700 can include an n doped well in the first region 704 and a p doped well in the second region 706. The dopant of the respective doped wells can be the dopants previously discussed, and a concentration of the dopant in the respective doped wells can be in a range from about $1\times10^{12}$ cm$^{-3}$ to about $5\times10^{13}$ cm$^{-3}$. Semiconductor posts 712 and 714 (see FIG. 43B) are formed in the n doped well in the substrate 700 in the first region 704, and semiconductor posts 716 and 718 (see FIG. 43B) are formed in the p doped well in the substrate 700 in the second region 706.

First level first pad semiconductor material 720 is formed on the substrate 500 in the first region 504 and around the semiconductor posts 712 and 714, and first level second pad semiconductor material 722 is formed on the substrate 700 in the second region 706 and around the semiconductor posts 716 and 718. First level second pad semiconductor material 722 is physically separated from the first level first pad semiconductor material 720. The first level first pad semiconductor material 720 in the first region 704 can be doped with a p-type dopant, and the dopant concentration of the first level first pad semiconductor material 720 can be in a range from about $1\times10^{20}$ cm$^{-3}$ to about $2\times10^{21}$ cm$^{-3}$. The first level second pad semiconductor material 722 in the second region 706 can be doped with an n-type dopant, and the dopant concentration of the first level second pad semiconductor material 722 can be in a range from about $1\times10^{20}$ cm$^{-3}$ to about $2\times10^{21}$ cm$^{-3}$. First level first source/drain regions 724 are formed in the semiconductor posts 712; first level second source/drain regions 726 are formed in the semiconductor posts 714; first level third source/drain regions 728 are formed in the semiconductor posts 716; and first level fourth source/drain regions 730 are formed in the semiconductor posts 718. The first level first source/drain regions 724 and first level second source/drain regions 726 can be doped with a p-type dopant, and the first level third source/drain regions 728 and first level fourth source/drain regions 730 can be doped with an n-type dopant. The dopant concentration of the first level first, second, third, and fourth source/drain regions 724, 726, 728, and 730 can be in a range from about $5\times10^{19}$ cm$^{-3}$ to about $1\times10^{21}$ cm$^{-3}$.

Then, a first level first metal-semiconductor compound region 732 is formed on and/or in the first level first pad semiconductor material 720, and a first level second metal-semiconductor compound region 734 is formed on and/or in the first level second pad semiconductor material 722. The first level first metal-semiconductor compound region 732 electrically couples the first level first source/drain regions 724 and first level second source/drain regions 726 together. The first level second metal-semiconductor compound region 734 electrically couples the first level third source/drain regions 728 and first level fourth source/drain regions 730 together. Since the first level first pad semiconductor material 720 and the first level second pad semiconductor material 722 are physically separated from each other, the first level first metal-semiconductor compound region 732 is physically separated from the first level second metal-semiconductor compound region 734. The first level first metal-semiconductor compound region 732 and first level second metal-semiconductor compound region 734 can be formed to a greater or lesser extent in the respective first level first pad semiconductor material 720 and first level second pad semiconductor material 722 and/or substrate 700.

Then, a first dielectric layer 736 is formed over the first level first metal-semiconductor compound region 732 and first level second metal-semiconductor compound region 734 and around the semiconductor posts 712, 714, 716, and 718. A first level first gate dielectric layer 740 and first level first gate electrode layer 744 are formed over the first dielectric layer 736 and around the semiconductor posts 712 and 716, and a first level second gate dielectric layer 742 and first level second gate electrode layer 746 are formed over the first dielectric layer 736 and around the semiconductor posts 714 and 718. The first level first gate dielectric layer 740 and first level second gate dielectric layer 742 can be formed in same processing steps, and the first level first gate electrode layer 744 and first level second gate electrode layer 746 can be formed in same processing steps. The first level first gate electrode layer 744 and the first level first gate dielectric layer 740 define first level first channel regions 748 in the semiconductor posts 712 and define first level third channel regions 752 in the semiconductor posts 716. The first level second gate electrode layer 746 and the first level second gate dielectric layer 742 define first level second channel regions 750 in the semiconductor posts 714 and define first level fourth channel regions 754 in the semiconductor posts 718. A second dielectric layer 756 is formed over the first dielectric layer 736, the first level first gate electrode layer 744, and the first level second gate electrode layer 746 and around the semiconductor posts 712, 714, 716, and 718.

Second level first pad semiconductor material 760 is formed over the second dielectric layer 756 in the first region 704 and around the semiconductor posts 712 and 714. Second level second pad semiconductor material 762 is formed over the second dielectric layer 756 in the second region 706 and around the semiconductor posts 716, and second level third pad semiconductor material 764 is formed over the second dielectric layer 756 in the second region 706 and around the semiconductor posts 718. The second level first pad semiconductor material 760 in the first region 704 can be doped with a p-type dopant, and the dopant concentration of the second level first pad semiconductor material 760 can be in a range from about $1\times10^{20}$ cm$^{-3}$ to about $2\times10^{21}$ cm$^{-3}$. The second level second pad semiconductor material 762 and second level third pad semiconductor material 764 in the second region 706 can be doped with an n-type dopant, and the dopant concentration of the second level second pad semiconductor material 762 and second level third pad semiconductor material 764 can be in a range from about $1\times10^{20}$ cm$^{-3}$ to about $2\times10^{21}$ cm$^{-3}$. The second level first pad semiconductor material 760, second level second pad semiconductor material 762, and second level third pad semiconductor material 764 are physically separated from each other. Second level first source/drain regions 766 are formed in the semiconductor posts 712; second level second source/drain regions 768 are formed in the semiconductor posts 714; second level third source/drain regions 770 are formed in the semiconductor posts 716; and second level fourth source/drain regions 772 are formed in the semiconductor posts 718. The second level first source/drain regions 766 and second level second source/drain regions 768 can be doped with a p-type dopant, and the second level third source/drain regions 770 and second level fourth source/drain regions 772 can be doped with an n-type dopant. The dopant concentration of the second level first, second, third, and fourth source/drain regions 766, 768, 770, and 772 can be in a range from about $5\times10^{19}$ cm$^{-3}$ to about $1\times10^{21}$ cm$^{-3}$.

Then, second level first metal-semiconductor compound region 774 is formed on and/or in the second level first pad semiconductor material 760; second level second metal-semiconductor compound region 776 is formed on and/or in the second level second pad semiconductor material 762; and second level third metal-semiconductor compound region 778 is formed on and/or in the second level third pad semiconductor material 764. Since the second level first pad semiconductor material 760, second level second pad semiconductor material 762, and second level third pad semiconductor material 764 are physically separated from each other, the second level first metal-semiconductor compound region 774, second level second metal-semiconductor compound region 776, and second level third metal-semiconductor compound region 778 are physically separated from each other. The second level first metal-semiconductor compound region 774, second level second metal-semiconductor compound region 776, and second level third metal-semiconductor compound region 778 can be formed to a greater or lesser extent in the respective second level first pad semiconductor material 760, second level second pad semiconductor material 762, and second level third pad semiconductor material 764.

Next, a third dielectric layer 780 is formed over the second dielectric layer 756, the second level first pad semiconductor material 760, the second level second pad semiconductor material 762, and the second level third pad semiconductor material, and around the semiconductor posts 712, 714, 716, and 718.

As shown in FIG. 41, a mask 782 is then formed over the third dielectric layer 780 in the first region 704 and partially in the second region 706. The mask 782 covers the semiconductor posts 712 and 714 in the first region, covers some of the semiconductor posts 716 while exposing other semiconductor posts 716 in the second region 706, and covers the semiconductor posts 718 in the second region 706. The mask 782 may be a photoresist that is spun on and patterned using photolithography.

Then, in FIG. 42, an etch process removes portions of the exposed semiconductor posts 716 in the second region 706 that protrude above the third dielectric layer 780. The etch process may be any acceptable etch that is selective to the material of the semiconductor posts 716, which may be a wet or dry etch. After the etch process, the mask 782 is removed, such as by an ashing process when the mask 782 is a photoresist.

Then, a second level first gate dielectric layer 784 and second level first gate electrode layer 790 are formed over the third dielectric layer 780 and around the semiconductor posts 712; a second level second gate dielectric layer 786 and second level second gate electrode layer 792 are formed over the third dielectric layer 780 and around the semiconductor posts 716; and a second level third gate dielectric layer 788 and second level third gate electrode layer 794 are formed over the third dielectric layer 780 and around the semiconductor posts 714 and 718. The second level first gate dielectric layer 784, second level second gate dielectric layer 786, and second level third gate dielectric layer 788 can be formed in same processing steps, and the second level first gate electrode layer 790, second level second gate electrode layer 792, and second level third gate electrode layer 794 can be formed in same processing steps. The second level first gate electrode layer 790 and the second level first gate dielectric layer 784 define second level first channel regions 796 in the semiconductor posts 712. The second level second gate electrode layer 792 and the second level second gate dielectric layer 786 define second level third channel regions 800 in the semiconductor posts 716. The second level third gate electrode layer 794 and the second level third gate dielectric layer 788 define second level second channel regions 798 in the semiconductor posts 714 and second level fourth channel regions 802 in the semiconductor posts 718.

A fourth dielectric layer 804 is formed over the third dielectric layer 780, the second level first gate electrode layer 790, second level second gate electrode layer 792, and second level third gate electrode layer 794, and around the semiconductor posts 712, 714, 716, and 718. A contact 806 is formed through the fourth dielectric layer 804, third dielectric layer 780, second dielectric layer 756, and first dielectric layer 736 to the first level first metal-semiconductor compound region 732. The contact 806 is physically and electrically coupled to the first level first metal-semiconductor compound region 732.

Third level first pad semiconductor material 810 is formed over the fourth dielectric layer 804 in the first region 704, around the semiconductor posts 712 and 714, and on the contact 806. Third level second pad semiconductor material 812 is formed over the fourth dielectric layer 804 in the second region 706 and around the semiconductor posts 716, and third level third pad semiconductor material 814 is formed over the fourth dielectric layer 804 in the second region 706 and around the semiconductor posts 718. The third level first pad semiconductor material 810, third level second pad semiconductor material 812, and third level third pad semiconductor material 814 are physically separated from each other. The third level first pad semiconductor material 810 in the first region 704 can be doped with a p-type dopant, and the dopant concentration of the third level first pad semiconductor material 810 can be in a range from about $1\times10^{20}$ cm$^{-3}$ to about $2\times10^{21}$ cm$^{-3}$. The third level second pad semiconductor material 812 and third level third pad semiconductor material 814 in the second region 706 can be doped with an n-type dopant, and the dopant concentration of the third level second pad semiconductor material 812 and third level third pad semiconductor material 814 can be in a range from about $1\times10^{20}$ cm$^{-3}$ to about $2\times10^{21}$ cm$^{-3}$. Third level first source/drain regions 816 are formed in the semiconductor posts 712; third level second source/drain regions 818 are formed in the semiconductor posts 714; third level third source/drain regions 820 are formed in the semiconductor posts 716; and third level fourth source/drain regions 822 are formed in the semiconductor posts 718. The third level first source/drain regions 816 and third level second source/drain regions 818 can be doped with a p-type dopant, and the third level third source/drain regions 820 and third level fourth source/drain regions 822 can be doped with an n-type dopant. The dopant concentration of the third level first, second, third, and fourth source/drain regions 816, 818, 820, and 822 can be in a range from about $5\times10^{19}$ cm$^{-3}$ to about $1\times10^{21}$ cm$^{-3}$.

Then, third level first metal-semiconductor compound region 824 is formed on the third level first pad semiconductor material 810; third level second metal-semiconductor compound region 826 is formed on the third level second pad semiconductor material 812; and third level third metal-semiconductor compound region 828 is formed on the third level third pad semiconductor material 814. Since the third level first pad semiconductor material 810, third level second pad semiconductor material 812, and third level third pad semiconductor material 814 are physically separated from each other, the third level first metal-semiconductor compound region 824, third level second metal-semiconductor compound region 826, and third level third metal-semiconductor compound region 828 are physically separated from each other. The third level first metal-semiconductor compound region 824, third level second metal-semiconductor compound region 826, and third level third metal-semiconductor compound region 828 can be formed to a greater or lesser extent in the respective third level first pad semiconductor material 810, third level second pad semiconductor material 812, and third level third pad semiconductor material 814.

Next, a fifth dielectric layer 830 is formed over the fourth dielectric layer 804, the third level first metal-semiconductor compound region 824, third level second metal-semiconductor compound region 826, and third level third metal-semiconductor compound region 828. Then, contacts 832, 834, 836, 838, 840, 842, and 844 are formed through various dielectric layers to various components. Contact 832 extends through the fifth dielectric layer 830, the fourth dielectric layer 804, and the third dielectric layer 780 and is physically and electrically coupled to the second level first metal-semiconductor compound region 774. Contact 834 extends through the fifth dielectric layer 830, the fourth dielectric layer 804, the third dielectric layer 780, and the second dielectric layer 756 and is physically and electrically coupled to the first level first gate electrode layer 744. Contact 836 extends through the fifth dielectric layer 830, the fourth dielectric layer 804, and the third dielectric layer 780 and is physically and electrically coupled to the second level second metal-semiconductor compound region 776. Contact 838 extends through the fifth dielectric layer 830 and is physically and electrically coupled to the third level first metal-semiconductor compound region 824. Contact 840 extends through the fifth dielectric layer 830 and the fourth dielectric layer 804 and is physically and electrically coupled to the second level third gate electrode layer 794. Contact 842 extends through the fifth dielectric layer 830, the fourth dielectric layer 804, the third dielectric layer 780, and the second dielectric layer 756 and is physically and electrically coupled to the first level second gate electrode layer 746. Contact 844 extends through the fifth dielectric layer 830 and is physically and electrically coupled to the third level third metal-semiconductor compound region 828.

Although contact 842 appears to be extending through the second level third gate electrode layer 794, the contact 842 is not electrically coupled to the second level third gate electrode layer 794; rather, the contact 842 is overlaid in the view of FIG. 43B to depict other aspects. The location of contact 842 will become more apparent in FIGS. 44A through 44E.

Further, a sixth dielectric layer 846 is formed over the fifth dielectric layer 830 and with metallizations 850, 854, 858, 862, 866, 870, and 874 with vias 848, 852, 856, 860, 864, 868, and 872, respectively. Via 848 is physically and electrically coupled between contact 832 and metallization 850. Via 852 is physically and electrically coupled between contact 834 and metallization 854. Via 856 is physically and electrically coupled between contact 836 and metallization 858. Via 860 is physically and electrically coupled between contact 838 and metallization 862. Via 864 is physically and electrically coupled between contact 840 and metallization 866. Via 868 is physically and electrically coupled between contact 842 and metallization 870. Via 872 is physically and electrically coupled between contact 844 and metallization 874.

FIGS. 43A and 43B illustrate a stacked device that includes a first p-type device P1, a second p-type device P2, a third p-type device P3, and a floating p-type device PF in the first region 704 and a first n-type device N1, a second n-type device N2, a third n-type device N3, and a floating n-type device NF in the second region 706. The first p-type device P1 is, in this example, a VGAA PFET that includes the first level first source/drain regions 724, the first level first channel regions 748, the second level first source/drain regions 766, the first level first gate dielectric layer 740, and the first level first gate electrode layer 744. The floating p-type device PF is, in this example, a VGAA PFET that is over the first p-type device P1 and that includes the second level first source/drain regions 766, the second level first channel regions 796, the third level first source/drain regions 816, the second level first gate dielectric layer 784, and the second level first gate electrode layer 790. The second p-type device P2 is, in this example, a VGAA PFET that includes the first level second source/drain regions 726, the first level second channel regions 750, the second level second source/drain regions 768, the first level second gate dielectric layer 742, and the first level second gate electrode layer 746. The third p-type device P3 is, in this example, a VGAA PFET that is over the second p-type device P2 and that includes the second level second source/drain regions 768, the second level second channel regions 798, the third level second source/drain regions 818, the second level third gate dielectric layer 788, and the second level third gate electrode layer 794.

The first n-type device N1 is, in this example, a VGAA NFET that includes the first level third source/drain regions 728, the first level third channel regions 752, the second level third source/drain regions 770, the first level first gate dielectric layer 740, and the first level first gate electrode layer 744. The floating n-type device NF is, in this example, a VGAA NFET that is over the first n-type device N1 and that includes the second level third source/drain regions 770, the second level third channel regions 800, the third level third source/drain regions 820, the second level second gate dielectric layer 786, and the second level second gate electrode layer 792. The second level third source/drain regions 770 in the first n-type device N1 and the first level first source/drain regions 724, first level second source/drain regions 726, and third level second source/drain regions 818 in the p-type devices P1, P2, and P3, respectively, are electrically coupled together, e.g., through metallizations and/or vias. The second n-type device N2 is, in this example, a VGAA NFET that includes the first level fourth source/drain regions 730, the first level fourth channel regions 754, the second level fourth source/drain regions 772, the first level second gate dielectric layer 742, and the first level second gate electrode layer 746. The third n-type device N3 is, in this example, a VGAA NFET that is over the second n-type device N3 and that includes the second level fourth source/drain regions 772, the second level fourth channel regions 802, the third level fourth source/drain regions 822, the second level third gate dielectric layer 788, and the second level third gate electrode layer 794.

The first n-type device N1 has more semiconductor posts (semiconductor posts 716) than the second and third n-type devices N1 and N2 and the first, second, and third p-type devices P1, P2, and P3, and hence, the first n-type device N1 has an effective channel width greater than the other devices. Further, since the floating n-type device NF has fewer semiconductor posts 716 than the first n-type device N1 has semiconductor posts 716, the first n-type device N1 can have a tuned channel width while allowing for increased processing uniformity at upper levels. In some embodiments, the effective channel width of the first n-type device N1 can be two times or greater than respective effective channel widths of the devices N2, N3, NF, P1, P2, P3, PF. The devices P1, P2, P3, PF, N1, N2, N3, and NF can have more or fewer semiconductor posts 712, 714, 716, and 718 than what is illustrated in FIGS. 43A and 43B. For example, the devices P1, P2, P3, PF, N1, N2, N3, and NF can have one semiconductor post 712, 714, 716, and 718, two semiconductor posts 712, 714, 716, and 718, four semiconductor posts 712, 714, 716, and 718, etc.

FIGS. 43A and 43B further illustrate a first level source/drain SD1, a first level gate G1, a second level source/drain SD2, a second level gate G2, and a third level source/drain SD3. The first level source/drain SD1 is shown in an overlaid layout view in FIG. 44A. The first level gate G1 is shown in an overlaid layout view in FIG. 44B. The second level source/drain SD2 is shown in an overlaid layout view in FIG. 44C. The second level gate G2 is shown in an overlaid layout view in FIG. 44D. The third level source/drain SD3 is shown in an overlaid layout view in FIG. 44E. FIGS. 44A through 44E illustrate a cross-section A-A that is illustrated in FIG. 43A, and illustrate a cross-section B-B that is illustrated in FIG. 43B.

FIG. 45 illustrates a circuit schematic of the structure shown in FIGS. 43A and 43B, which may be a three input NAND gate. Components in the circuit schematic of FIG. 45 are labeled with reference characters corresponding to the structure in FIGS. 43A and 43B. Node 760/774 can be a first power supply node, such as a VDD node, and node 814/828 can be a second power supply node, such as a VSS node. Node 720/732/806/810/824/762/776 is an output node of the NAND gate circuit. Node 744 is a first input; node 746 is a second input; and node 794 is a third input. As shown, the first, second, and third p-type devices P1, P2, and P3 are in parallel, and the first, second, and third n-type devices N1, N2, and N3 are in series. The parallel coupled p-type devices P1, P2, and P3 are connected to the serially connected n-type devices N1, N2, and N3 at the output node.

Figure 46:
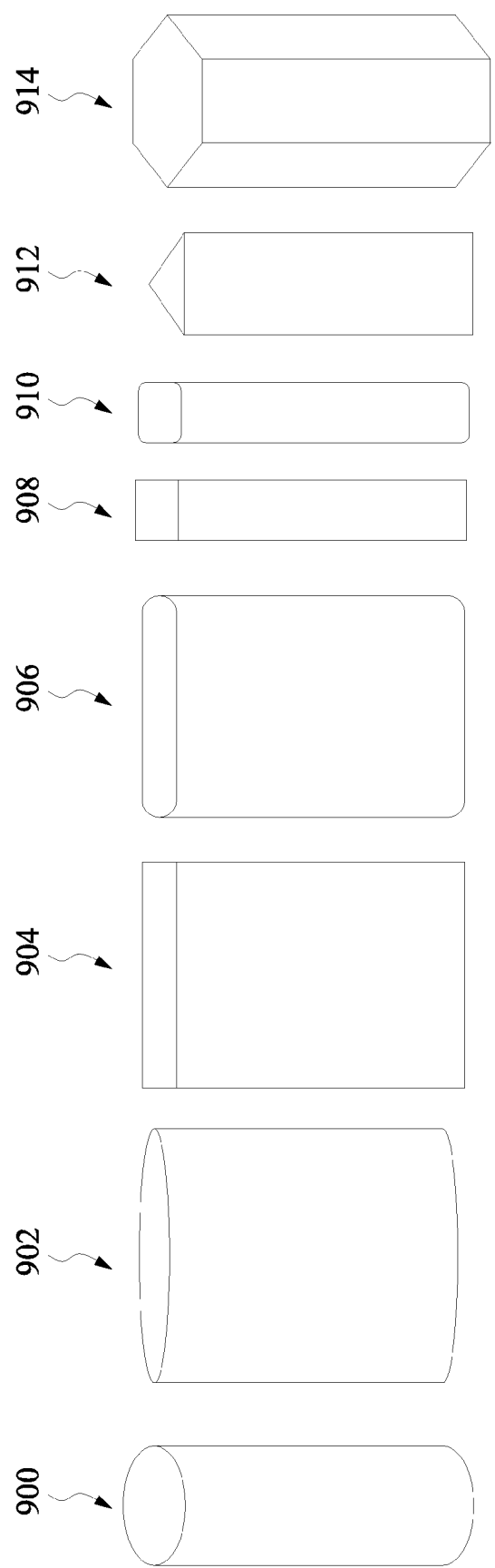
FIG. 46 is, in perspective views, example configurations that one or more semiconductor post may have in accordance with some embodiments.

FIG. 46 illustrates, in perspective views, example configurations that one or more semiconductor post may have in various embodiments. FIG. 46 depicts a circular cross-section semiconductor post 900, an elliptical cross-section semiconductor post 902, a rectangular cross-section semiconductor post 904, a rounded corner rectangular cross-section semiconductor post 906, a square cross-section semiconductor post 908, a rounded corner square cross-section semiconductor post 910, a triangular cross-section semiconductor post 912, and a hexagonal cross-section semiconductor post 914. Other cross-section configurations may be used, and different cross-section configurations may be used between different devices within a structure and/or within a device in a structure.

Some embodiments can achieve advantages. Some embodiments can decrease an area used for a circuit such that density can be increased without pushing limitations of photolithography. Some embodiments, by using various intra-circuit contacts and/or metal-semiconductor compound regions across devices, can also reduce a number of vias that may otherwise be required to connect the circuit. Further, by making some power supply nodes located at, for example, a second level source/drain, delay in a circuit can be reduced.

An embodiment is a structure. The structure comprises a first semiconductor post extending vertically from a substrate. A first source/drain region is in the first semiconductor post. A first gate electrode layer laterally surrounds the first semiconductor post and is vertically above the first source/drain region, and a first gate dielectric layer is interposed between the first gate electrode layer and the first semiconductor post. A second source/drain region is in the first semiconductor post and is vertically above the first gate electrode layer. The second source/drain region is connected to a power supply node. A second gate electrode layer laterally surrounds the first semiconductor post and is vertically above the second source/drain region, and a second gate dielectric layer is interposed between the second gate electrode layer and the first semiconductor post. A third source/drain region is in the first semiconductor post and is vertically above the second gate electrode layer.

Another embodiment is a structure. The structure comprises a first device region on a semiconductor substrate and a second device region on the semiconductor substrate. A first semiconductor post extends vertically from the semiconductor substrate in the first device region, and a second semiconductor post extends vertically from the semiconductor substrate in the second device region. The first device region comprises a first p-type device vertically above the semiconductor substrate and a second p-type device vertically above the first p-type device. The first p-type device comprises a first source/drain region in the first semiconductor post, a first channel region in the first semiconductor post vertically above the first source/drain region, and a second source/drain region in the first semiconductor post vertically above the first channel region. A first is being around the first semiconductor post at the first channel region. The second p-type device comprises the second source/drain region in the first semiconductor post, a second channel region in the first semiconductor post vertically above the second source/drain region, and a third source/drain region in the first semiconductor post vertically above the second channel region. A second gate is around the first semiconductor post at the second channel region. The second device region comprises a first n-type device vertically above the semiconductor substrate and a second n-type device vertically above the first n-type device. The first n-type device comprises a fourth source/drain region in the second semiconductor post, a third channel region in the second semiconductor post vertically above the fourth source/drain region, and a fifth source/drain region in the second semiconductor post vertically above the third channel region. The first gate is around the second semiconductor post at the third channel region. The second n-type device comprises the fifth source/drain region in the second semiconductor post, a fourth channel region in the second semiconductor post vertically above the fifth source/drain region, and a sixth source/drain region in the second semiconductor post vertically above the fourth channel region. A third gate is around the second semiconductor post at the fourth channel region.

A further embodiment is a structure. The structure comprises a first semiconductor post extending vertically from a semiconductor substrate and a second semiconductor post extending vertically from the semiconductor substrate. A first transistor comprises a first source/drain region in the first semiconductor post, a first channel region in the first semiconductor post vertically above the first source/drain region, and a second source/drain region in the first semiconductor post vertically above the first channel region. A second transistor comprises the second source/drain region in the first semiconductor post, a second channel region in the first semiconductor post vertically above the second source/drain region, and a third source/drain region in the first semiconductor post vertically above the second channel region. A third transistor comprises a fourth source/drain region in the second semiconductor post, a third channel region in the second semiconductor post vertically above the fourth source/drain region, and a fifth source/drain region in the second semiconductor post vertically above the third channel region. An effective channel width of the third transistor is greater than an effective channel width of the first transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
 a first semiconductor post extending vertically from a substrate;
 a first source/drain region in the first semiconductor post;
 a first gate electrode layer laterally surrounding the first semiconductor post and vertically above the first source/drain region, a first gate dielectric layer being interposed between the first gate electrode layer and the first semiconductor post;
 a second source/drain region in the first semiconductor post and vertically above the first gate electrode layer, the second source/drain region being connected to a power supply node;
 a second gate electrode layer laterally surrounding the first semiconductor post and vertically above the second source/drain region, a second gate dielectric layer being interposed between the second gate electrode layer and the first semiconductor post; and
 a third source/drain region in the first semiconductor post and vertically above the second gate electrode layer.

2. The structure of claim 1 further comprising:
 a first connection layer laterally around and extending laterally from the first source/drain region in the first semiconductor post;
 a second connection layer laterally around and extending laterally from the third source/drain region in the first semiconductor post; and
 a contact extending from the second connection layer to the first connection layer.

3. The structure of claim 1 further comprising:
 a second semiconductor post extending vertically from the substrate;
 a fourth source/drain region in the second semiconductor post, a conductivity type of the fourth source/drain region being opposite from a conductivity type of the first source/drain region;
 a connection layer laterally around and extending laterally between the first source/drain region in the first semiconductor post and the fourth source/drain region in the second semiconductor post;
 a third gate electrode layer laterally surrounding the second semiconductor post and vertically above the fourth source/drain region, a third gate dielectric layer being interposed between the third gate electrode layer and the second semiconductor post;
 a fifth source/drain region in the second semiconductor post and vertically above the second gate electrode layer;
 a fourth gate electrode layer laterally surrounding the second semiconductor post and vertically above the fifth source/drain region, a fourth gate dielectric layer being interposed between the fourth gate electrode layer and the second semiconductor post; and
 a sixth source/drain region in the second semiconductor post and vertically above the fourth gate electrode layer.

4. The structure of claim 1 further comprising:
 a first connection layer laterally around and extending laterally from the first source/drain region in the first semiconductor post; and
 a contact extending from the second gate electrode layer to the first connection layer.

5. The structure of claim 1 further comprising a contact extending from the first gate electrode layer to the second gate electrode layer.

6. The structure of claim 1 further comprising a contact extending from the second gate electrode layer to the first gate electrode layer.

7. The structure of claim 1 further comprising:
 a second semiconductor post extending vertically from the substrate;
 a fourth source/drain region in the second semiconductor post, the first gate electrode layer laterally surrounding the second semiconductor post and vertically above the fourth source/drain region, the first gate dielectric layer being interposed between the first gate electrode layer and the second semiconductor post;
 a connection layer laterally around and extending laterally between the first source/drain region in the first semiconductor post and the fourth source/drain region in the second semiconductor post; and
 a fifth source/drain region in the second semiconductor post and vertically above the second gate electrode layer, the second semiconductor post not extending substantially above the fifth source/drain region.

8. A structure comprising:
 a first device region on a semiconductor substrate, a first semiconductor post extending vertically from the semiconductor substrate in the first device region, the first device region comprising:
  a first p-type device vertically above the semiconductor substrate, the first p-type device comprising:
   a first source/drain region in the first semiconductor post,
   a first channel region in the first semiconductor post vertically above the first source/drain region, a first gate being around the first semiconductor post at the first channel region, and
   a second source/drain region in the first semiconductor post vertically above the first channel region, and
  a second p-type device vertically above the first p-type device, the second p-type device comprising:
   the second source/drain region in the first semiconductor post,
   a second channel region in the first semiconductor post vertically above the second source/drain region, a second gate being around the first semiconductor post at the second channel region, and
   a third source/drain region in the first semiconductor post vertically above the second channel region; and
 a second device region on the semiconductor substrate, a second semiconductor post extending vertically from the semiconductor substrate in the second device region, the second device region comprising:
  a first n-type device vertically above the semiconductor substrate, the first n-type device comprising:
   a fourth source/drain region in the second semiconductor post,
   a third channel region in the second semiconductor post vertically above the fourth source/drain region, the first gate being around the second semiconductor post at the third channel region, and
   a fifth source/drain region in the second semiconductor post vertically above the third channel region, and a second n-type device vertically above the first n-type device, the second n-type device comprising:
the fifth source/drain region in the second semiconductor post,
a fourth channel region in the second semiconductor post vertically above the fifth source/drain region, a third gate being around the second semiconductor post at the fourth channel region, and
a sixth source/drain region in the second semiconductor post vertically above the fourth channel region.

9. The structure of claim 8 further comprising a first connection layer around the first semiconductor post at the first source/drain region and extending laterally to and around the second semiconductor post at the fourth source/drain region.

10. The structure of claim 9 further comprising:
a second connection layer around the first semiconductor post at the third source/drain region; and
a contact extending from the second connection layer to the first connection layer.

11. The structure of claim 9 further comprising a contact extending from the second gate and the third gate to the first connection layer, the second gate and the third gate being an integral component.

12. The structure of claim 9 further comprising a second connection layer around the first semiconductor post at the third source/drain region and extending laterally to and around the second semiconductor post at the sixth source/drain region.

13. The structure of claim 9 further comprising a contact extending from the second gate and the third gate to the first gate, the second gate and the third gate being an integral component.

14. The structure of claim 8 further comprising:
a third semiconductor post extending vertically from the semiconductor substrate in the second device region, the second device region further comprising:
a third n-type device vertically above the semiconductor substrate, the third n-type device comprising:
a seventh source/drain region in the third semiconductor post,
a fifth channel region in the third semiconductor post vertically above the seventh source/drain region, a fourth gate being around the third semiconductor post at the fifth channel region, and
an eighth source/drain region in the third semiconductor post vertically above the fifth channel region;
a first connection layer around the second semiconductor post at the fourth source/drain region;
a second connection layer around the third semiconductor post at the eighth source/drain region; and
a contact extending from the second connection layer to the first connection layer.

15. The structure of claim 8, wherein a third semiconductor post extends vertically from the semiconductor substrate in the second device region, the first n-type device comprising:
a seventh source/drain region in the third semiconductor post,
a fifth channel region in the third semiconductor post vertically above the seventh source/drain region, the first gate being around the third semiconductor post at the fifth channel region, and
an eighth source/drain region in the third semiconductor post vertically above the fifth channel region, and
wherein the second n-type device does not include the third semiconductor post.

16. The structure of claim 8 further comprising a second connection layer around the first semiconductor post at the second source/drain region, the second connection layer being a VDD node.

17. The structure of claim 8 further comprising a second connection layer around the first semiconductor post at the second source/drain region, the second connection layer being a VSS node.

18. A structure comprising:
a first semiconductor post extending vertically from a semiconductor substrate;
a second semiconductor post extending vertically from the semiconductor substrate;
a first transistor comprising a first source/drain region in the first semiconductor post, a first channel region in the first semiconductor post vertically above the first source/drain region, and a second source/drain region in the first semiconductor post vertically above the first channel region;
a second transistor comprising the second source/drain region in the first semiconductor post, a second channel region in the first semiconductor post vertically above the second source/drain region, and a third source/drain region in the first semiconductor post vertically above the second channel region; and
a third transistor comprising a fourth source/drain region in the second semiconductor post, a third channel region in the second semiconductor post vertically above the fourth source/drain region, and a fifth source/drain region in the second semiconductor post vertically above the third channel region, an effective channel width of the third transistor being greater than an effective channel width of the first transistor.

19. The structure of claim 18, wherein the third transistor further comprises a fourth channel region in the second semiconductor post vertically above the fifth source/drain region, and a sixth source/drain region in the second semiconductor post vertically above the fourth channel region, the fourth source/drain region being electrically coupled to the sixth source/drain region.

20. The structure of claim 18 further comprising a third semiconductor post extending vertically from the semiconductor substrate, the third transistor further comprising a sixth source/drain region in the third semiconductor post, a fourth channel region in the third semiconductor post vertically above the sixth source/drain region, and a seventh source/drain region in the third semiconductor post vertically above the fourth channel region, the fourth source/drain region being electrically coupled to the sixth source/drain region, the fifth source/drain region being electrically coupled to the seventh source/drain region, the third semiconductor post not extending vertically to or above a level of the second channel region.

* * * * *